(12) United States Patent
Smalley et al.

(10) Patent No.: US 7,087,207 B2
(45) Date of Patent: Aug. 8, 2006

(54) METHOD FOR FORMING AN ARRAY OF SINGLE-WALL CARBON NANOTUBES IN AN ELECTRIC FIELD AND COMPOSITIONS THEREOF

(75) Inventors: Richard E. Smalley, Houston, TX (US); Daniel T. Colbert, Houston, TX (US); Hongjie Dai, Sunnyvale, CA (US); Jie Liu, Chapel Hill, NC (US); Andrew G. Rinzler, Newberry, FL (US); Jason H. Hafner, Houston, TX (US); Kenneth A. Smith, Katy, TX (US); Ting Guo, Davis, CA (US); Pavel Nikolaev, Houston, TX (US); Andreas Thess, Kusterdingen (DE)

(73) Assignee: William Marsh Rice University, Houston, TX (US)

( * ) Notice: Subject to any disclaimer, the term of this patent is extended or adjusted under 35 U.S.C. 154(b) by 82 days.

(21) Appl. No.: 10/635,976

(22) Filed: Aug. 7, 2003

(65) Prior Publication Data

US 2005/0260120 A1    Nov. 24, 2005

Related U.S. Application Data

(62) Division of application No. 09/380,545, filed as application No. PCT/US98/04513 on Mar. 6, 1998, now Pat. No. 6,683,783.

(60) Provisional application No. 60/067,325, filed on Dec. 5, 1997, provisional application No. 60/064,531, filed on Nov. 5, 1997, provisional application No. 60/063,675, filed on Oct. 29, 1997, provisional application No. 60/055,037, filed on Aug. 8, 1997, provisional application No. 60/047,854, filed on May 29, 1997, provisional application No. 60/040,152, filed on Mar. 7, 1997.

(51) Int. Cl.
*D01F 9/12* (2006.01)

(52) U.S. Cl. .................... 423/447.6; 423/447.1; 977/DIG. 1

(58) Field of Classification Search ............. 423/447.1, 423/460, 447.6; 977/DIG. 1
See application file for complete search history.

(56) References Cited

U.S. PATENT DOCUMENTS

| | | | |
|---|---|---|---|
| 4,785,189 A | 11/1988 | Wells | 250/492.2 |
| 5,126,574 A | 6/1992 | Gallagher | 250/492.2 |
| 5,171,992 A | 12/1992 | Clabes et al. | 250/306 |
| 5,268,573 A | 12/1993 | Weiss et al. | 250/306 |
| 5,363,697 A | 11/1994 | Nakagawa | 73/105 |
| 5,381,101 A | 1/1995 | Bloom et al. | 325/676 |
| 5,503,010 A | 4/1996 | Yamanaka | 73/105 |
| 5,560,898 A | 10/1996 | Uchida et al. | 423/461 |
| 5,641,466 A | 6/1997 | Ebbesen et al. | 423/447.2 |
| 5,697,827 A * | 12/1997 | Rabinowitz | 445/60 |
| 5,698,175 A | 12/1997 | Hiura et al. | 423/447.1 |
| 5,730,940 A | 3/1998 | Nakagawa | 422/68.1 |
| 5,824,470 A | 10/1998 | Baldeschwieler et al. | 435/6 |
| 5,935,339 A | 8/1999 | Henderson et al. | 134/1 |

FOREIGN PATENT DOCUMENTS

EP    1 176 234 A2    12/1993
WO    WO 96/18059    6/1996

OTHER PUBLICATIONS

Collins et al., 'Unique Characteristics of Cold Cathode Carbon-Nanotube-Matrix Field Emitters' in Phys. Rev. B. vol. 55 #15 pp. 9391-9399, Apr. 15, 1997.*
Kiang, Ching-Hwa et al. "Carbon Nanotubes With Single-Layer Walls," *Carbon*, 1995, vol. 33, No. 7, pp. 903-914.
Kiang, Ching-Hwa et al. "Structural Modification of Single-Layer Carbon Nanotubes with an Electron Beam," *J. Phys. Chem.*, 1996, vol. 100, pp. 3749-3752.
Stephan et al. "Doping Graphitic and Carbon Nanotube Structures with Boron and Nitrogen," *Science*, vol. 266, pp. 1683-1685, Dec. 1994.
Li, et al., "Large-Scale Synthesis of Aligned Carbon Nanotubes," *Science*, vol. 274, Dec. 6, 1996, pp. 1701-1703.

(Continued)

*Primary Examiner*—Stuart Hendrickson
(74) *Attorney, Agent, or Firm*—Ross Spencer Garsson; Edward T. Mickelson; Winstead Sechrest & Minick P.C.

(57) ABSTRACT

This invention relates generally to a forming an array of single-wall carbon nanotubes (SWNT) in an electric field and compositions thereof. In one embodiment, a purified bucky paper of single-wall carbon nanotubes is used as the starting material. Upon oxidative treatment of the bucky paper surface, many tube and/or rope ends protrude up from the surface of the paper. Disposing the resulting bucky paper in an electric field results in the protruding tubes and or ropes of single-wall carbon nanotubes aligning in a direction substantially perpendicular to the paper surface. These tubes tend to coalesce to form a molecular array. In another embodiment, a molecular array of SWNTs can be made by "combing" the purified bucky paper starting material with a sharp microscopic tip to align the nanotubes.

7 Claims, 21 Drawing Sheets

OTHER PUBLICATIONS

Liu, et al., "Fullerene Pipes," *Science*, vol. 280, May 22, 1998, pp. 1253-1256.

Thess, et al., "Crystalline Ropes of Metallic Carbon Nanotubes," *Science*, vol. 273, Jul. 26, 1996, pp. 483-487.

Tohji, et al., "Purifying single-walled nanotubes," *Nature*, vol. 383, Oct. 24, 1996, pp. 679.

Tohji, et al., "Purification Procedure for Single-Walled Nanotubes," *J. Phys. Chem. B.*, vol. 101, No. 11, 1997, pp. 1974-1978.

Ajayan, et al., "Nanometre-size tubes of carbon," *Rep. Prog. Phys.*, vol. 60, 1997, pp. 1025-1062.

Fishbine, "Carbon Nanotube Alignment and Manipulation Using Electrostatic Fields," *Fullerene Science & Technology*, vol. 4(1), 1996, pp. 87-100.

Ajayan, et al., "Aligned Carbon Nanotube Arrays Formed by Cutting a Polymer Resin-Nanotube Composite," *Science*, vol. 265, Aug. 26, 1994, pp. 1212-1214.

Wang, et al., "Properties of Buckytubes and Derivatives," *Carbon*, vol. 33, No. 7, 1995, pp. 949-958.

Sen, et al., "Structures and Images of Novel Derivatives of Carbon Nanotubes, Fullerenes and Related New Carbon Forms," *Fullerene Science and Technology*, vol. 5(3), 1997, pp. 489-502.

Dravid, et al., "Buckytubes and Derivatives: Their Growth and Implications for Buckyball Formation," *Science*, vol. 259, Mar. 12, 1993, pp. 1601-1604.

Smalley, "From dopyballs to nanowires," *Materials Science and Engineering*, vol. B19, 1993, pp. 1-7.

Chen, "Growth and Properties of Carbon Nanotubes," *Thesis for the degree Master of Science, Rice University*, Houston, Texas, May 1995.

Rinzler, et al., "Field Emission and Growth of Fullerene Nanotubes," *Presented at the Fall*, 1994 MRS Meeting, Nov. 28, 1994, Boston, submitted for MRS proceedings, vol. 359.

Gamaly, et al., "Mechanism of carbon nanotube formation in the arc discharge," *Physical Review B*, vol. 52, No. 3, Jul. 15, 1995-I, pp. 2083-2089.

Ge, et al. "Scanning tunneling microscopy of single-shell nanotubes of carbon," *Appl. Phys. Lett.*, vol. 65(18), Oct. 31, 1994, pp. 2284-2286.

Ajayan et al. "Opening carbon nanotubes with oxygen and implications for filing," *Nature*, vol. 362, Apr. 8, 1993, pp. 522-525.

Chico et al. "Pure Carbon Nanoscale Devices: Nanotube Heterojunctions," *The American Physical Society*, vol. 76, No. 6, Feb. 5, 1996, pp. 971-973.

Dresselhaus et al., "Science of Fullerenes and Carbon Nanotubes," *Academic Press*, Chapter 19, pp. 856-860.

* cited by examiner

METHOD FOR FORMING AN ARRAY OF SINGLE-WALL CARBON NANOTUBES IN AN ELECTRIC FIELD AND COMPOSITIONS THEREOF

PRIORITY BENEFIT AND CROSS REFERENCE TO RELATED APPLICATIONS

This application is a division of prior U.S. patent application Ser. No. 09/380,545, filed on Dec. 22, 1999, now U.S. Pat. No. 6,683,783 entitled "CARBON FIBERS FORMED FROM SINGLE-WALL CARBON NANOTUBES," which is the 35 U.S.C. § 371 national application of International Application Number PCT/US98/04513 filed on Mar. 6, 1998, which designated the United States, claiming priority to: provisional U.S. patent application Ser. No. 60/067,325, filed on Dec. 5, 1997; provisional U.S. patent application Ser. No. 60/064,531, filed on Nov. 5, 1997; provisional U.S. patent application Ser. No. 60/063,675, filed on Oct. 29, 1997; provisional U.S. patent application Ser. No. 60/055,037, filed on Aug. 8, 1997; provisional U.S. patent application Ser. No. 60/047,854, filed on May 29, 1997; and provisional U.S. patent application Ser. No. 60/040,152, filed on Mar. 7, 1997. Each of the foregoing applications is commonly assigned to the assignee of the present invention and is hereby incorporated herein by reference in its entirety.

This application discloses subject matter related to the subject matter of U.S. patent application Ser. No. 10/000,746, filed on Nov. 30, 2001 in the name of Daniel T. Colbert et al., entitled "MACROSCOPICALLY MANIPULABLE NANOSCALE DEVICES MADE FROM NANOTUBE ASSEMBLIES" ("the '746 patent application"), which application is commonly assigned to the assignee of the present invention.

BACKGROUND OF THE INVENTION

Fullerenes are closed-cage molecules composed entirely of $sp^2$-hybridized carbons, arranged in hexagons and pentagons. Fullerenes (e.g., $C_{60}$) were first identified as closed spheroidal cages produced by condensation from vaporized carbon.

Fullerene tubes are produced in carbon deposits on the cathode in carbon arc methods of producing spheroidal fullerenes from vaporized carbon. Ebbesen et al. (Ebbesen I), "Large-Scale Synthesis Of Carbon Nanotubes," *Nature*, Vol. 358, p. 220 (Jul. 16, 1992) and Ebbesen et al., (Ebbesen II), "Carbon Nanotubes," *Annual Review of Materials Science*, Vol. 24, p. 235 (1994). Such tubes are referred to herein as carbon nanotubes. Many of the carbon nanotubes made by these processes were multi-wall nanotubes, i.e., the carbon nanotubes resembled concentric cylinders. Carbon nanotubes having up to seven walls have been described in the prior art. Ebbesen II; Iijima et al., "Helical Microtubules Of Graphitic Carbon," *Nature*, Vol. 354, p. 56 (Nov. 7, 1991).

Single-wall carbon nanotubes have been made in a DC arc discharge apparatus of the type used in fullerene production by simultaneously evaporating carbon and a small percentage of Group VIII transition metal from the anode of the arc discharge apparatus. See Iijima et al., "Single-Shell Carbon Nanotubes of 1 nm Diameter," *Nature*, Vol. 363, p. 603 (1993); Bethune et al., "Cobalt Catalyzed Growth of Carbon Nanotubes with Single Atomic Layer Walls," *Nature*, Vol. 63, p. 605 (1993); Ajayan et al., "Growth Morphologies During Cobalt Catalyzed Single-Shell Carbon Nanotube Synthesis," *Chem. Phys. Lett.*, Vol. 215, p. 509 (1993); Zhou et al., "Single-Walled Carbon Nanotubes Growing Radially From $YC_2$ Particles," *Appl. Phys. Lett.*, Vol. 65, p. 1593 (1994); Seraphin et al., "Single-Walled Tubes and Encapsulation of Nanocrystals Into Carbon Clusters," *Electrochem. Soc.*, Vol. 142, p. 290 (1995); Saito et al., "Carbon Nanocapsules Encaging Metals and Carbides," *J. Phys. Chem. Solids*, Vol. 54, p. 1849 (1993); Saito et al., "Extrusion of Single-Wall Carbon Nanotubes Via Formation of Small Particles Condensed Near an Evaporation Source," *Chem. Phys. Lett.*, Vol. 236, p. 419 (1995). It is also known that the use of mixtures of such transition metals can significantly enhance the yield of single-wall carbon nanotubes in the arc discharge apparatus. See Lambert et al., "Improving Conditions Toward Isolating Single-Shell Carbon Nanotubes," *Chem. Phys. Lett.*, Vol. 226, p. 364 (1994).

While this arc discharge process can produce single-wall nanotubes, the yield of nanotubes is low and the tubes exhibit significant variations in structure and size between individual tubes in the mixture. Individual carbon nanotubes are difficult to separate from the other reaction products and purify.

An improved method of producing single-wall nanotubes is described in U.S. Ser. No. 08/687,665, entitled "Ropes of Single-Walled Carbon Nanotubes" incorporated herein by reference in its entirety. This method uses, inter alia, laser vaporization of a graphite substrate doped with transition metal atoms, preferably nickel, cobalt, or a mixture thereof, to produce single-wall carbon nanotubes in yields of at least 50% of the condensed carbon. The single-wall nanotubes produced by this method tend to be formed in clusters, termed "ropes," of 10 to 1000 single-wall carbon nanotubes in parallel alignment, held together by van der Waals forces in a closely packed triangular lattice. Nanotubes produced by this method vary in structure, although one structure tends to predominate.

Although the laser vaporization process produces improved single-wall nanotube preparations, the product is still heterogeneous, and the nanotubes are too tangled for many potential uses of these materials. In addition, the vaporization of carbon is a high energy process and is inherently costly. Therefore, there remains a need for improved methods of producing single-wall nanotubes of greater purity and homogeneity. Furthermore, many practical materials could make use of the properties of single-wall carbon nanotubes if only they were available as macroscopic components. However, such components have not been produced up to now.

SUMMARY OF THE INVENTION

Accordingly, it is an object of this invention to provide a high yield, single step method for producing large quantities of continuous macroscopic carbon fiber from single-wall carbon nanotubes using inexpensive carbon feedstocks at moderate temperatures.

It is another object of this invention to provide macroscopic carbon fiber made by such a method.

It is also an object of this invention to provide a molecular array of purified single-wall carbon nanotubes for use as a template in continuous growing of macroscopic carbon fiber.

It is another object of the present invention to provide a method for purifying single-wall carbon nanotubes from the amorphous carbon and other reaction products formed in methods for producing single-wall carbon nanotubes (e.g., by carbon vaporization).

It is also an object of the present invention to provide a new class of tubular carbon molecules, optionally derivatized with one or more functional groups, which are substantially free of amorphous carbon.

It is also an object of this invention to provide a number of devices employing the carbon fibers, nanotube molecular arrays and tubular carbon molecules of this invention.

It is an object of this invention to provide composite material containing carbon nanotubes.

It is another object of this invention to provide a composite material that is resistant to delamination.

A method for purifying a mixture comprising single-wall carbon nanotubes and amorphous carbon contaminate is disclosed. The method includes the steps of heating the mixture under oxidizing conditions sufficient to remove the amorphous carbon, followed by recovering a product comprising at least about 80% by weight of single-wall carbon nanotubes.

In another embodiment, a method for producing tubular carbon molecules of about 5 to 500 nm in length is also disclosed. The method includes the steps of cutting single-wall nanotube containing-material to form a mixture of tubular carbon molecules having lengths in the range of 5–500 nm and isolating a fraction of the molecules having substantially equal lengths. The nanotubes disclosed may be used, singularly or in multiples, in power transmission cables, in solar cells, in batteries, as antennas, as molecular electronics, as probes and manipulators, and in composites.

In another embodiment, a method for forming a macroscopic molecular array of tubular carbon molecules is disclosed. This method includes the steps of providing at least about $10^6$ tubular carbon molecules of substantially similar length in the range of 50 to 500 nm; introducing a linking moiety onto at least one end of the tubular carbon molecules; providing a substrate coated with a material to which the linking moiety will attach; and contacting the tubular carbon molecules containing a linking moiety with the substrate.

In another embodiment, another method for forming a macroscopic molecular array of tubular carbon molecules is disclosed. First, a nanoscale array of microwells is provided on a substrate. Next, a metal catalyst is deposited in each microwells. Next, a stream of hydrocarbon or CO feedstock gas is directed at the substrate under conditions that effect growth of single-wall carbon nanotubes from each microwell.

In another embodiment, still another method for forming a macroscopic molecular array of tubular carbon molecules is disclosed. It includes the steps of providing surface containing purified but entangled and relatively endless single-wall carbon nanotube material; subjecting the surface to oxidizing conditions sufficient to cause short lengths of broken nanotubes to protrude up from the surface; and applying an electric field to the surface to cause the nanotubes protruding from the surface to align in an orientation generally perpendicular to the surface and coalesce into an array by van der Waals interaction forces.

In another embodiment, a method for continuously growing a macroscopic carbon fiber comprising at least about $10^6$ single-wall nanotubes in generally parallel orientation is disclosed. In this method, a macroscopic molecular array of at least about $10^6$ tubular carbon molecules in generally parallel orientation and having substantially similar lengths in the range of from about 50 to about 500 nanometers is provided. The hemispheric fullerene cap is removed from the upper ends of the tubular carbon molecules in the array The upper ends of the tubular carbon molecules in the array are then contacted with a catalytic metal. A gaseous source of carbon is supplied to the end of the array while localized energy is applied to the end of the array in order to heat the end to a temperature in the range of about 500° C. to about 1300° C. The growing carbon fiber is continuously recovered.

In another embodiment, a macroscopic molecular array comprising at least about $10^6$ single-wall carbon nanotubes in generally parallel orientation and having substantially similar lengths in the range of from about 5 to about 500 nanometers is disclosed.

In another embodiment, a composition of matter comprising at least about 80% by weight of single-wall carbon nanotubes is disclosed.

In still another embodiment, macroscopic carbon fiber comprising at least about $10^6$ single-wall carbon nanotubes in generally parallel orientation is disclosed.

In another embodiment, an apparatus for forming a continuous macroscopic carbon fiber from a macroscopic molecular template array comprising at least about $10^6$ single-wall carbon nanotubes having a catalytic metal deposited on the open ends of said nanotubes is disclosed. This apparatus includes a means for locally heating only the open ends of the nanotubes in the template array in a growth and annealing zone to a temperature in the range of about 500° C. to about 1300° C. It also includes a means for supplying a carbon-containing feedstock gas to the growth and annealing zone immediately adjacent the heated open ends of the nanotubes in the template array. It also includes a means for continuously removing growing carbon fiber from the growth and annealing zone while maintaining the growing open end of the fiber in the growth and annealing zone.

In another embodiment, a composite material containing nanotubes is disclosed. This composite material includes a matrix and a carbon nanotube material embedded within said matrix.

In another embodiment, a method of producing a composite material containing carbon nanotube material is disclosed. It includes the steps of preparing an assembly of a fibrous material; adding the carbon nanotube material to the fibrous material; and adding a matrix material precursor to the carbon nanotube material and the fibrous material.

In another embodiment, a three-dimensional structure of derivatized single-wall nanotube molecules that spontaneously form is disclosed. It includes several component molecule having multiple derivatives brought together to assemble into the three-dimensional structure.

The foregoing objectives, and others apparent to those skilled in the art, are achieved according to the present invention as described and claimed herein.

DETAILED DESCRIPTION OF THE PREFERRED EMBODIMENTS

Figure 1:
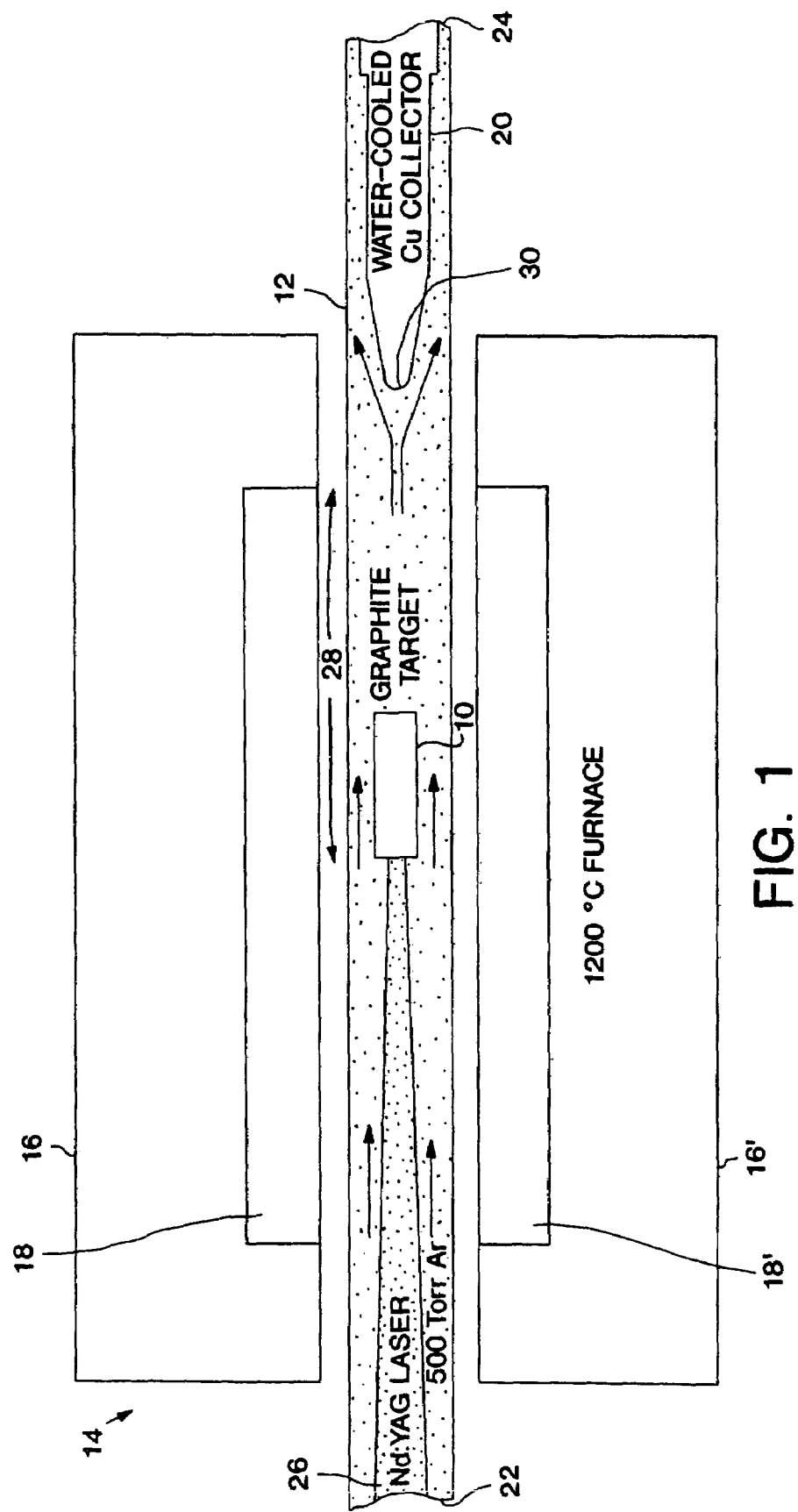
FIG. 1 is a diagram of an apparatus for practicing the invention.

Carbon has from its very essence not only the propensity to self-assemble from a high temperature vapor to form perfect spheroidal closed cages (of which $C_{60}$ is prototypical), but also (with the aid of a transition metal catalyst) to assemble into perfect single-wall cylindrical tubes which may be sealed perfectly at both ends with a semifullerene dome. These tubes, which may be thought of as one-dimensional single crystals of carbon, are true fullerene molecules, having no dangling bonds.

Single-wall carbon nanotubes of this invention are much more likely to be free of defects than multi-wall carbon nanotubes. Defects in single-wall carbon nanotubes are less likely than defects in multi-walled carbon nanotubes because the latter can survive occasional defects, while the former have no neighboring walls to compensate for defects by forming bridges between unsaturated carbon valances. Since single-wall carbon nanotubes will have fewer defects, they are stronger, more conductive, and therefore more useful than multi-wall carbon nanotubes of similar diameter.

Carbon nanotubes, and in particular the single-wall carbon nanotubes of this invention, are useful for making electrical connectors in micro devices such as integrated circuits or in semiconductor chips used in computers because of the electrical conductivity and small size of the carbon nanotube. The carbon nanotubes are useful as antennas at optical frequencies, and as probes for scanning probe microscopy such as are used in scanning tunneling microscopes (STM) and atomic force microscopes (AFM). The carbon nanotubes may be used in place of or in conjunction with carbon black in tires for motor vehicles. The carbon nanotubes are also useful as supports for catalysts used in industrial and chemical processes such as hydrogenation, reforming and cracking catalysts.

Ropes of single-wall carbon nanotubes made by this invention are metallic, i.e., they will conduct electrical charges with a relatively low resistance. Ropes are useful in any application where an electrical conductor is needed, for example as an additive in electrically conductive paints or in polymer coatings or as the probing tip of an STM.

In defining carbon nanotubes, it is helpful to use a recognized system of nomenclature. In this application, the carbon nanotube nomenclature described by M. S. Dresselhaus, G. Dresselhaus, and P. C. Eklund, *Science of Fullerness and Carbon Nanotubes*, Chap. 19, especially pp. 756–760, (1996), published by Academic Press, 525 B Street, Suite 1900, San Diego, Calif. 92101-4495 or 6277 Sea Harbor Drive, Orlando, Fla. 32877 (ISBN 0-12-221820-5), which is hereby incorporated by reference, will be used. The single wall tubular fullerenes are distinguished from each other by double index (n,m) where n and m are integers that describe how to cut a single strip of hexagonal "chicken-wire" graphite so that it makes the tube perfectly when it is wrapped onto the surface of a cylinder and the edges are sealed together. When the two indices are the same, m=n, the resultant tube is said to be of the "arm-chair" (or n,n) type, since when the tube is cut perpendicular to the tube axis, only the sides of the hexagons are exposed and their pattern around the periphery of the tube edge resembles the arm and seat of an arm chair repeated n times. Arm-chair tubes are a preferred form of single-wall carbon nanotubes since they are metallic, and have extremely high electrical and thermal conductivity. In addition, all single-wall nanotubes have extremely high tensile strength.

The dual laser pulse feature described herein produces an abundance of (10,10) single-wall carbon nanotubes. The (10,10), single-wall carbon nanotubes have an approximate tube diameter of 13.8 Å±0.3 Å or 13.8 Å±0.2 Å.

The present invention provides a method for making single-wall carbon nanotubes in which a laser beam vaporizes material from a target comprising, consisting essentially of, or consisting of a mixture of carbon and one or more Group VI or Group VIII transition metals. The vapor from the target forms carbon nanotubes that are predominantly single-wall carbon nanotubes, and of those, the (10, 10) tube is predominant. The method also produces significant amounts of single-wall carbon nanotubes that are arranged as ropes, i.e., the single-wall carbon nanotubes run parallel to each other. Again, the (10, 10) tube is the predominant tube found in each rope. The laser vaporization method provides several advantages over the arc discharge method of making carbon nanotubes: laser vaporization allows much greater control over the conditions favoring growth of single-wall carbon nanotubes, the laser vaporization method permits continuous operation, and the laser vaporization method produces single-wall carbon nanotubes in higher yield and of better quality. As described herein, the laser vaporization method may also be used to produce longer carbon nanotubes and longer ropes.

Carbon nanotubes may have diameters ranging from about 0.6 nanometers (nm) for a single-wall carbon nanotube up to 3 nm, 5 nm, 10 nm, 30 nm, 60 nm or 100 nm for single-wall or multi-wall carbon nanotubes. The carbon nanotubes may range in length from 50 nm up to 1 millimeter (mm), 1 centimeter (cm), 3 cm, 5 cm, or greater. The yield of single-wall carbon nanotubes in the product made by this invention is unusually high. Yields of single-wall carbon nanotubes greater than 10 wt %, greater than 30 wt % and greater than 50 wt % of the material vaporized are possible with this invention.

As will be described further, the one or more Group VI or VIII transition metals catalyze the growth in length of a carbon nanotube and/or the ropes. The one or more Group VI or VIII transition metals also selectively produce single-wall carbon nanotubes and ropes of single-wall carbon nanotubes in high yield. The mechanism by which the growth in the carbon nanotube and/or rope is accomplished is not completely understood. However, it appears that the presence of the one or more Group VI or VIII transition metals on the end of the carbon nanotube facilitates the addition of carbon from the carbon vapor to the solid structure that forms the carbon nanotube. Applicants believe this mechanism is responsible for the high yield and selectivity of single-wall carbon nanotubes and/or ropes in the product and will describe the invention utilizing this mechanism as merely an explanation of the results of the invention. Even if the mechanism is proved partially or wholly incorrect, the invention which achieves these results is still fully described herein.

One aspect of the invention comprises a method of making carbon nanotubes and/or ropes of carbon nanotubes which comprises supplying carbon vapor to the live end of a carbon nanotube while maintaining the live end of a carbon nanotube in an annealing zone. Carbon can be vaporized in accordance with this invention by an apparatus in which a laser beam impinges on a target comprising carbon that is maintained in a heated zone. A similar apparatus has been described in the literature, for example, in U.S. Pat. No. 5,300,203 which is incorporated herein by reference, and in Chai, et al., "Fullerenes with Metals Inside," *J. Phys. Chem.*, vol. 95, no. 20, p. 7564 (1991).

Carbon nanotubes having at least one live end are formed when the target also comprises a Group VI or VIII transition metal or mixtures of two or more Group VI or VIII transition metals. In this application, the term "live end" of a carbon nanotube refers to the end of the carbon nanotube on which atoms of the one or more Group VI or VIII transition metals are located. One or both ends of the nanotube may be a live end. A carbon nanotube having a live end is initially produced in the laser vaporization apparatus of this invention by using a laser beam to vaporize material from a target comprising carbon and one or more Group VI or VIII transition metals and then introducing the carbon/Group VI or VIII transition metal vapor to an annealing zone. Optionally, a second laser beam is used to assist in vaporizing carbon from the target. A carbon nanotube having a live end will form in the annealing zone and then grow in length by the catalytic addition of carbon from the vapor to the live end of the carbon nanotube. Additional carbon vapor is then supplied to the live end of a carbon nanotube to increase the length of the carbon nanotube.

The carbon nanotube that is formed is not always a single-wall carbon nanotube; it may be a multi-wall carbon nanotube having two, five, ten or any greater number of walls (concentric carbon nanotubes). Preferably, though, the carbon nanotube is a single-wall carbon nanotube and this invention provides a way of selectively producing (10, 10) single-wall carbon nanotubes in greater and sometimes far greater abundance than multi-wall carbon nanotubes.

The annealing zone where the live end of the carbon nanotube is initially formed should be maintained at a temperature of 500° to 1500° C., more preferably 1000° to 1400° C. and most preferably 1100 to 1300° C. In embodiments of this invention where carbon nanotubes having live ends are caught and maintained in an annealing zone and grown in length by further addition of carbon (without the necessity of adding further Group VI or VIII transition metal vapor), the annealing zone may be cooler, 400° to 1500° C., preferably 400° to 1200° C., most preferably 500° to 700° C. The pressure in the annealing zone should be maintained in the range of 50 to 2000 Torr., more preferably 100 to 800 Torr. and most preferably 300 to 600 Torr. The atmosphere in the annealing zone will comprise carbon. Normally, the atmosphere in the annealing zone will also comprise a gas that sweeps the carbon vapor through the annealing zone to a collection zone. Any gas that does not prevent the formation of carbon nanotubes will work as the sweep gas, but preferably the sweep gas is an inert gas such as helium, neon, argon, krypton, xenon, radon, or mixtures of two or more of these. Helium and Argon are most preferred. The use of a flowing inert gas provides the ability to control temperature, and more importantly, provides the ability to transport carbon to the live end of the carbon nanotube. In some embodiments of the invention, when other materials are being vaporized along with carbon, for example one or more Group VI or VIII transition metals, those compounds and vapors of those compounds will also be present in the atmosphere of the annealing zone. If a pure metal is used, the resulting vapor will comprise the metal. If a metal oxide is used, the resulting vapor will comprise the metal and ions or molecules of oxygen.

It is important to avoid the presence of too many materials that kill or significantly decrease the catalytic activity of the one or more Group VI or VIII transition metals at the live end of the carbon nanotube. It is known that the presence of too much water ($H_2O$) and/or oxygen ($O_2$) will kill or significantly decrease the catalytic activity of the one or more Group VI or VIII transition metals. Therefore, water and oxygen are preferably excluded from the atmosphere in the annealing zone. Ordinarily, the use of a sweep gas having less than 5 wt %, more preferably less than 1 wt % water and oxygen will be sufficient. Most preferably the water and oxygen will be less than 0.1 wt %.

Preferably, the formation of the carbon nanotube having a live end and the subsequent addition of carbon vapor to the carbon nanotube are all accomplished in the same apparatus. Preferably, the apparatus comprises a laser that is aimed at a target comprising carbon and one or more Group VI or VIII transition metals, and the target and the annealing zone are maintained at the appropriate temperature, for example by maintaining the annealing zone in an oven. A laser beam may be aimed to impinge on a target comprising carbon and one or more Group VI or VIII transition metals where the target is mounted inside a quartz tube that is in turn maintained within a furnace maintained at the appropriate temperature. As noted above, the oven temperature is most preferably within the range of 1100° to 1300° C. The tube need not necessarily be a quartz tube; it may be made from any material that can withstand the temperatures (1000° to 1500° C.). Alumina or tungsten could be used to make the tube in addition to quartz.

Improved results are obtained where a second laser is also aimed at the target and both lasers are timed to deliver pulses of laser energy at separate times. For example, the first laser may deliver a pulse intense enough to vaporize material from the surface of the target. Typically, the pulse from the first laser will last about 10 nanoseconds (ns). After the first pulse has stopped, a pulse from a second laser hits the target or the carbon vapor or plasma created by the first pulse to provide more uniform and continued vaporization of material from the surface of the target. The second laser pulse may be the same intensity as the first pulse, or less intense, but the pulse from the second laser is typically more intense than the pulse from the first laser, and typically delayed about 20 to 60 ns, more preferably 40 to 55 ns, after the end of the first pulse.

Examples of a typical specification for the first and second lasers are given in Examples 1 and 3, respectively. As a rough guide, the first laser may vary in wavelength from 11 to 0.1 micrometers, in energy from 0.05 to 1 Joule and in repetition frequency from 0.01 to 1000 Hertz (Hz). The duration of the first laser pulse may vary from $10^{-13}$ to $10^{-6}$ seconds (s). The second laser may vary in wavelength from 11 to 0.1 micrometers, in energy from 0.05 to 1 Joule and in repetition frequency from 0.01 to 1000 Hertz. The duration of the second laser pulse may vary from $10^{-13}$ s to $10^{-6}$ s. The beginning of the second laser pulse should be separated from end of the first laser pulse by about 10 to 100 ns. If the laser supplying the second pulse is an ultraviolet (UV) laser (an Excimer laser for example), the time delay can be longer, up to 1 to 10 milliseconds. But if the second pulse is from a visible or infrared (IR) laser, then the adsorption is preferably into the electrons in the plasma created by the first pulse. In this case, the optimum time delay between pulses is about 20 to 60 ns, more preferably 40 to 55 ns and most preferably 40 to 50 ns. These ranges on the first and second lasers are for beams focused to a spot on the target composite rod of about 0.3 to 10 mm diameter. The time delay between the first and second laser pulses is accomplished by computer control that is known in the art of utilizing pulsed lasers. Applicants have used a CAMAC crate from LeCroy Research Systems, 700 Chestnut Ridge Road, Chestnut Ridge, N.Y. 10977-6499 along with a timing pulse generator from Kinetics Systems Corporation, 11 Maryknoll Drive, Lockport, Ill. 60441 and a nanopulser from LeCroy Research Systems. Multiple first lasers and multiple second lasers may be needed for scale up to larger targets or more powerful lasers may be used. The main feature of multiple lasers is that the first laser should evenly ablate material from the target surface into a vapor or plasma and the second laser should deposit enough energy into the ablated material in the vapor or plasma plume made by the first pulse to insure that the material is vaporized into atoms or small molecules (less than ten carbon atoms per molecule). If the second laser pulse arrives too soon after the first pulse, the plasma created by the first pulse may be so dense that the second laser pulse is reflected by the plasma. If the second laser pulse arrives too late after the first pulse, the plasma and/or ablated material created by the first laser pulse will strike the surface of the target. But if the second laser pulse is timed to arrive just after the plasma and/or ablated material has been formed, as described herein, then the plasma and/or ablated material will absorb energy from the second laser pulse. Also, it should be noted that the sequence of a first laser pulse followed by a second laser pulse will be repeated at the same repetition frequency as the first and second laser pulses, i.e., 0.01 to 1000 Hz.

In addition to lasers described in the Examples, other examples of lasers useful in this invention include an XeF (365 nm wavelength) laser, an XeCl (308 nm wavelength) laser, a KrF (248 nm wavelength) laser or an ArF (193 nm wavelength) laser.

Optionally, but preferably, a sweep gas is introduced to the tube upstream of the target and flows past the target carrying vapor from the target downstream. The quartz tube should be maintained at conditions so that the carbon vapor and the one or more Group VI or VIII transition metals will form carbon nanotubes at a point downstream of the carbon target but still within the heated portion of the quartz tube. Collection of the carbon nanotubes that form in the annealing zone may be facilitated by maintaining a cooled collector in the internal portion of the far downstream end of the quartz tube. For example, carbon nanotubes may be collected on a water cooled metal structure mounted in the center of the quartz tube. The carbon nanotubes will collect where the conditions are appropriate, preferably on the water cooled collector.

Any Group VI or VIII transition metal may be used as the one or more Group VI or VIII transition metals in this invention. Group VI transition metals are chromium (Cr), molybdenum (Mo), and tungsten (W). Group VIII transition metals are iron (Fe), cobalt (Co), nickel (Ni), ruthenium (Ru), rhodium (Rh), palladium (Pd), osmium (Os), Iridium (Ir) and platinum (Pt). Preferably, the one or more Group VIII transition metals are selected from the group consisting of iron, cobalt, ruthenium, nickel and platinum. Most preferably, mixtures of cobalt and nickel or mixtures of cobalt and platinum are used. The one or more Group VI or VIII transition metals useful in this invention may be used as pure metal, oxides of metals, carbides of metals, nitrate salts of metals, or other compounds containing the Group VI or VIII transition metal. Preferably, the one or more Group VI or VIII transition metals are used as pure metals, oxides of metals, or nitrate salts of metals. The amount of the one or more Group VI or VIII transition metals that should be combined with carbon to facilitate production of carbon nanotubes having a live end, is from 0.1 to 10 atom per cent, more preferably 0.5 to 5 atom per cent and most preferably 0.5 to 1.5 atom per cent. In this application, atom per cent means the percentage of specified atoms in relation to the total number of atoms present. For example, a 1 atom % mixture of nickel and carbon means that of the total number of atoms of nickel plus carbon, 1% are nickel (and the other 99% are carbon). When mixtures of two or more Group VI or VIII transition metals are used, each metal should be 1 to 99 atom % of the metal mix, preferably 10 to 90 atom % of the metal mix and most preferably 20 to 80 atom % of the metal mix. When two Group VI or VIII transition metals are used, each metal is most preferably 30 to 70 atom % of the metal mix. When three Group VI or VIII transition metals are used, each metal is most preferably 20 to 40 atom % of the metal mix.

The one or more Group VI or VIII transition metals should be combined with carbon to form a target for vaporization by a laser as described herein. The remainder of the target should be carbon and may include carbon in the graphitic form, carbon in the fullerene form, carbon in the diamond form, or carbon in compound form such as polymers or hydrocarbons, or mixtures of two or more of these. Most preferably, the carbon used to make the target is graphite.

Carbon is mixed with the one or more Group VI or VIII transition metals in the ratios specified and then, in the laser vaporization method, combined to form a target that comprises the carbon and the one or more Group VI or VIII transition metals. The target may be made by uniformly mixing carbon and the one or more Group VI or VIII transition metals with carbon cement at room temperature and then placing the mixture in a mold. The mixture in the mold is then compressed and heated to about 130° C. for about 4 or 5 hours while the epoxy resin of the carbon cement cures. The compression pressure used should be sufficient to compress the mixture of graphite, one or more Group VI or VIII transition metals and carbon cement into a molded form that does not have voids so that the molded form will maintain structural integrity. The molded form is then carbonized by slowly heating it to a temperature of 810° C. for about 8 hours under an atmosphere of flowing argon. The molded and carbonized targets are then heated to about 1200° C. under flowing argon for about 12 hours prior to their use as a target to generate a vapor comprising carbon and the one or more Group VI or VIII transition metals.

The invention may be further understood by reference to FIG. 1 which is a cross-section view of laser vaporization in an oven. A target 10 is positioned within tube 12. The target 10 will comprise carbon and may comprise one or more Group VI or VIII transition metals. Tube 12 is positioned in oven 14 which comprises insulation 16 and heating element zone 18. Corresponding portions of oven 14 are represented by insulation 16' and heating element zone 18'. Tube 12 is positioned in oven 14 so that target 10 is within heating element zone 18.

FIG. 1 also shows water cooled collector 20 mounted inside tube 12 at the downstream end 24 of tube 12. An inert gas such as argon or helium may be introduced to the upstream end 22 of tube 12 so that flow is from the upstream end 22 of tube 12 to the downstream end 24. A laser beam 26 is produced by a laser (not shown) focused on target 10. In operation, oven 14 is heated to the desired temperature, preferably 1100° to 1300° C., usually about 1200° C. Argon is introduced to the upstream end 22 as a sweep gas. The argon may optionally be preheated to a desired temperature, which should be about the same as the temperature of oven 14. Laser beam 26 strikes target 10 vaporizing material in target 10. Vapor from target 10 is carried toward the downstream end 24 by the flowing argon stream. If the target is comprised solely of carbon, the vapor formed will be a carbon vapor. If one or more Group VI or VIII transition metals are included as part of the target, the vapor will comprise carbon and one or more Group VI or VIII transition metals.

The heat from the oven and the flowing argon maintain a certain zone within the inside of the tube as an annealing zone. The volume within tube 12 in the section marked 28 in FIG. 1 is the annealing zone wherein carbon vapor begins to condense and then actually condenses to form carbon nanotubes. The water cooled collector 20 may be maintained at a temperature of 700° C. or lower, preferably 500° C. or lower on the surface to collect carbon nanotubes that were formed in the annealing zone.

In one embodiment of the invention, carbon nanotubes having a live end can be caught or mounted on a tungsten wire in the annealing zone portion of tube 12. In this embodiment, it is not necessary to continue to produce a vapor having one or more Group VI or VIII transition metals. In this case, target 10 may be switched to a target that comprises carbon but not any Group VI or VIII transition metal, and carbon will be added to the live end of the carbon nanotube.

In another embodiment of the invention, when the target comprises one or more Group VI or VIII transition metals, the vapor formed by laser beam 26 will comprise carbon and the one or more Group VI or VIII transition metals. That vapor will form carbon nanotubes in the annealing zone that will then be deposited on water cooled collector 20, preferably at tip 30 of water cooled collector 20. The presence of one or more Group VI or VIII transition metals in the vapor along with carbon in the vapor preferentially forms carbon nanotubes instead of fullerenes, although some fullerenes and graphite will usually be formed as well. In the annealing zone, carbon from the vapor is selectively added to the live end of the carbon nanotubes due to the catalytic effect of the one or more Group VI or VIII transition metals present at the live end of the carbon nanotubes.

Figure 2:
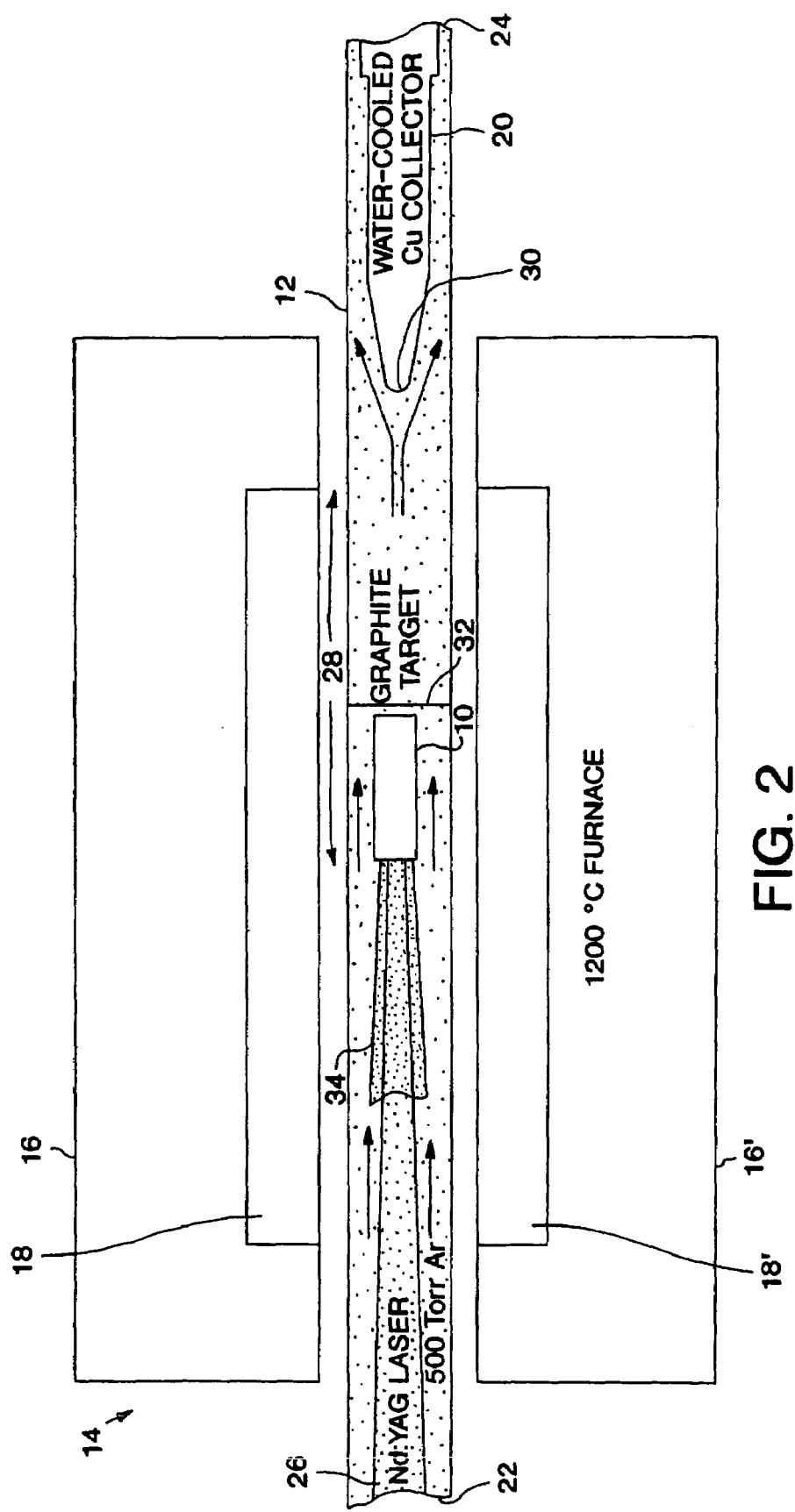
FIG. 2 is a diagram of an apparatus for practicing the invention utilizing two different laser pulses to vaporize the composite rod target.

FIG. 2 shows an optional embodiment of the invention that can be used to make longer carbon nanotubes wherein a tungsten wire 32 is stretched across the diameter of tube 12 downstream of target 10 but still within the annealing zone. After laser beam pulses hit the target 10 forming a carbon/Group VI or VIII transition metal vapor, carbon nanotubes having live ends will form in the vapor. Some of those carbon nanotubes will be caught on the tungsten wire and the live end will be aimed toward the downstream end 24 of tube 12. Additional carbon vapor will make the carbon nanotube grow. Carbon nanotubes as long as the annealing zone of the apparatus can be made in this embodiment. In this embodiment, it is possible to switch to an all carbon target after initial formation of the carbon nanotubes having a live end, because the vapor need only contain carbon at that point.

FIG. 2 also shows part of second laser beam 34 as it impacts on target 10. In practice, laser beam 26 and second laser beam 34 would be aimed at the same surface of target 10, but they would impact that surface at different times as described herein.

It is also possible to stop the laser or lasers altogether. Once the single-wall carbon nanotube having a live end is formed, the live end will catalyze growth of the single-wall carbon nanotube at lower temperatures and with other carbon sources. The carbon source can be switched to fullerenes, that can be transported to the live end by the flowing sweep gas. The carbon source can be graphite particles carried to the live end by the sweep gas. The carbon source can be a hydrocarbon that is carried to the live end by a sweep gas or a hydrocarbon gas or mixture of hydrocarbon gasses introduced to tube 12 to flow past the live end. Hydrocarbons usefull include methane, ethane, propane, butane, ethylene, propylene, benzene, toluene or any other paraffinic, olefinic, cyclic or aromatic hydrocarbon, or any other hydrocarbon.

The annealing zone temperature in this embodiment can be lower than the annealing zone temperatures necessary to initially form the single-wall carbon nanotube having a live end. Annealing zone temperatures can be in the range of 400° to 1500° C., preferably 400 to 1200° C., most preferably 500° to 700° C. The lower temperatures are workable because the Group VI or VIII transition metal(s) catalyze the addition of carbon to the nanotube at these lower temperatures.

Measurements show that the single-wall carbon nanotubes in the ropes have a diameter of 13.8 Å±0.2 Å. A (10, 10) single-wall carbon nanotube has a calculated diameter of about 13.6 Å, and the measurements on the single-wall carbon nanotubes in the ropes proves they are predominantly the (10, 10) tube. The number of single-wall carbon nanotubes in each rope may vary from about 5 to 5000, preferably about 10 to 1000, or 50 to 1000, and most preferably about 100 to 500. The diameters of the ropes range from about 20 to 200 Å, more preferably about 50 to 200 Å. The (10, 10) single-wall carbon nanotube predominates the tubes in the ropes made by this invention. Ropes having greater than 10%, greater than 30%, greater than 50%, greater than 75%, and even greater than 90% (10, 10) single-wall carbon nanotubes have been produced. Ropes having greater than 50% greater than 75% and greater than 90% armchair (n, n) single-wall carbon nanotubes are also made by and are a part of this invention. The single-wall carbon nanotubes in each rope are arranged to form a rope having a 2-D triangular lattice having a lattice constant of about 17 Å. Ropes of 0.1 up to 10, 100 or 1,000 microns in length are made by the invention. The resistivity of a rope made in accordance with this invention was measured to be 0.34 to 1.0 micro ohms per meter at 27° C. proving that the ropes are metallic.

A "felt" of the ropes described above may also be produced. The product material is collected as a tangled collection of ropes stuck together in a mat referred to herein as a "felt." The felt material collected from the inventive process has enough strength to withstand handling, and it has been measured to be electrically conductive. Felts of 10 mm$^2$, 100 mm$^2$, 1000 mm$^2$ or greater, are formed in the inventive process.

One advantage of the single-wall carbon nanotubes produced with the laser vaporization in an oven method is their cleanliness. Typical discharge arc-produced single-wall carbon nanotubes are covered with a thick layer of amorphous carbon, perhaps limiting their usefulness compared to the clean bundles of single-wall carbon nanotubes produced by the laser vaporization method. Other advantages and features of the invention are apparent from the disclosure. The invention may also be understood by reference to Guo et at., "Catalytic Growth Of Single-Walled Nanotubes By Laser Vaporization," Chem. Phys. Lett., Vol. 243, pp. 49–54 (1995).

The advantages achieved by the dual pulsed lasers insure that the carbon and metal go through the optimum annealing conditions. The dual laser pulse process achieves this by using time to separate the ablation from the further and full vaporization of the ablated material. These same optimum conditions can be achieved by using solar energy to vaporize carbon and metals as described in U.S. application Ser. No. 08/483,045 filed Jun. 7, 1995 which is incorporated herein by reference. Combining any of the Group VI or VIII transition metals in place of the metals disclosed in the application Ser. No. 08/483,045 will produce the single-wall carbon nanotubes and the ropes of this invention.

Purification of Single-Wall Nanotubes

Carbon nanotubes in material obtained according to any of the foregoing methods may be purified according to the methods of this invention. A mixture containing at least a portion of single-wall nanotubes ("SWNT") may be prepared, for example, as described by Iijima, et al, or Bethune, et al. However, production methods which produce single-wall nanotubes in relatively high yield are preferred. In particular, laser production methods such as those disclosed in U.S. Ser. No. 08/687,665, may produce up to 70% or more single-wall nanotubes, and the single-wall nanotubes are predominately of the arm-chair structure.

The product of a typical process for making mixtures containing single-wall carbon nanotubes is a tangled felt which can include deposits of amorphous carbon, graphite, metal compounds (e.g., oxides), spherical fullerenes, catalyst particles (often coated with carbon or fullerenes) and possibly multi-wall carbon nanotubes. The single-wall carbon nanotubes may be aggregated in "ropes" or bundles of essentially parallel nanotubes.

When material having a high proportion of single-wall nanotubes is purified as described herein, the preparation produced will be enriched in single-wall nanotubes, so that the single-wall nanotubes are substantially free of other material. In particular, single-wall nanotubes will make up at least 80% of the preparation, preferably at least 90%, more preferably at least 95% and most preferably over 99% of the material in the purified preparation.

The purification process of the present invention comprises heating the SWNT-containing felt under oxidizing conditions to remove the amorphous carbon deposits and other contaminating materials. In a preferred mode of this purification procedure, the felt is heated in an aqueous solution of an inorganic oxidant, such as nitric acid, a mixture of hydrogen peroxide and sulfuric acid, or potassium permanganate. Preferably, SWNT-containing felts are refluxed in an aqueous solution of an oxidizing acid at a concentration high enough to etch away amorphous carbon deposits within a practical time frame, but not so high that the single-wall carbon nanotube material will be etched to a significant degree. Nitric acid at concentrations from 2.0 to 2.6 M have been found to be suitable. At atmospheric pressure, the reflux temperature of such an aqueous acid solution is about 120° C.

In a preferred process, the nanotube-containing felts can be refluxed in a nitric acid solution at a concentration of 2.6 M for 24 hours. Purified nanotubes may be recovered from the oxidizing acid by filtration through, e.g., a 5 micron pore size TEFLON filter, like Millipore Type LS. Preferably, a second 24 hour period of refluxing in a fresh nitric solution of the same concentration is employed followed by filtration as described above.

Refluxing under acidic oxidizing conditions may result in the esterification of some of the nanotubes, or nanotube contaminants. The contaminating ester material may be removed by saponification, for example, by using a saturated sodium hydroxide solution in ethanol at room temperature for 12 hours. Other conditions suitable for saponification of any ester linked polymers produced in the oxidizing acid treatment will be readily apparent to those skilled in the art. Typically the nanotube preparation will be neutralized after the saponification step. Refluxing the nanotubes in 6M aqueous hydrochloric acid for 12 hours has been found to be suitable for neutralization, although other suitable conditions will be apparent to the skilled artisan.

After oxidation, and optionally saponification and neutralization, the purified nanotubes may be collected by settling or filtration preferably in the form of a thin mat of purified fibers made of ropes or bundles of SWNTs, referred to hereinafter as "bucky paper." In a typical example, filtration of the purified and neutralized nanotubes on a TEFLON membrane with 5 micron pore size produced a black mat of purified nanotubes about 100 microns thick. The nanotubes in the bucky paper may be of varying lengths and may consists of individual nanotubes, or bundles or ropes of up to $10^3$ single-wall nanotubes, or mixtures of individual single-wall nanotubes and ropes of various thicknesses. Alternatively, bucky paper may be made up of nanotubes which are homogeneous in length or diameter and/or molecular structure due to fractionation as described hereinafter.

The purified nanotubes or bucky paper are finally dried, for example, by baking at 850° C. in a hydrogen gas atmosphere, to produce dry, purified nanotube preparations.

Figure 3A:
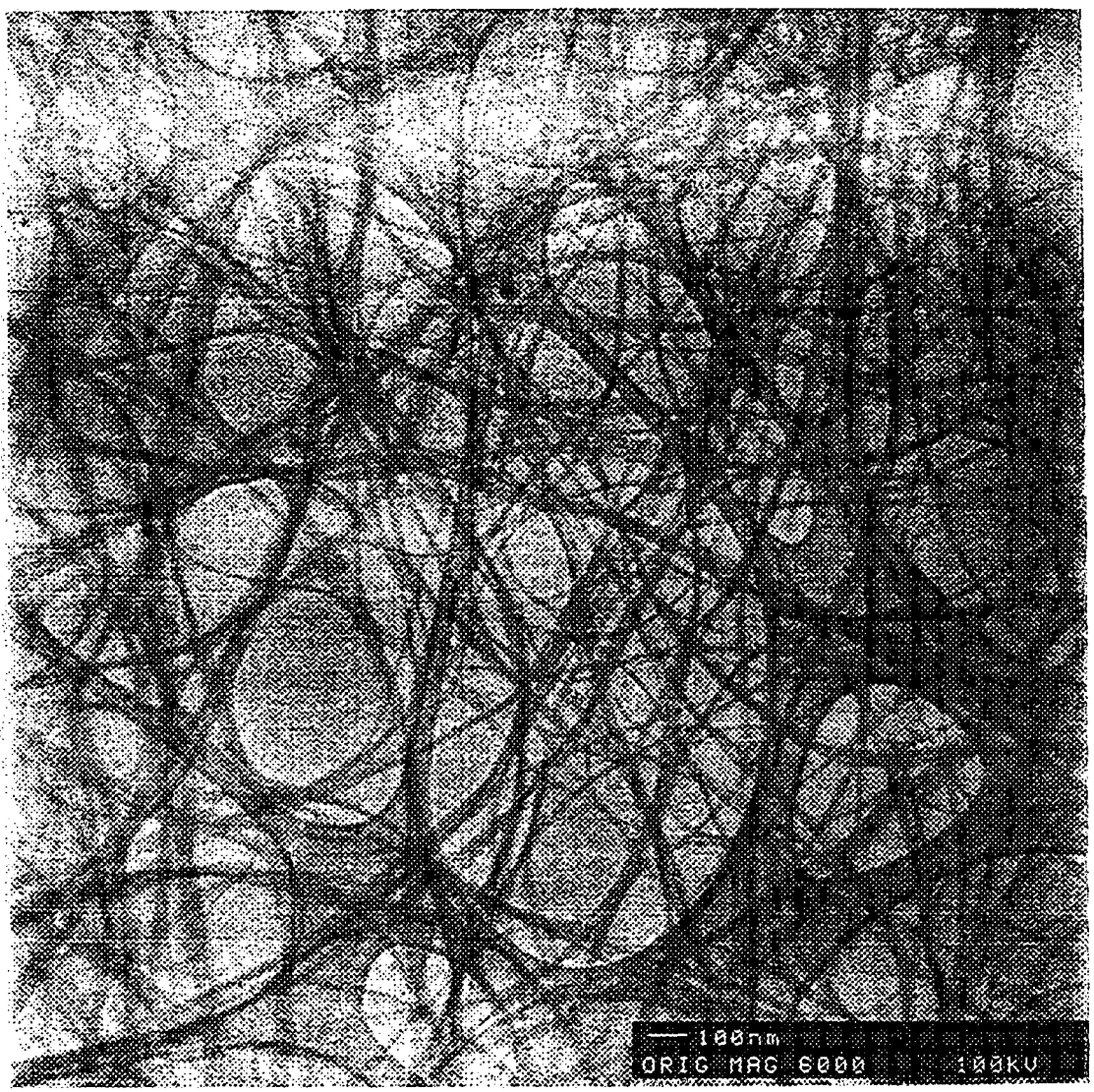
FIG. 3A is a TEM spectrum of purified SWNTs according to the present invention.
Figure 3B:
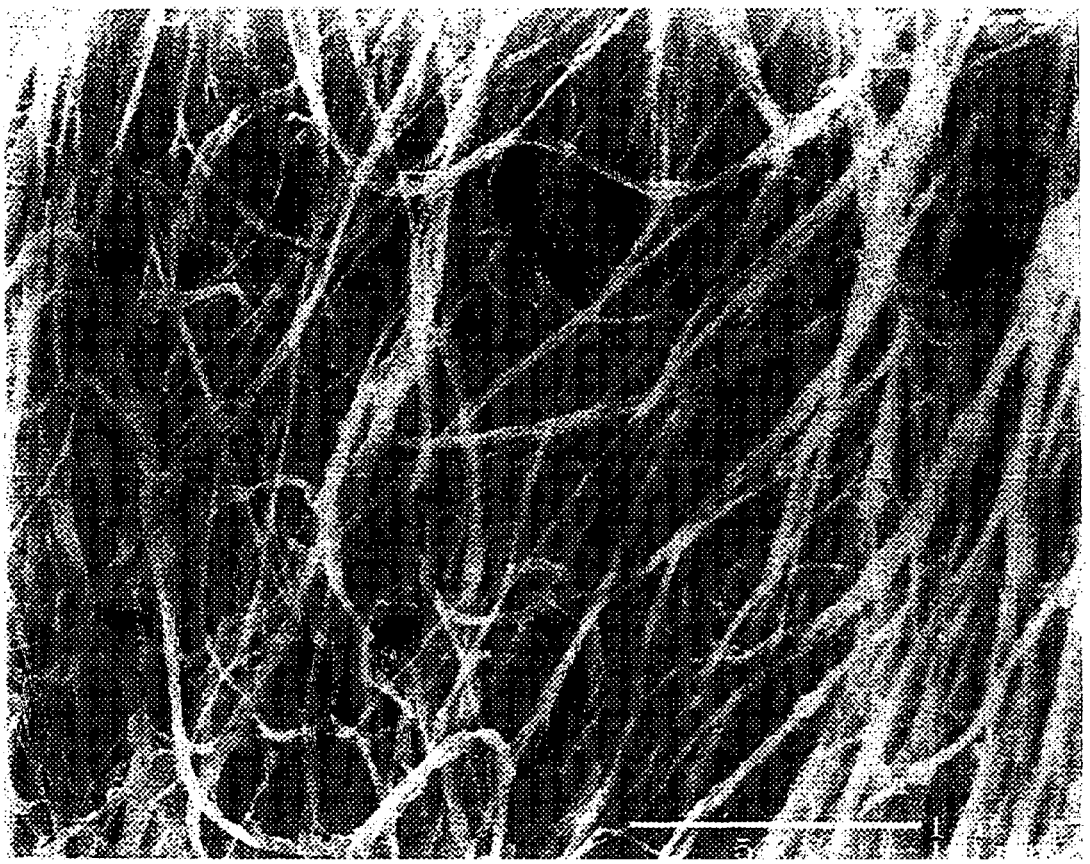
FIG. 3B is a SEM spectrum of purified SWNTs according to the present invention.
Figure 3C:
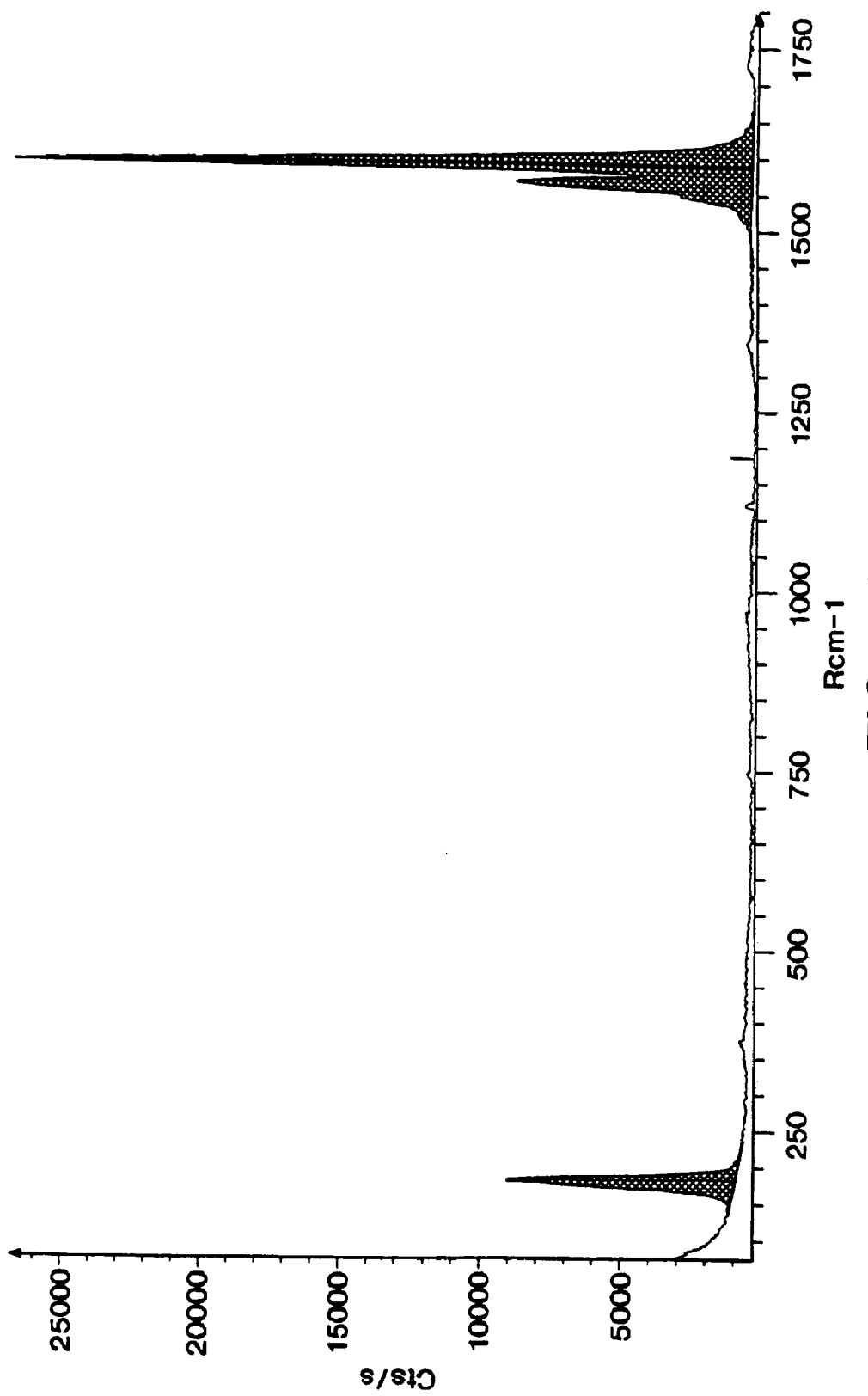
FIG. 3C is a Raman spectrum of purified SWNTs according to the present invention.

When laser-produced single-wall nanotube material, produced by the two-laser method of U.S. Ser. No. 08/687,665, was subjected refluxing in 2.6 M aqueous nitric acid, with one solvent exchange, followed by sonication in saturated NaOH in ethanol at room temperature for 12 hours, then neutralization by refluxing in 6M aqueous HCl for 12 hours, removal from the aqueous medium and baking in a hydrogen gas atmosphere at 850 C in 1 atm $H_2$ gas (flowing at 1–10 sccm through a 1" quartz tube) for 2 hours, detailed TEM, SEM and Raman spectral examination showed it to be >99% pure, with the dominant impurity being a few carbon-encapsulated Ni/Co particles. (See FIGS. 3A, 3B, 3C)

In another embodiment, a slightly basic solution (e.g., pH of approximately 8–12) may also be used in the saponification step. The initial cleaning in 2.6 M $HNO_3$ converts amorphous carbon in the raw material to various sizes of linked polycyclic compounds, such as fulvic and humic acids, as well as larger polycyclic aromatics with various functional groups around the periphery, especially the carboxylic acid groups. The base solution ionizes most of the polycyclic compounds, making them more soluble in aqueous solution. In a preferred process, the nanotube containing felts are refluxed in 2–5 M $HNO_3$ for 6–15 hours at approximately 110°–125° C. Purified nanotubes may be filtered and washed with 10 mM NaOH solution on a 3 micron pore size TSTP Isopore filter. Next, the filtered nanotubes polished by stirring them for 30 minutes at 60° C. in a S/N (Sulfuric acid/Nitric acid) solution. In a preferred embodiment, this is a 3:1 by volume mixture of concentrated sulfuric acid and nitric acid. This step removes essentially all the remaining material from the tubes that is produced during the nitric acid treatment.

Once the polishing is complete, a four-fold dilution in water is made, and the nanotubes are again filtered on the 3 micron pore size TSTP Isopore filter. The nanotubes are again washed with a 10 mM NaOH solution. Finally, the nanotubes are stored in water, because drying the nanotubes makes it difficult to resuspend them.

The conditions may be further optimized for particular uses, but this basic approach by refluxing in oxidizing acid has been shown to be successful. Purification according to this method will produce single-wall nanotubes for use as catalysts, as components in composite materials, or as a starting material in the production of tubular carbon molecules and continuous macroscopic carbon fiber of single-wall nanotube molecules.

Single-Wall Carbon Nanotube Molecules

Single-wall carbon nanotubes produced by prior methods are so long and tangled that it is very difficult to purify them, or manipulate them. However, the present invention provides for cutting them into short enough lengths that they are no longer tangled and annealing the open ends closed. The short, closed tubular carbon molecules may be purified and sorted very readily using techniques that are similar to those used to sort DNA or size polymers. Thus, this invention effectively provides a whole new class of tubular carbon molecules.

Preparation of homogeneous populations of short carbon nanotube molecules may be accomplished by cutting and annealing (reclosing) the nanotube pieces followed by fractionation. The cutting and annealing processes may be carried out on a purified nanotube bucky paper, on felts prior to purification of nanotubes or on any material that contains single-wall nanotubes. When the cutting and annealing process is performed on felts, it is preferably followed by oxidative purification, and optionally saponification, to remove amorphous carbon. Preferably, the starting material for the cutting process is purified single-wall nanotubes, substantially free of other material.

The short nanotube pieces can be cut to a length or selected from a range of lengths, that facilitates their intended use. For applications involving the individual tubular molecules per se (e.g., derivatives, nanoscale conductors in quantum devices, i.e., molecular wire), the length can be from just greater than the diameter of the tube up to about 1,000 times the diameter of the tube. Typical tubular molecules will be in the range of from about 5 to 1,000 nanometers or longer. For making template arrays useful in growing carbon fibers of SWNT as described below, lengths of from about 50 to 500 nm are preferred.

Any method of cutting that achieves the desired length of nanotube molecules without substantially affecting the structure of the remaining pieces can be employed. The preferred cutting method employs irradiation with high mass ions. In this method, a sample is subjected to a fast ion beam, e.g., from a cyclotron, at energies of from about 0.1 to 10 giga-electron volts. Suitable high mass ions include those over about 150 AMU's such as bismuth, gold, uranium and the like.

Preferably, populations of individual single-wall nanotube molecules having homogeneous length are prepared starting with a heterogeneous bucky paper and cutting the nanotubes in the paper using a gold ($Au^{+33}$) fast ion beam. In a typical procedure, the bucky paper (about 100 micron thick) is exposed to ~$10^{12}$ fast ions per $cm^2$, which produces severely damaged nanotubes in the paper, on average every 100 nanometers along the length of the nanotubes. The fast ions create damage to the bucky paper in a manner analogous to shooting 10–100 nm diameter "bullet holes" through the sample. The damaged nanotubes then can be annealed (closed) by heat sealing of the tubes at the point where ion damage occurred, thus producing a multiplicity of shorter nanotube molecules. At these flux levels, the shorter tubular molecules produced will have a random distribution of cut sizes with a length peak near about 100 nm. Suitable annealing conditions are well know in the fullerene art, such as for example, baking the tubes in vacuum or inert gas at 1200° C. for 1 hour.

The SWNTs may also be cut into shorter tubular molecules by intentionally incorporating defect-producing atoms into the structure of the SWNT during production. These defects can be exploited chemically (e.g., oxidatively attacked) to cut the SWNT into smaller pieces. For example, incorporation of 1 boron atom for every 1000 carbon atoms in the original carbon vapor source can produce SWNTs with built-in weak spots for chemical attack.

Cutting may also be achieved by sonicating a suspension of SWNTs in a suitable medium such as liquid or molten hydrocarbons. One such preferred liquid is 1,2-dichloreothane. Any apparatus that produces suitable acoustic energy can be employed. One such apparatus is the Compact Cleaner (One Pint) manufactured by Cole-Parmer, Inc. This model operates at 40 KHz and has an output of 20 W. The sonication cutting process should be continued at a sufficient energy input and for a sufficient time to substantially reduce the lengths of tubes, ropes or cables present in the original suspension. Typically times of from about 10 minutes to about 24 hours can be employed depending on the nature of the starting material and degree of length reduction sought.

In another embodiment, sonication may be used to create defects along the rope lengths, either by the high temperatures and pressures created in bubble collapse (~5000° C. and ~1000 atm), or by the attack of free radicals produced by sonochemistry. These defects are attacked by S/N to cleanly cut the nanotube, exposing the tubes underneath for more damage and cutting. As the acid attacks the tube, the tube is completely cut open and slowly etches back, its open end being unable to reclose at the moderate temperature. In a preferred process, the nanotubes are bath sonocated while being stirred in 40–45° C. S/N for 24 hours. Next, the nanotubes are stirred with no sonication in the S/N for 2 hours at 40–45° C. This is to attack, with the S/N, all the defects created by the sonication without creating more defects. Then, the nanotubes are diluted four-fold with water, and then filtered using a 0.1 micron pore size VCTP filter. Next, the nanotubes are filtered and washed with a 10 mM NaOH solution on the VCTP filter. The nanotubes are polished by stirring them for 30 minutes at 70° C. in a S/N solution. The polished nanotubes are diluted four-fold with water, filtered using the 0.1 micron pore size VCTP filters, then filtered and washed with 10 mM NaOH on a 0.1 micron pore size VCTP filter, and then stored in water.

Oxidative etching e.g., with highly concentrated nitric acid, can also be employed to effect cutting of SWNTs into shorter lengths. For example, refluxing SWNT material in concentrated $HNO_3$ for periods of several hours to 1 or 2 days will result in significantly shorter SWNTs. The rate of cutting by this mechanism is dependent on the degree of helicity of the tubes. This fact may be utilized to facilitate separation of tubes by type, i.e., (n,n) from (m,n).

Length distribution shortens systematically with exposure time to the acid. For example, in a 3/1 concentrated sulfuric/nitric acid at 70° C. the average cut nanotube shortens at a rate of approximately 100 nm $hr^{-1}$. In a 4/1 sulfuric acid/30% aqueous hydrogen peroxide ("piranha") mixture at 70° C., the shortening rate is approximately 200 nm $hr^{-1}$. The etching rate is sensitive to the chrial index of the nanotubes (n,m), with all "arm-chair" tubes (m=x) having a distinct chemistry from the "zig-zag" tubes (m=0), and to a lesser extend with tubes of intermediate helical angle (n≠m).

The cleaned nanotube material may be cut into 50–500 nm lengths, preferably 100–300 nm lengths, by this process. The resulting pieces may form a colloidal suspension in water when mixed with a surfactant such as Triton X-100™ (Aldrich, Milwaukee, Wis.). These sable suspensions permit a variety of manipulations such as sorting by length using field flow fractionation, and electrodeposition on graphite followed by AFM imaging.

In another embodiment, SWNTs can be cut using electron beam cutting apparatus in the known manner.

Combination of the foregoing cutting techniques can also be employed.

Homogeneous populations of single-walled nanotubes may be prepared by fractionating heterogeneous nanotube populations after annealing. The annealed nanotubes may be disbursed in an aqueous detergent solution or an organic solvent for the fractionation. Preferably the tubes will be disbursed by sonication in benzene, toluene, xylene or molten naphthalene. The primary function of this procedure is to separate nanotubes that are held together in the form of ropes or mats by van der Waals forces. Following separation into individual nanotubes, the nanotubes may be fractionated by size by using fractionation procedures which are well known, such as procedures for fractionating DNA or polymer fractionation procedures. Fractionation also can be performed on tubes before annealing, particularly if the open ends have substituents (carboxy, hydroxy, etc.), that facilitate the fractionation either by size or by type. Alternatively, the closed tubes can be opened and derivatized to provide such substituents. Closed tubes can also be derivatized to facilitate fractionation, for example, by adding solubilizing moieties to the end caps.

Electrophoresis is one such technique well suited to fractionation of SWNT molecules since they can easily be negatively charged. It is also possible to take advantage of the different polarization and electrical properties of SWNTs having different structure types (e.g., arm chair and zig-zag) to separate the nanotubes by type. Separation by type can also be facilitated by derivatizing the mixture of molecules with a moiety that preferentially bonds to one type of structure.

In a typical example, a 100 micron thick mat of black bucky paper, made of nanotubes purified by refluxing in nitric acid for 48 hours was exposed for 100 minutes to a 2 GeV beam of gold ($Au^{+33}$) ions in the Texas A&M Superconducting Cyclotron Facility (net flux of up to $10^{12}$ ions per $cm^2$). The irradiated paper was baked in a vacuum at 1200° C. for 1 hr to seal off the tubes at the "bullet holes," and then dispersed in toluene while sonicating. The resultant tubular molecules were examined via SEM, AFM and TEM.

The procedures described herein produce tubular molecules that are single-wall nanotubes in which the cylindrical portion is formed from a substantially defect-free sheet of graphene (carbon in the form of attached hexagons) rolled up and joined at the two edges parallel to its long axis. The nanotube can have a fullerene cap (e.g., hemispheric) at one end of the cylinder and a similar fullerene cap at the other end. One or both ends can also be open. Prepared as described herein, these SWNT molecules are substantially free of amorphous carbon. These purified nanotubes are effectively a whole new class of tubular molecules.

In general the length, diameter and helicity of these molecules can be controlled to any desired value. Preferred lengths are up to $10^6$ hexagons; preferred diameters are about 5 to 50 hexagon circumference; and the preferred helical angle is 0° to 30°.

Preferably, the tubular molecules are produced by cutting and annealing nanotubes of predominately arm-chair (n,n) configuration, which may be obtained by purifying material produced according to the methods discussed above. These (n,n) carbon molecules, purified as described herein, are the first truly "metallic molecules." These molecules are useful for making electrical connectors for devices such as integrated circuits or semiconductor chips used in computers because of the high electrical conductivity and small size of the carbon molecule. SWNT molecules are also useful as components of electrical devices where quantum effects dominate at room temperatures, for example, resonant tunneling diodes. The metallic carbon molecules are useful as antennas at optical frequencies, and as probes for scanning probe microscopy such as are used in scanning tunneling microscopes (STM) and atomic force microscopes (AFM). The semiconducting SWNT structures, an (m, n) tube wherein m≠n may be used, with appropriate doping, as nanoscale semiconductor devices such as transistors.

The tubular carbon molecules of this invention may also be used in RF shielding applications, e.g., to make microwave absorbing materials.

Single-walled nanotube molecules may serve as catalysts in any of the reactions known to be catalyzed as fullerenes, with the added benefits that the linear geometry of the molecule provides. The carbon nanotubes are also useful as supports for catalysts used in industrial and chemical processes such as hydrogenation, reforming and cracking catalysts. Materials including the SWNT molecules can also be used as hydrogen storage devices in battery and fuel cell devices.

The tubular carbon molecules produced according to this invention can be chemically derivatized at their ends (which may be made either open or closed with a hemi-fullerene dome). Derivatization at the fullerene cap structures is facilitated by the well-known reactivity of these structures. See, "The Chemistry of Fullerenes" R. Taylor ed., Vol. 4 of the advanced Series in Fullerenes, World Scientific Publishers, Singapore, 1995; A. Hirsch, "The Chemistry of the Fullerenes," Thieme, 1994. Alternatively, the fullerene caps of the single-walled nanotubes may be removed at one or both ends of the tubes by short exposure to oxidizing conditions (e.g., with nitric acid or $O_2/CO_2$) sufficient to open the tubes but not etch them back too far, and the resulting open tube ends maybe derivatized using known reaction schemes for the reactive sites at the graphene sheet edge.

In general, the structure of such molecules can be shown as follows:

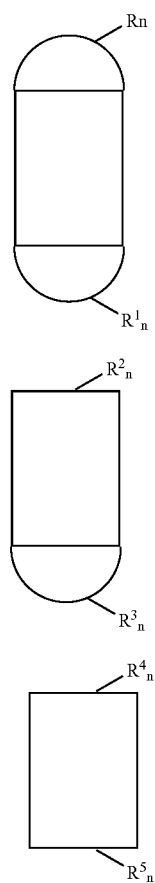

where

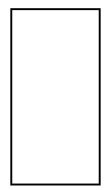

is a substantially defect-free cylindrical graphene sheet (which optionally can be doped with non-carbon atoms) having from about $10^2$ to about $10^6$ carbon atoms, and having a length of from about 5 to about 1000 nm, preferably about 5 to about 500 nm;

is a fullerene cap that fits perfectly on the cylindrical graphene sheet, has at least six pentagons and the remainder hexagons and typically has at least about 30 carbon atoms;

n is a number from 0 to 30, preferably 0 to 12; and

R, $R^1$, $R^2$, $R^3$, $R^4$, and $R^5$ each may be independently selected from the group consisting of hydrogen; alkyl, acyl, aryl, aralkyl, halogen; substituted or unsubstituted thiol; unsubstituted or substituted amino; hydroxy, and OR' wherein R' is selected from the group consisting of hydrogen, alkyl, acyl, aryl aralkyl, unsubstituted or substituted amino; substituted or unsubstituted thiol; and halogen; and a linear or cyclic carbon chain optionally interrupted with one or more heteroatom, and optionally substituted with one or more =O, or =S, hydroxy, an aminoalkyl group, an amino acid, or a peptide of 2–8 amino acids.

The following definitions are used herein.

The term "alkyl" as employed herein includes both straight and branched chain radicals, for example methyl, ethyl, propyl, isopropyl, butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, the various branched chain isomers thereof. The chain may be linear or cyclic, saturated or unsaturated, containing, for example, double and triple bonds. The alkyl chain may be interrupted or substituted with, for example, one or more halogen, oxygen, hydroxy, silyl, amino, or other acceptable substituents.

The term "acyl" as used herein refers to carbonyl groups of the formula —COR wherein R may be any suitable substituent such as, for example, alkyl, aryl, aralkyl, halogen; substituted or unsubstituted thiol; unsubstituted or substituted amino, unsubstituted or substituted oxygen, hydroxy, or hydrogen.

The term "aryl" as employed herein refers to monocyclic, bicyclic or tricyclic aromatic groups containing from 6 to 14 carbons in the ring portion, such as phenyl, naphthyl, substituted phenyl, or substituted naphthyl, wherein the substituent on either the phenyl or naphthyl may be for example $C_{1-4}$ alkyl, halogen, $C_{1-4}$ alkoxy, hydroxy or nitro.

The term "aralkyl" as used herein refers to alkyl groups as discussed above having an aryl substituent, such as benzyl, p-nitrobenzyl, phenylethyl, diphenylmethyl, and triphenylmethyl.

The term "aromatic or non-aromatic ring" as used herein includes 5–8 membered aromatic and non-aromatic rings uninterrupted or interrupted with one or more heteroatom, for example O, S, SO, $SO_2$, and N, or the ring may be unsubstituted or substituted with, for example, halogen, alkyl, acyl, hydroxy, aryl, and amino, said heteroatom and substituent may also be substituted with, for example, alkyl, acyl, aryl, or aralkyl.

The term "linear or cyclic" when used herein includes, for example, a linear chain which may optionally be interrupted by an aromatic or non-aromatic ring. Cyclic chain includes, for example, an aromatic or non-aromatic ring which may be connected to, for example, a carbon chain which either precedes or follows the ring.

The term "substituted amino" as used herein refers to an amino which may be substituted with one or more substituent, for example, alkyl, acyl, aryl, aralkyl, hydroxy, and hydrogen.

The term "substituted thiol" as used herein refers to a thiol which may be substituted with one or more substituent, for example, alkyl, acyl, aryl, aralkyl, hydroxy, and hydrogen.

Typically, open ends may contain up to about 20 substituents and closed ends may contain up to about 30 substituents. It is preferred, due to stearic hindrance, to employ up to about 12 substituents per end.

In addition to the above described external derivatization, the SWNT molecules of the present invention can be modified endohedrally, i.e., by including one or more metal atoms inside the structure, as is known in the endohedral fullerene art. It is also possible to "load" the SWNT molecule with one or more smaller molecules that do not bond to the structures, e.g., $C_{60}$, to permit molecular switching as the $C_{60}$ bucky ball shuttles back and forth inside the SWNT molecule under the influence of external fields or forces.

To produce endohedral tubular carbon molecules, the internal species (e.g., metal atom, bucky ball molecules) can either be introduced during the SWNT formation process or added after preparation of the tubular molecules. Incorporation of metals into the carbon source that is evaporated to form the SWNT material is accomplished in the manner described in the prior art for making endohedral metallofullerenes. Bucky balls, i.e., spheroidal fullerene molecules, are preferably loaded into the tubular carbon molecules of this invention by removing one or both end caps of the tubes employing oxidation etching described above, and adding an excess of bucky ball molecules (e.g., $C_{60}$, $C_{70}$) by heating the mixture (e.g., from about 500 to about 600° C.) in the presence of $C_{60}$ or $C_{70}$ containing vapor for an equilibration period (e.g., from about 12 to about 36 hours). A significant proportion (e.g., from a few tenths of a percent up to about 50 percent or more) of the tubes will capture a bucky ball molecule during this treatment. By selecting the relative geometry of the tube and ball this process can be facilitated. For example, $C_{60}$ and $C_{70}$ fit very nicely in a tubular carbon molecule cut from a (10,10) SWNT (I.D.≅1 nm). After the loading step, the tubes containing bucky ball molecules can be closed (annealed shut) by heating under vacuum to about 1100° C. Bucky ball encapsulation can be confirmed by microscopic examination, e.g., by TEM.

Endohedrally loaded tubular carbon molecules can then be separated from empty tubes and any remaining loading materials by taking advantage of the new properties introduced into the loaded tubular molecules, for example, where the metal atom imparts magnetic or paramagnetic properties to the tubes, or the bucky ball imparts extra mass to the tubes. Separation and purification methods based on these properties and others will be readily apparent to those skilled in the art.

Fullerene molecules like $C_{60}$ or $C_{70}$ will remain inside the properly selected tubular molecule (e.g., one based on (10,10) SWNTs) because from an electronic standpoint (e.g., by van der Waals interaction) the tube provides an environment with a more stable energy configuration than that available outside the tube.

Molecular Arrays of Single-Wall Carbon Nanotubes

Figure 4:
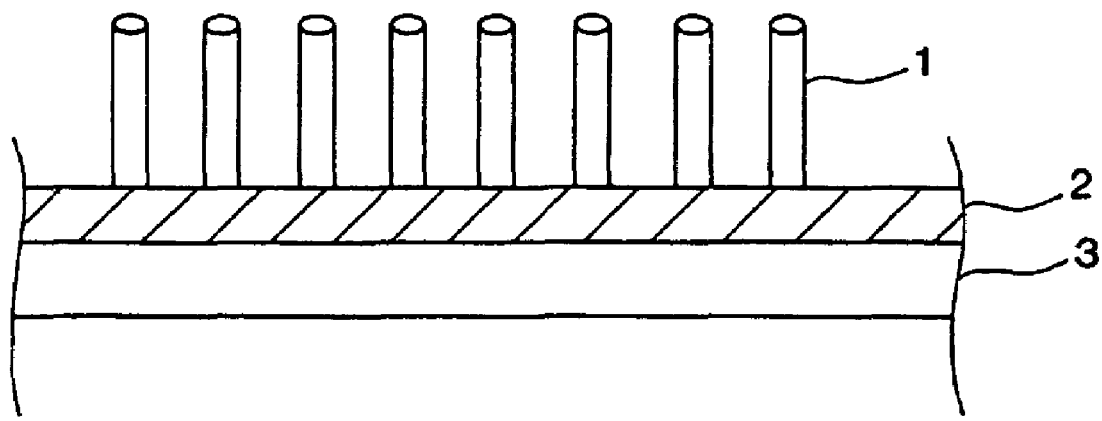
FIG. 4 is a schematic representation of a portion of an homogeneous SWNT molecular array according to the present invention.

An application of particular interest for a homogeneous population of SWNT molecules is production of a substantially two-dimensional array made up of single-walled nanotubes aggregating (e.g., by van der Waals forces) in substantially parallel orientation to form a monolayer extending in directions substantially perpendicular to the orientation of the individual nanotubes. Such monolayer arrays can be formed by conventional techniques employing "self-assembled monolayers" (SAM) or Langmiur-Blodgett films, see Hirch, pp. 75–76. Such a molecular array is illustrated schematically in FIG. 4. In this figure, nanotubes 1 are bound to a substrate 2 having a reactive coating 3 (e.g., gold).

Typically, SAMs are created on a substrate which can be a metal (such as gold, mercury or ITO (indium-tin-oxide)). The molecules of interest, here the SWNT molecules, are linked (usually covalently) to the substrate through a linker moiety such as —S—, —S—$(CH_2)_n$—NH—, —$SiO_3$ $(CH_2)_3$NH— or the like. The linker moiety may be bound first to the substrate layer or first to the SWNT molecule (at an open or closed end) to provide for reactive self-assembly. Langmiur-Blodgett films are formed at the interface between two phases, e.g., a hydrocarbon (e.g., benzene or toluene) and water. Orientation in the film is achieved by employing molecules or linkers that have hydrophilic and lipophilic moieties at opposite ends.

Figure 5:
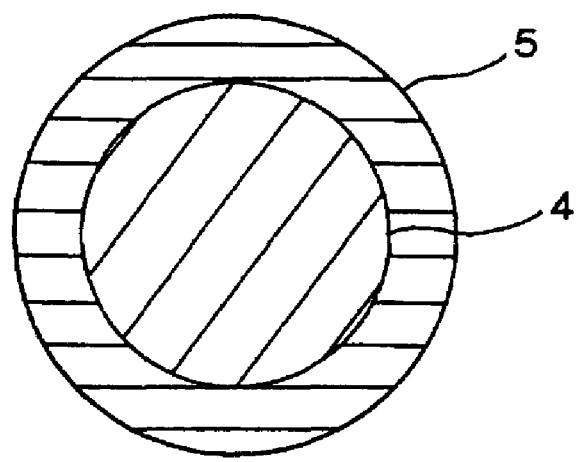
FIG. 5 is a schematic representation of an heterogeneous SWNT molecular array according to the present invention.

The configuration of the SWNT molecular array may be homogenous or heterogeneous depending on the use to which it will be put. Using SWNT molecules of the same type and structure provides a homogeneous array of the type shown in FIG. 4. By using different SWNT molecules, either a random or ordered heterogeneous structure can be produced. An example of an ordered heterogeneous array is shown in FIG. 5 where tubes 4 are (n,n), i.e., metallic in structure and tubes 5 are (m,n), i.e., insulating. This configuration can be achieved by employing successive reactions after removal of previously masked areas of the reactive substrate.

Arrays containing from $10^3$ up to $10^{10}$ and more SWNT molecules in substantially parallel relationships can be used per se as a nanoporous conductive molecular membrane, e.g., for use in batteries such as the lithium ion battery. This membrane can also be used (with or without attachment of a photoactive molecule such as cis-(bisthiacyanato bis (4,4'-dicarboxy-2-2'-bipyridine Ru (II)) to produce a highly efficient photo cell of the type shown in U.S. Pat. No. 5,084,365.

One preferred use of the SWNT molecular arrays of the present invention is to provide a "seed" or template for growth of macroscopic carbon fiber of single-wall carbon nanotubes as described below. The use of a macroscopic cross section in this template is particularly useful for keeping the live (open) end of the nanotubes exposed to feedstock during growth of the fiber. The template array of this invention can be used as formed on the original substrate, cleaved from its original substrate and used with no substrate (the van der Waals forces will hold it together) or transferred to a second substrate more suitable for the conditions of fiber growth.

Where the SWNT molecular array is to be used as a seed or template for growing macroscopic carbon fiber as described below, the array need not be formed as a substantially two-dimensional array. Any form of array that presents at its upper surface a two-dimensional array can be employed. In the preferred embodiment, the template molecular array is a manipulatable length of macroscopic carbon fiber as produced below.

Another method for forming a suitable template molecular array involves employing purified bucky paper as the starting material. Upon oxidative treatment of the bucky paper surface (e.g., with $O_2/CO_2$ at about 500° C.), the sides as well as ends of SWNTs are attacked and many tube and/or rope ends protrude up from the surface of the paper. Disposing the resulting bucky paper in an electric field (e.g., 100 V/cm$^2$ results in the protruding tubes and or ropes aligning in a direction substantially perpendicular to the paper surface. These tubes tend to coalesce due to van der Waals forces to form a molecular array.

Alternatively, a molecular array of SWNTs can be made by "combing" the purified bucky paper starting material. "Combing" involves the use of a sharp microscopic tip such as the silicon pyramid on the cantilever of a scanning force microscope ("SFM") to align the nanotubes. Specifically, combing is the process whereby the tip of an SFM is systematically dipped into, dragged through, and raised up from a section of bucky paper. An entire segment of bucky paper could be combed, for example, by: (i) systematically dipping, dragging, raising and moving forward an SFM tip along a section of the bucky paper; (ii) repeating the sequence in (i) until completion of a row; and (iii) repositioning the tip along another row and repeating (i) and (ii). In a preferred method of combing, the section of bucky paper of interest is combed through as in steps (i)–(iii) above at a certain depth and then the entire process is repeated at another depth. For example, a lithography script can be written and run which could draw twenty lines with 0.5 μm spacing in a 10×10 μm square of bucky paper. The script can be run seven times, changing the depth from zero to three μm in 0.5 μm increments.

Large arrays (i.e., >10$^6$ tubes) also can be assembled using nanoprobes by combining smaller arrays or by folding linear collections of tubes and/or ropes over (i.e., one folding of a collection of n tubes results in a bundle with 2 n tubes).

Macroscopic arrays can also be formed by providing a nanoscale microwell structure (e.g., a $SiO_2$ coated silicon wafer with >10$^6$ rectangular 10 nm wide, 10 nm deep wells formed in the surface by electron beam lithographic techniques). A suitable catalyst metal cluster (or precursor) is deposited in each well and a carbon-containing feedstock is directed towards the array under growth conditions described below to initiate growth of SWNT fibers from the wells. Catalysts in the form of preformed nanoparticles (i.e., a few nanometers in diameter) as described in Dai et al., "Single-Wall Nanotubes Produced by Metal-Catalyzed Disproportionation of Carbon Monoxide," Chem. Phys. Lett. 260 (1996), 471–475 ("Dai") can also be used in the wells. An electric field can be applied to orient the fibers in a direction substantially perpendicular to the wafer surface.

Growth of Continuous Carbon Fiber from SWNT Molecular Arrays

The present invention provides methods for growing continuous carbon fiber from SWNT molecular arrays to any desired length. The carbon fiber which comprises an aggregation of substantially parallel carbon nanotubes may be produced according to this invention by growth (elongation) of a suitable seed molecular array. The preferred SWNT molecular array is produced as described above from a SAM of SWNT molecules of substantially uniform length. As used herein, the term "macroscopic carbon fiber" refers to fibers having a diameter large enough to be physically manipulated, typically greater than about 1 micron and preferably greater than about 10 microns.

The first step in the growth process is to open the growth end of the SWNTs in the molecular array. This can be accomplished as described above with an oxidative treatment. Next, a transition metal catalyst is added to the open-ended seed array. The transition metal catalyst can be any transition metal that will cause conversion of the carbon-containing feedstock described below into highly mobile carbon radicals that can rearrange at the growing edge to the favored hexagon structure. Suitable materials include transition metals, and particularly the Group VI or VIII transition metals, i.e., chromium (Cr), molybdenum (Mo), tungsten (W), iron (Fe), cobalt (Co), nickel (NI), ruthenium (Ru), rhodium (Rh), palladium (Pd), osmium (Os), iridium (Ir) and platinum (Pt). Metals from the lanthanide and actinide series may also be used. Preferred are Fe, Ni, Co and mixtures thereof. Most preferred is a 50/50 mixture (by weight) of Ni and Co.

The catalyst should be present on the open SWNT ends as a metal cluster containing from about 10 metal atoms up to about 200 metal atoms (depending on the SWNT molecule diameter). Typically, the reaction proceeds most efficiently if the catalyst metal cluster sits on top of the open tube and does not bridge over more than one or two tubes. Preferred are metal clusters having a cross-section equal to from about 0.5 to about 1.0 times the tube diameter (e.g., about 0.7 to 1.5 nm).

In the preferred process, the catalyst is formed, in situ, on the open tube ends of the molecular array by a vacuum deposition process. Any suitable equipment, such as that used in Molecular Beam Epitaxy (MBE) deposition, can be employed. One such device is a Küdsen Effusion Source Evaporator. It is also possible to effect sufficient deposition of metal by simply heating a wire in the vicinity of the tube ends (e.g., a Ni/CO wire or separate Ni and CO wires) to a temperature below the melting point at which enough atoms evaporate from one wire surface (e.g., from about 900 to about 1300° C.). The deposition is preferably carried out in a vacuum with prior outgassing. Vacuums of about 10$^{-6}$ to 10$^{-8}$ Torr are suitable. The evaporation temperature should be high enough to evaporate the metal catalyst. Typically, temperatures in the range of 1500 to 2000° C. are suitable for the Ni/Co catalyst of the preferred embodiment. In the evaporation process, the metal is typically deposited as monolayers of metal atoms. From about 1–10 monolayers will generally give the required amount of catalyst. The deposition of transition metal clusters on the open tube tops can also be accomplished by laser vaporization of metal targets in a catalyst deposition zone.

The actual catalyst metal cluster formation at the open tube ends is carried out by heating the tube ends to a temperature high enough to provide sufficient species mobility to permit the metal atoms to find the open ends and assemble into clusters, but not so high as to effect closure of the tube ends. Typically, temperatures of up to about 500° C. are suitable. Temperatures in the range of about 400–500° C. are preferred for the Ni/Co catalysts system of one preferred embodiment.

In a preferred embodiment, the catalyst metal cluster is deposited on the open nanotube end by a docking process that insures optimum location for the subsequent growth reaction. In this process, the metal atoms are supplied as described above, but the conditions are modified to provide reductive conditions, e.g., at 800° C., 10 millitorr of $H_2$ for 1 to 10 minutes. There conditions cause the metal atom clusters to migrate through the system in search of a reactive site. During the reductive heating the catalyst material will ultimately find and settle on the open tube ends and begin to etch back the tube. The reduction period should be long enough for the catalyst particles to find and begin to etch back the nanotubes, but not so long as to substantially etch away the tubes. By changing to the above-described growth conditions, the etch-back process is reversed. At this point, the catalyst particles are optimally located with respect to the tube ends since they already were catalytically active at those sites (albeit in the reverse process).

The catalyst can also be supplied in the form of catalyst precursors which convert to active form under growth conditions such as oxides, other salts or ligand stabilized metal complexes. As an example, transition metal complexes with alkylamines (primary, secondary or tertiary) can be employed. Similar alkylamine complexes of transition metal oxides also can be employed.

In an alternative embodiment, the catalyst may be supplied as preformed nanoparticles (i.e., a few nanometers in diameter) as described in Dai.

In the next step of the process of the present invention, the SWNT molecular array with catalyst deposited on the open tube ends is subjected to tube growth (extension) conditions. This may be in the same apparatus in which the catalyst is deposited or a different apparatus. The apparatus for carrying out this process will require, at a minimum, a source of carbon-containing feedstock and a means for maintaining the growing end of the continuous fiber at a growth and annealing temperature where carbon from the vapor can be added to the growing ends of the individual nanotubes under the direction of the transition metal catalyst. Typically, the apparatus will also have means for continuously collecting the carbon fiber. The process will be described for illustration purposes with reference to the apparatus shown in FIGS. 6 and 7.

The carbon supply necessary to grow the SWNT molecular array into a continuous fiber is supplied to the reactor 10, in gaseous form through inlet 11. The gas stream should be directed towards the front surface of the growing array 12. The gaseous carbon-containing feedstock can be any hydrocarbon or mixture of hydrocarbons including alkyls, acyls, aryls, aralkyls and the like, as defined above. Preferred are hydrocarbons having from about 1 to 7 carbon atoms. Particularly preferred are methane, ethane, ethylene, actylene, acetone, propane, propylene and the like. Most preferred is ethylene. Carbon monoxide may also be used and in some reactions is preferred. Use of CO feedstock with preformed Mo-based nano-catalysts is believed to follow a different reaction mechanism than that proposed for in situ-formed catalyst clusters. See Dai.

The feedstock concentration is preferably as chosen to maximize the rate of reaction, with higher concentrations of hydrocarbon giving faster growth rates. In general, the partial pressure of the feedstock material (e.g., ethylene) can be in the 0.001 to 1000.0 Torr range, with values in the range of about 1.0 to 10 Torr being preferred. The growth rate is also a function of the temperature of the growing array tip as described below, and as a result growth temperatures and feed stock concentration can be balanced to provide the desired growth rates.

It is not necessary or preferred to preheat the carbon feedstock gas, since unwanted pyrolysis at the reactor walls can be minimized thereby. The only heat supplied for the growth reaction should be focused at the growing tip of the fiber 12. The rest of the fiber and the reaction apparatus can be kept at room temperature. Heat can be supplied in a localized fashion by any suitable means. For small fibers (<1 mm in diameter), a laser 13 focused at the growing end is preferred (e.g., a C—W laser such as an argon ion laser beam at 514 nm). For larger fibers, heat can be supplied by microwave energy or R—F energy, again localized at the growing fiber tip. Any other form of concentrated electromagnetic energy that can be focused on the growing tip can be employed (e.g., solar energy). Care should be taken, however, to avoid electromagnetic radiation that will be absorbed to any appreciable extent by the feedstock gas.

The SWNT molecular array tip should be heated to a temperature sufficient to cause growth and efficient annealing of defects in the growing fiber, thus forming a growth and annealing zone at the tip. In general, the upper limit of this temperature is governed by the need to avoid pyrolysis of the feedstock and fouling of the reactor or evaporation of the deposited metal catalyst. For most feedstocks, this is below about 1300° C. The lower end of the acceptable temperature range is typically about 500° C., depending on the feedstock and catalyst efficiency. Preferred are temperatures in the range of about 500° C. to about 1200° C. More preferred are temperatures in the range of from about 700° C. to about 1200° C. Temperatures in the range of about 900° C. to about 1100° C. are the most preferred, since at these temperatures the best annealing of defects occurs. The temperature at the growing end of the cable is preferably monitored by, and controlled in response to, an optical pyrometer 14, which measures the incandescence produced. While not preferred due to potential fouling problems, it is possible under some circumstances to employ an inert sweep gas such as argon or helium.

In general, pressure in the growth chamber can be in the range of 1 millitorr to about 1 atmosphere. The total pressure should be kept at 1 to 2 times the partial pressure of the carbon feedstock. A vacuum pump 15 may be provided as shown. It may be desirable to recycle the feedstock mixture to the growth chamber. As the fiber grows it can be withdrawn from the growth chamber 16 by a suitable transport mechanism such as drive roll 17 and idler roll 18. The growth chamber 16 is in direct communication with a vacuum feed lock zone 19.

The pressure in the growth chamber can be brought up to atmospheric, if necessary, in the vacuum feed lock by using a series of chambers 20. Each of these chambers is separated by a loose TEFLON O-ring seal 21 surrounding the moving fiber. Pumps 22 effect the differential pressure equalization. A take-up roll 23 continuously collects the room temperature carbon fiber cable. Product output of this process can be in the range of $10^{-3}$ to $10^1$ feet per minute or more. By this process, it is possible to produce tons per day of continuous carbon fiber made up of SWNT molecules.

Growth of the fiber can be terminated at any stage (either to facilitate manufacture of a fiber of a particular length or when too many defects occur). To restart growth, the end may be cleaned (i.e., reopened) by oxidative etching (chemically or electrochemically). The catalyst particles can then be reformed on the open tube ends, and growth continued.

The molecular array (template) may be removed from the fiber before or after growth by macroscopic physical separation means, for example by cutting the fiber with scissors to the desired length. Any section from the fiber may be used as the template to initiate production of similar fibers.

Figure 8:
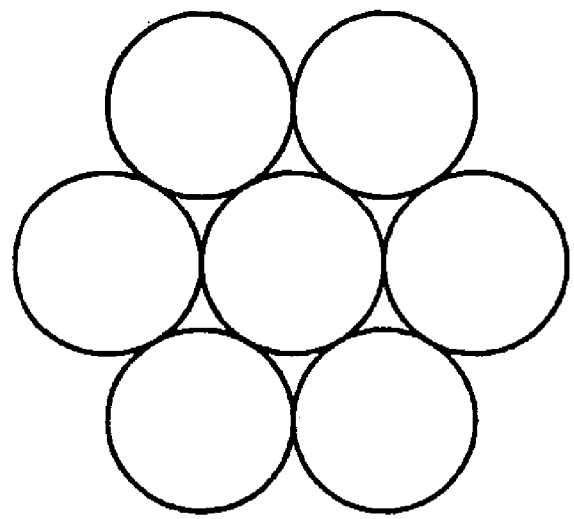
FIG. 8 is a composite array according to the present invention.
Figure 9:
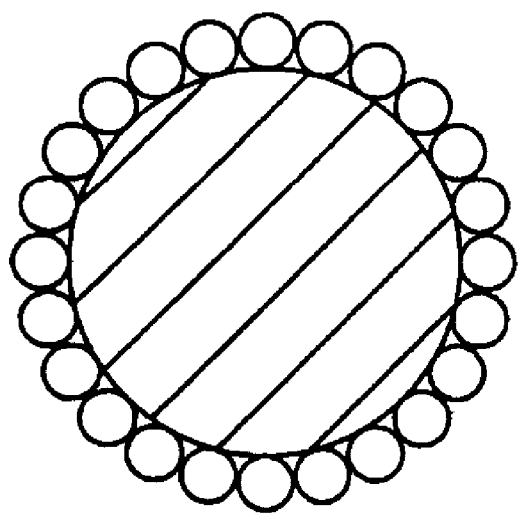
FIG. 9 is a composite array according to the present invention.

The continuous carbon fiber of the present invention can also be grown from more than one separately prepared molecular array or template. The multiple arrays can be the same or different with respect to the SWNT type or geometric arrangement in the array. Large cable-like structures with enhanced tensile properties can be grown from a number of smaller separate arrays as shown in FIG. 8. In addition to the masking and coating techniques described above, it is possible to prepare a composite structure, for example, by surrounding a central core array of metallic SWNTs with a series of smaller circular non-metallic SWNT arrays arranged in a ring around the core array as shown in FIG. 9.

Not all the structures contemplated by this invention need be round or even symmetrical in two-dimensional cross section. It is even possible to align multiple molecular array seed templates in a manner as to induce nonparallel growth of SWNTs in some portions of the composite fiber, thus producing a twisted, helical rope, for example. It is also possible to catalytically grow macroscopic carbon fiber in the presence of an electric field to aid in alignment of the SWNTs in the fibers, as described above in connection with the formation of template arrays.

Random Growth of Carbon Fibers From SWNTs

While the continuous growth of ordered bundles of SWNTs described above is desirable for many applications, it is also possible to produce useful compositions comprising a randomly oriented mass of SWNTs, which can include individual tubes, ropes and/or cables. The random growth process has the ability to produce large quantities, i.e., tons per day, of SWNT material.

In general the random growth method comprises providing a plurality of SWNT seed molecules that are supplied with a suitable transition metal catalyst as described above, and subjecting the seed molecules to SWNT growth conditions that result in elongation of the seed molecule by several orders of magnitude, e.g., $10^2$ to $10^{10}$ or more times its original length.

The seed SWNT molecules can be produced as described above, preferably in relatively short lengths, e.g., by cutting a continuous fiber or purified bucky paper. In a preferred embodiment, the seed molecules can be obtained after one initial run from the SWNT felt produced by this random growth process (e.g., by cutting). The lengths do not need to be uniform and generally can range from about 5 nm to 10 μm in length.

These SWNT seed molecules may be formed on macroscale or nanoscale supports that do not participate in the growth reaction. In another embodiment, SWNTs or SWNT structures can be employed as the support material/seed. For example, the self assembling techniques described below can be used to form a three-dimensional SWNT nanostructure. Nanoscale powders produced by these technique have the advantage that the support material can participate in the random growth process.

The supported or unsupported SWNT seed materials can be combined with a suitable growth catalyst as described above, by opening SWNT molecule ends and depositing a metal atom cluster. Alternatively, the growth catalyst can be provided to the open end or ends of the seed molecules by evaporating a suspension of the seeds in a suitable liquid containing a soluble or suspended catalyst precursor. For example, when the liquid is water, soluble metal salts such as Fe $(NO_3)_3$, Ni $(NO_3)_2$ or CO $(NO_3)_2$ and the like may be employed as catalyst precursors. In order to insure that the catalyst material is properly positioned on the open end(s) of the SWNT seed molecules, it may be necessary in some circumstances to derivitize the SWNT ends with a moiety that binds the catalyst nanoparticle or more preferably a ligand-stabilized catalyst nanoparticle.

In the first step of the random growth process the suspension of seed particles containing attached catalysts or associated with dissolved catalyst precursors is injected into an evaporation zone where the mixture contacts a sweep gas flow and is heated to a temperature in the range of 250–500° C. to flash evaporate the liquid and provide an entrained reactive nanoparticle (i.e., seed/catalyst). Optionally this entrained particle stream is subjected to a reduction step to further activate the catalyst (e.g., heating from 300–500° C. in $H_2$). A carbonaceous feedstock gas, of the type employed in the continuous growth method described above, is then introduced into the sweep gas/active nanoparticle stream and the mixture is carried by the sweep gas into and through a growth zone.

The reaction conditions for the growth zone are as described above, i.e., 500–1000° C. and a total pressure of about one atmosphere. The partial pressure of the feedstock gas e.g., ethylene, CO) can be in the range of about 1 to 100 Torr. The reaction is preferably carried out in a tubular reactor through which a sweep gas (e.g., argon) flows.

The growth zone may be maintained at the appropriate growth temperature by 1) preheating the feedstock gas, 2) preheating the sweep gas, 3) externally heating the growth zone, 4) applying localized heating in the growth zone, e.g., by laser or induction coil, or any combination of the foregoing.

Downstream recovery of the product produced by this process can be effected by known means such as filtration, centrifugation and the like. Purification may be accomplished as described above. Felts made by this random growth process can be used to make composites, e.g., with polymers, epoxies, metals, carbon (i.e., carbon/carbon materials) and high $-T_c$ superconductors for flux pinning.

Macroscopic Carbon Fiber

The macroscopic carbon fiber produced as described herein is made up of an aggregate of large number of single-wall nanotubes preferably in generally parallel orientation. While individual nanotubes may deviate from parallel orientation relative to any other individual nanotube, particularly for very short distances, over macroscopic distances the average orientation of all of the nanotubes preferably will be generally parallel to that of all other nanotubes in the assembly (macroscopic distances as described herein are generally considered to be greater than 1 micron). In one preferred form, the SWNTs will be arranged in a regular triangular lattice, i.e., in a closest packing relationship.

The carbon fiber of this invention is made up of individual tubular molecules and may be in whole or in part either crystalline or amorphous in structure. The degree of order in the fiber will depend both on the geometric relationship of the tubes in the molecular array and the growth and annealing conditions. The fiber may be subjected to orientation or other post-formation treatments before or after collection.

The fiber produced by this process may, for example, be further spun or braided into larger yarns or cables. It is also contemplated that as produced fiber will be large enough in diameter for many applications.

Generally, the macroscopic carbon fiber produced according to this invention consists of a sufficient number of substantially parallel single-wall nanotubes that it is large enough in diameter to be practically handled as an individual fiber and/or processed into larger continuous products. The macroscopic nature of the assembly of nanotubes is also important for end uses such as transmission of electric current over these nanotube cables. A macroscopic carbon fiber according to this invention preferably will contain at least $10^6$ single-wall carbon nanotubes, and more preferably at least $10^9$ single-wall carbon nanotubes. The number of assembled nanotubes is vastly larger than the number ($<10^3$) that spontaneously align during the formation of single-wall nanotube ropes in the condensing carbon vapor of a carbon arc or laser vaporization apparatus. For many applications the preferred diameter of the macroscopic carbon fiber of this invention will be in the range of from about 1 to about 10 microns. Some applications, e.g., power transmission cables, may require fiber diameters of up to a few centimeters. It is also possible to include dopants, e.g., metals, halogens, $FeCl_3$ and the like, physically entrapped between the tubes of the fiber.

The macroscopic carbon fiber of this invention will generally be at least 1 millimeter in length, with the exact length depending upon the particular application for which the fiber is used. For example, where the fiber is designed to substitute for conventional graphite carbon fiber for reinforcing, the length of the fiber according to this invention will be similar to the length of the convention carbon fibers. Where the macroscopic carbon fiber according to this invention is used for electrical conductance, the length of the fiber preferably corresponds to the distance over which electrical conductance is desired. Typically such distances may be from 1–100 microns or up to 1–10 millimeters or greater. Where conductance over macroscopic distances is desired, it is preferred that the macroscopic carbon fiber according to this invention have a length on the order of meters or greater.

One reason the continuous carbon fiber of the present invention has such improved physical properties is its structure as a high order laminate—as many as $10^9$ or more individual tubular molecules are laminated together. This structure provides much higher strength in bending, significantly higher resistance to failure by chemical corrosion, better wear, more elasticity and a completely different tensile failure mechanism from similar monolithic materials. The single-wall carbon nanotube fiber of this invention provides extremely high tensile strength at low weight (~100 times stronger than steel while having only one sixth the weight). This fiber has an electrical conductivity similar to copper. In addition the thermal conductivity along the fiber is approximately that of diamond. The carbon fiber of this invention also has high chemical resistance (better than spheroidal fullerenes such as $C^{60}$–$C^{70}$). In general the substantially defect-free continuous carbon fiber of this invention will exhibit improved properties over conventional carbon fibers because of its near perfect multi-hexagonal structure that extends over macroscopic distances.

In a particular embodiment, macroscopic carbon fiber according to this invention is grown from a molecular array comprising a SAM having a region substantially comprising single-wall nanotubes in armchair orientation, the region having a diameter of at least one micron and preferably at least 100 microns. By use of masks on the surface upon which the monolayer is assembled, the area containing single-walled nanotubes in armchair structure is completely surrounded on all sides by a concentric region of tubes having a chiral or zig-zag structure. Elongation from this template will produce a conducting core surrounded by a semi-conducting or insulating sheath, each layer made up of single molecules of essentially infinite length. In a similar manner, a co-axial transmission cable with several layers can be produced.

Applications of these carbon fibers include all those currently available for graphite fibers and high strength fibers such as membranes for batteries and fuel cells; chemical filters; catalysts supports; hydrogen storage (both as an absorbent material and for use in fabricating high pressure vessels); lithium ion batteries; and capacitor membranes. These fibers can also be used in electromechanical devices such as nanostrain gauges (sensitive to either nanotube bend or twist). Fibers of this invention can be used as product or spun into threads or formed into yarns or to fibers using known textile techniques.

The carbon fiber technology of this invention also facilitates a class of novel composites employing the hexaboronitride lattice. This material forms graphene-like sheets with the hexagons made of B and N atoms (e.g., $B_3$ $N_2$ or $C_2$ $BN_3$). It is possible to provide an outer coating to a growing carbon fiber by supplying a BN precursor (e.g., tri-chloroborazine, a mixture of $NH_3$ and $BCl_3$ or diborane) to the fiber which serves as a mandrel for the deposition of BN sheets. This outer BN layer can provide enhanced insulating properties to the metallic carbon fiber of the present invention. Outer layers of pyrolytic carbon polymers or polymer blends may also be employed to impart. By changing the feedstock in the above described process of this invention from a hydrocarbon to a BN precursor and back again it is possible to grow a fiber made up of individual tubes that alternate between regions of all carbon lattice and regions of BN lattice. In another embodiment of this invention, an all BN fiber can be grown by starting with a SWNT template array topped with a suitable catalyst and fed BN precursors. These graphene and BN systems can be mixed because of the very close match of size to the two hexagonal units of structure. In addition, they exhibit enhanced properties due to the close match of coefficients of thermal expansion and tensile properties. BN fibers can be used in composites as reinforcing and strengthening agents and many of the other uses described above for carbon fibers.

Device Technology Enabled by Products of this Invention

The unique properties of the tubular carbon molecules, molecular arrays and macroscopic carbon fibers of the present invention provide exciting new device fabrication opportunities.

1. Power Transmission Cable

Figure 10:
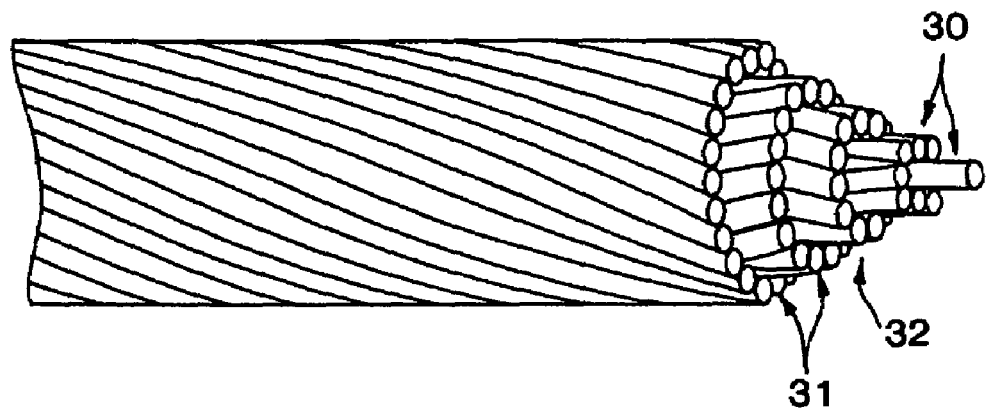
FIG. 10 is a power transmission cable according to the present invention.

Current power transmission-line designs generally employ aluminum conductors, often with steel strand cores for strength (i.e., the so-called ASCR conductor). The conductors have larger losses than copper conductors and generally are not shielded leading to corona discharge problems. The continuous carbon fibers made form large ($>10^6$) aggregations of SWNTs can be used to fabricate power transmission cables of unique designs and properties. One such design is shown in FIG. 10. This design is essentially a shielded coaxial cable capable of EHV (extra high voltage) power transmission, (i.e., >500 KV and preferably over $10^6$V) and having heretofore unattainable strength-to-weight properties and little or no corona discharge problems.

The illustrated design, which exemplifies the use of the SWNT-based carbon fiber conductors produced as described above (e.g., from n,n metallic SWNTs), consists of a central conductor 30 and a coaxial outer conductor 31, separated by an insulating layer 32. The central conductor carries the power transmission which the outer layer conductor is biased to ground. The central conductor can be a solid metallic carbon fiber. Alternatively, the central conductor can comprise a bundle of metallic carbon fiber strands which may be aggregated helically as is common in ACSR conductors.

The inner conductor can also comprise an annular tube surrounding an open core space in which the tube is a woven or braided fabric made from metallic carbon fibers as described above. The insulating layer can be any light weight insulating material. Among the preferred embodiments are strands or woven layers of BN fibers made as described above and the use of an annular air space (formed using insulating spacers).

The outer conductor layer is also preferably made from hexically wound strands of metallic carbon fiber as described above. This grounded layer essentially eliminates corona discharge problems or the need to take conventional steps to reduce these emissions.

The resulting coaxial structure possesses extremely high strength-to-weight properties and can be used to transmit greater than conventional power levels over greater distances with lower losses.

One of the above described power cable assemblies can be used to replace each of the conductors used for separate phases in the conventional power transmission system. It is also possible by fabricating a multilayer annular cable with alternating metallic carbon fiber conductors and insulating layers to provide a single power transmission-cable carrying three or more phases, thus greatly simplifying the installation and maintenance of power lines.

2. Solar Cell

A Grätzel cell of the type described in U.S. Pat. No. 5,084,365 (incorporated herein by reference in its entirety) can be fabricated with the nanocrystalline $TiO_2$ replaced by a monolayer molecular array of short carbon nanotube molecules as described above. The photoactive dye need not be employed since the light energy striking the tubes will be converted into an oscillating electronic current which travels along the tube length. The ability to provide a large charge separation (the length of the tubes in the array) creates a highly efficient cell. It is also contemplated by the present invention to use a photoactive dye (such as cis-[bisthiacyanato bis (4,4'-dicarboxy-2-2'-bipyridine Ru (II))] attached to the end of each nanotube in the array to further enhance the efficiency of the cell. In another embodiment of the present invention, the $TiO_2$ nanostructure described by Grätzel can serve as an underlying support for assembling an array of SWNT molecules. In this embodiment, SWNTs are attached directly to the $TiO_2$ (by absorptive forces) or first derivatized to provide a linking moiety and then bound to the $TiO_2$ surface. This structure can be used with or without a photoactive dye as described above.

3. Memory Device

The endohedrally loaded tubular carbon molecule described above can be used to form the bit structure in a nanoscale bistable non-volatile memory device. In one form, this bit structure comprises a closed tubular carbon molecule with an enclosed molecular entity that can be caused to move back and forth in the tube under the influences of external control. It is also possible to fill a short nanotube molecule with magnetic nanoparticles (e.g., Ni/Co) to form a nanobit useful in magnetic memory devices.

Figure 11:
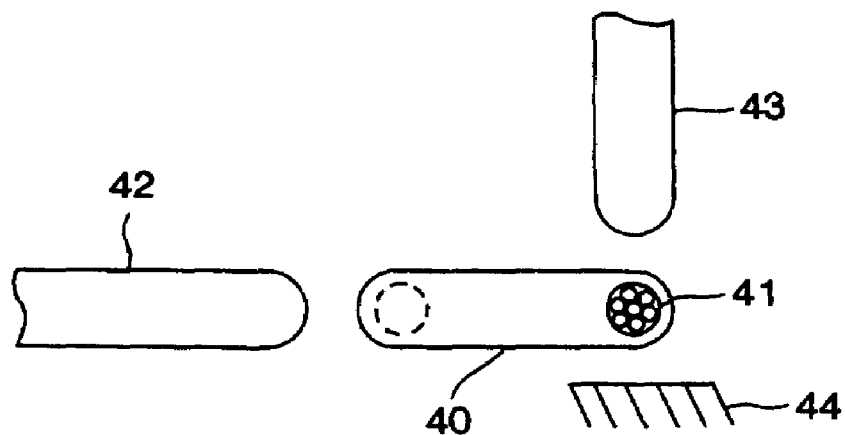
FIG. 11 is a schematic representation of a bistable, nonvolatile nanoscale memory device according to the present invention.

One preferred form of a bit structure is shown in FIG. 11. The tubular carbon molecule 40 in this bit should be one that exhibits a good fit mechanically with the movable internal moiety 41, i.e., not too small to impede its motion. The movable internal moiety should be chosen (1) to facilitate the read/write system employed with the bit and (2) to compliment the electronic structure of the tube.

Figure 12:
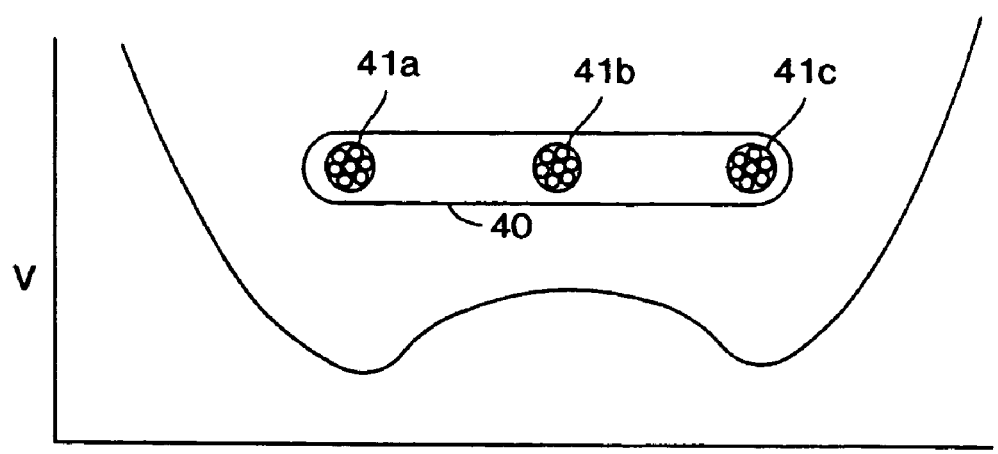
FIG. 12 is a graph showing the energy wells that correspond to each of the bistable states in the memory bit of FIG. 11.

One preferred arrangement of such a nanobit employs a short closed tubular carbon molecule (e.g., about 10–50 nm long) made from a (10,10) SWNT by the above-described process, and containing encapsulated therein a $C_{60}$ or $C_{70}$ spheroidal fullerene molecule. Optionally the $C_{60}$ or $C_{70}$ molecule (bucky ball) can be endohedrally or exohedrally doped. The $C_{60}$ bucky ball is almost a perfect fit in a (10,10) tube. More importantly, the electronic environment inside the tube is highly compatible with that of the bucky ball, particularly at each end, since here the inner curvature of the (10, 10) tube at the end cap matches the outer curvature of the bucky ball. This configuration results in optimum van der Waals interaction. As shown in FIG. 12, the energy threshold required to get one bucky ball out of the end cap (where it is in the most electronically stable configuration) serves to render the bit bistable.

One preferred read/write structure for use with the memory bit described above is shown in FIG. 11. Writing to the bit is accomplished by applying a polarized voltage pulse through a nanocircuit element 42 (preferably a SWNT molecule). A positive pulse will pull the bucky ball and a negative pulse will push the bucky ball. The bistable nature of the bit will result in the bucky ball staying in this end of the tube when the pulse is removed since that is where the energy is lowest. To read the bit, another nanocircuit element 43 (again preferable, a SWNT molecule) is biased with a $V_{READ}$. If the bucky ball is present in the detection end, it supplies the necessary energy levels for current to resonantly tunnel across the junction to the ground voltage 44 (in a fashion analogous to a resonant tunneling diode) resulting in a first stable state being read. If the bucky ball is not present in the detection end, the energy levels are shifted out of resonance and the current does not tunnel across the junction and a second stable state is read. Other forms of read/write structure (e.g., microactuators) can be employed as will be recognized by one skilled in the art.

A memory device can be constructed using either a two- or three-dimensional array of the elements shown in FIG. 12. Because the elements of the memory array are so small (e.g., ~5 nm×25 nm), extremely high bit densities can be achieved, i.e., >1.0 terabit/$cm^2$ (i.e., a bit separation of 7.5 nm). Because the bucky ball only has to move a few nanometers and its mass is so small, the write time of the described device is on the order of $10^{-10}$ seconds.

4. Lithium Ion Battery

The present invention also relates to a lithium ion secondary battery in which the anode material includes a molecular array of SWNTs made as described above (e.g., by SAM techniques). The anode material can comprise a large number (e.g., >$10^3$) short nanotube molecules bound to a substrate. Alternatively, the end of a macroscopic carbon fiber as described above can serve as the microporous anode surface.

Figure 13:
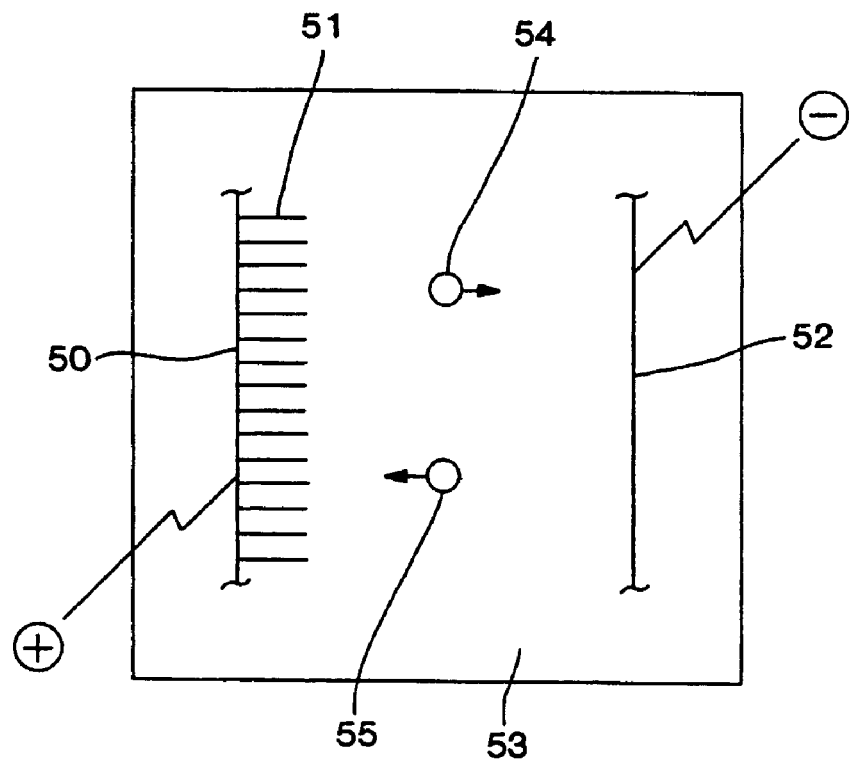
FIG. 13 is a schematic representation of a lithium ion secondary battery according to the present invention.

The tubular carbon molecules in this array may be open or closed. In either case, each tubular carbon molecule provides a structurally stable microporosity for the intercalation of lithium ions, i.e., into the open tubes or into triangular pores of an end cap. The resulting fullerene intercalation compound (FIC) can be used, for example, with an aprotic organic electrolyte containing lithium ions and a $LiCoO_2$ cathode to form an improved lithium ion secondary battery of the type described in Nishi, "The Development of Lithium Ion Secondary Batteries," 1996 IEEE symposium on VLSI Circuits and shown in FIG. 13. In this figure, the anode 50 comprises a large number of SWNTs 51 in an ordered molecular array. Cathode 52, electrolyte 53, lithium ions 54 and electrons 55 make up the remaining elements of the cell.

The use of the molecular array FICs of this invention provides a lithium-storing medium that has a high charge capacity (i.e., >600 mA h/g) which is stable during charging and possesses excellent cylability and that results in an improved safe rechargeable battery.

The anode is characterized by high current, high capacity, low resistance, highly reversible and is nano-engineered from carbon with molecular perfection. The anode is constructed as a membrane of metallic fullerene nanotubes arrayed as a bed-of-nails, the lithium atoms being stored in the spaces either between the adjacent tubes or down the hollow pore within each tube. Chemical derivatization of the open ends of the tubes will then be optimized to produce the best possible interface with the electrolyte. The derivative is preferably an organic moiety which provides a stable interface where the redox reaction can occur. In general, the organic moiety should be similar in structure to the electrolyte. One preferred derivitizing agent is polyethylene oxide and, in particular, polyethylene oxide oligomers.

The electrochemistry of the nano-engineered nanotube membranes are used for electrode applications. Important aspects are to derivatize their ends and sides in such a way as to provide an optimal interface for a lithium-ion battery electrolyte. This will result in a battery electrode that is highly accessible to the lithium ions, therefore capable of delivering high power density, and equally important, overcomes the ubiquitous SEI (solid-electrolyte interface) problem that significantly reduces electrode capacity and reversibility.

$Li^+$ is the ion choice for rechargeable batteries. Bested only by the proton as a lightweight counter-ion, Li profits from the availability of a wide class of solid and liquid electrolytes as a large choice of cathode materials, primarily metal oxides with 3D networks of intercalation sites in which the $Li^+$ resides in the discharged state. The first rechargeable Li batteries used metallic Li as an anode, but several drawbacks existed:

loss of Li due to dendrite growth during recharging;
safety problems associated with the reactivity of Li metal in the presence of organic solvents; and
the potential for anode-cathode shorts through the separator due to the aforementioned Li dendrites.

A solution to the safety problems was found by replacing Li metal by a Li-carbon intercalation anode, giving birth to the "rocking chair" battery in which the Li is never reduced to $Li^0$ and $Li^+$ shuttles between intercalation sites in the carbon anode and metal cathode as the battery is charged and discharged respectively. Graphite was used in the first generation Li-ion batteries, largely because the solid state chemistry of Li-graphite was well understood. Happily, the potential of $Li^+$ in graphite is within a few tens of MV of the potential of $Li^0$, so the use of graphite in place of Li metal imposes a small weight and volume penalty but no significant penalty in cell voltage.

But the use of graphite brought its own problems to the technology:

the best electrolytes (e.g., $LiClO_4$ dissolved in propylene carbonate) which have good $Li^+$ conductivity at ambient T also co-intercalate by solvating the $Li^+$, leaving to exfoliation of the graphite, dimensional instabilities and premature failure, and the diffusivity of $Li^+$ in graphite is rather low at ambient T, controlled by the large barrier for jump diffusion (commensurate lattice) between adjacent hexagonal interstitial sites in the graphite lattice.

The first problem was overcome by the development of new electrolytes which did not co-intercalate, e.g., $LiPF_6$ in a mixture of dimethyl carbonate and ethylene carbonate, which however had a detrimental effect on the electrolyte contribution to ion transport kinetics. The second prolem required the use of finely divided graphite (powder, chopped fibers, foams) which in turn increased the surface area substantially, leading inexorably to yet a new set of problems, namely capacity fade due to the formation of surface film (SEI: "solid-electrolyte interphase") during the first anode intercalation half-cycle. This in turn required assembling the battery with extra Li-containing cathode material to provide for the Li consumed by SEI formation, thus reducing the capacity. Not much is known about the SEI, but it is widely agreed that the carbonates (from electrolyte decomposition) are an important constituent. A widely accepted criterion in industry is that capacity loss due to SEI formation should not exceed 10% of the available Li.

Subsequent research explored the use of other forms of (nano-crystalline) carbon: carbon black, pyrolyzed coal and petroleum pitches and polymers, pyrolyzed natural products (sugars, nutshells, etc.), "alloys" of carbon with other elements (boron, silicon, oxygen, hydrogen), and entirely new systems such as tin oxides. Some of these exhibit much lager Li capacities than graphite, but the microscopic origins of this "excess capacity" are largely unknown. In general the cycling behavior of these materials is much worse than graphite, and the hydrogen-containing materials also exhibit large hysteresis in cell potential vs. Li concentration between charge and discharge half-cycles, a very undesirable property for a battery. Again, the origin of the hysteresis is largely unknown. The main advantage of these materials is that their inherently finely-divided nature augurs well for fast kinetics, an absolute prerequisite if LIB's are to have an impact in high current applications (e.g., electric vehicle).

The anode of the present invention is entirely nano-fabricated with molecular precision. It has a large capacity per unit volume to store lithium at an electrochemical potential near that of lithium metal, and is protected from the dendrite growth problems and safety concerns that plague pure metal anodes. It has extremely fast kinetics for charging and discharging, but maintains its architectural and chemical integrity in at all states of charge and discharge. In addition, there is a means for custom designing the interface between this anode and the electrolyte such that the $Li^0 \leftrightarrow Li^{+1}$ redox chemistry is highly reversible and very low in effective resistance.

Figure 14:
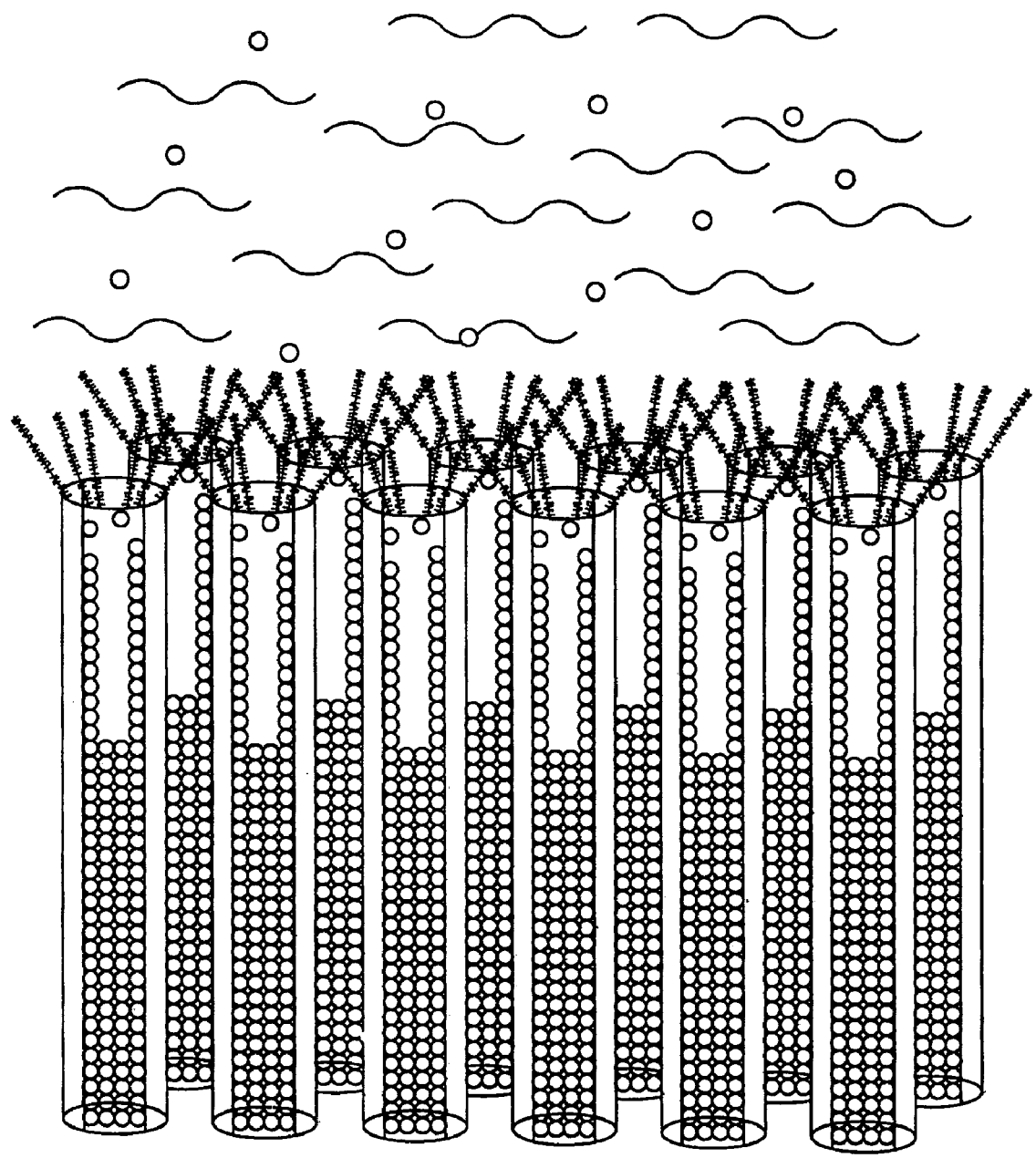
FIG. 14 is an anode for a lithium ion battery according to the present invention.

A design for such an anode is one which consists of an array of fullerene nanotubes, attached to a metallic support electrode, such as gold-coated copper, and arranged in a hexagonal lattice much like a bed of nails. As shown in FIG. 14, this structure has the virtue that the storage area for the reduced state of the lithium, $Li^0$, is down deep channels either between the nanotubes or down the hollow core of the tubes themselves. Accordingly, the redox chemistry of the lithium is confined primarily to the exposed ends of the nanotubes, and here derivatization of the nanotube ends provides great opportunities to insure that this redox chemistry is as reversible as possible.

5. Three-Dimensional Self-Assembling SWNT Structures

The self-assembling structures contemplated by this invention are three-dimensional structures of derivatized SWNT molecules that spontaneously form when the component molecules are brought together. In one embodiment the SAM, or two-dimensional monolayer, described above may be the starting template for preparing a three dimensional self-assembling structures. Where the end caps of the component SWNT molecules have mono-functional derivatives the three-dimensional structure will tend to assemble in linear head-to-tail fashion. By employing multi-functional derivatives or multiple derivatives at separate locations it is possible to create both symmetrical and non symmetrical structures that are truly three-dimensional.

Carbon nanotubes in material obtained according to the foregoing methods may be modified by ionically or covalently bonding functionally-specific agents (FSAs) to the nanotube. The FSAs may be attached at any point or set of points on the fullerene molecule. The FSA enables self-assembly of groups of nanotubes into geometric structures. The groups may contain tubes of differing lengths and use different FSAs. Self-assembly can also occur as a result of van der waals attractions between derivitized or underivitized or a combination of derivitized and underivitized fullerene molecules. The bond selectivity of FSAs allow selected nanotubes of a particular size or kind to assemble together and inhibit the assembling of unselected nanotubes that may also be present. Thus, in one embodiment, the choice of FSA may be according to tube length. Further, these FSAs can allow the assembling of two or more carbon nanotubes in a specific orientation with respect to each other.

By using FSAs on the carbon nanotubes and/or derivitized carbon nanotubes to control the orientation and sizes of nanotubes which are assembled together, a specific three-dimensional structure can be built up from the nanotube units. The control provided by the FSAs over the three-dimensional geometry of the self assembled nanotube structure can allow the synthesis of unique three-dimensional nanotube materials having useful mechanical, electrical, chemical and optical properties. The properties are selectively determined by the FSA and the interaction of and among FSAs.

Properties of the self-assembled structure can also be affected by chemical or physical alteration of the structure after assembly or by mechanical, chemical, electrical, optical, and/or biological treatment of the self-assembled fullerene structure. For example, other molecules can be ionically or covalently attached to the fullerene structure or FSAs could be removed after assembly or the structure could be rearranged by, for example, biological or optical treatment. Such alterations and/or modifications could alter or enable electrical, mechanical, electromagnetic or chemical function of the structure, or the structure's communication or interaction with other devices and structures.

Examples of useful electric properties of such a self-assembled geometric structure include: operation as an electrical circuit, a specific conductivity tensor, a specific response to electromagnetic radiation, a diode junction, a 3-terminal memory device that provides controllable flow of current, a capacitor forming a memory element, a capacitor, an inductor, a pass element, or a switch.

The geometric structure may also have electromagnetic properties that include converting electromagnetic energy to electrical current, an antenna, an array of antennae, an array that produces coherent interference of electromagnetic waves to disperse those of different wavelength, an array that selectively modifies the propagation of electromagnetic waves, or an element that interacts with optical fiber. The electromagnetic property can be selectively determined by the FSA and the interaction of and among FSAs. For example, the lengths, location, and orientation of the molecules can be determined by FSAs so that an electromagnetic field in the vicinity of the molecules induces electrical currents with some known phase relationship within two or more molecules. The spatial, angular and frequency distribution of the electromagnetic field determines the response of the currents within the molecules. The currents induced within the molecules bear a phase relationship determined by the geometry of the array. In addition, application of the FSAs could be used to facilitate interaction between individual tubes or groups of tubes and other entities, which interaction provides any form of communication of stress, strain, electrical signals, electrical currents, or electromagnetic interaction. This interaction provides an "interface" between the self-assembled nanostructure and other known useful devices.

Choice of FSAs can also enable self-assembly of compositions whose geometry imparts useful chemical or electrochemical properties including operation as a catalyst for chemical or electrochemical reactions, sorption of specific chemicals, or resistance to attack by specific chemicals, energy storage or resistance to corrosion.

Examples of biological properties of FSA self-assembled geometric compositions include operation as a catalyst for biochemical reactions; sorption or reaction site specific biological chemicals, agents or structures; service as a pharmaceutical or therapeutic substance; interaction with living tissue or lack of interaction with living tissue; or as an agent for enabling any form of growth of biological systems as an agent for interaction with electrical, chemical, physical or optical functions of any known biological systems.

FSA assembled geometric structures can also have useful mechanical properties which include but are not limited to a high elastic to modulus weight ratio or a specific elastic stress tensor. Optical properties of geometric structures can include a specific optical absorption spectrum, a specific optical transmission spectrum, a specific optical reflection characteristic, or a capability for modifying the polarization of light.

Self-assembled structures, or fullerene molecules, alone or in cooperation with one another (the collective set of alternatives will be referred to as "molecule/structure") can be used to create devices with useful properties. For example, the molecule/structure can be attached by physical, chemical, electrostatic, or magnetic means to another structure causing a communication of information by physical, chemical, electrical, optical or biological means between the molecule/structure and other structure to which the molecule/structure is attached or between entities in the vicinity of the molecule/structure. Examples include, but are not limited to, physical communication via magnetic interaction, chemical communication via action of electrolytes or transmission of chemical agents through a solution, electrical communication via transfer of electronic charge, optical communication via interaction with and passage of any form with biological agents between the molecule/structure and another entity with which those agents interact.

6. SWNT Antenna

Fullerene nanotubes can be used to replace the more traditional conductive elements of an antenna. For example, an (n,n) tube in conjunction with other materials can be used to form a Schottky barrier which would act as a light harvesting antenna. In one embodiment, a (10,10) tube can be connected via sulfur linkages to gold at one end of the tube and lithium at the other end of the tube forming a natural Schottky barrier. Current is generated through photo conductivity. As the (10,10) tube acts like an antenna, it pumps electrons into one electrode, but back flow of electrons is prevented by the intrinsic rectifying diode nature of the nanotube/metal contact.

In forming an antenna, the length of the nanotube can be varied to achieve any desired resultant electrical length. The length of the molecule is chosen so that the current flowing within the molecule interacts with an electromagnetic field within the vicinity of the molecule, transferring energy from that electromagnetic field to electrical current in the molecule to energy in the electromagnetic field. This electrical length can be chosen to maximize the current induced in the antenna circuit for any desired frequency range. Or, the electrical length of an antenna element can be chosen to maximize the voltage in the antenna circuit for a desired frequency range. Additionally, a compromise between maximum current and maximum voltage can be designed.

A Fullerene nanotube antenna can also serve as the load for a circuit. The current to the antenna can be varied to produce desired electric and magnetic fields. The length of the nanotube can be varied to provide desired propagation characteristics. Also, the diameter of the antenna elements can be varied by combining strands of nanotubes.

Further, these individual nanotube antenna elements can be combined to form an antenna array. The lengths, location, and orientation of the molecules are chosen so that electrical currents within two or more of the molecules act coherently with some known phase relationship, producing or altering an electromagnetic field in the vicinity of the molecules. This coherent interaction of the currents within the molecules acts to define, alter, control, or select the spatial, angular and frequency distributions of the electromagnetic field intensity produced by the action of these currents flowing in the molecules. In another embodiment, the currents induced within the molecules bear a phase relationship determined by the geometry of the array, and these currents themselves produce a secondary electromagnetic field, which is radiated from the array, having a spatial, angular and frequency distribution that is determined by the geometry of the array and its elements. One method of forming antenna arrays is the self-assembly monolayer techniques discussed above.

7. Fullerene Molecular Electronics

Fullerene molecules can be used to replace traditional electrically conducting elements. Thus fullerene molecules or self-assembled fullerene groups can be the basis of electrical circuits in which the molecule transfers electrical charge between functional elements of the circuit which alter or control the flow of that charge or objects in which the flow of electrical current within the object performs some useful function such as the redistribution of the electric field around the object or the electric contact in a switch or a response of the object to electromagnetic waves.

As an example, nanotubes can also be self-assembled to form a bridge circuit to provide full wave rectification. This device can include four nanotubes, each forming an edge of a square, and four buckyballs, one buckyball would be located at each corner of the square. The buckyballs and nanotubes can be derivitized to include functionally specific agents. The functionally specific agents form linkages connecting the buckyballs to the nanotubes and imparting the required geometry of the bridge.

A fullerene diode can be constructed through the self-assembly techniques described above. The diode can be composed of two bucky tubes and a bucky capsule. The bucky capsule can also be derivitized to form a zwiterrion. For example, the bucky capsule can include two positive groups, such as the triethyl amine cation and two negative groups, such as $CO_2$- anion. In one embodiment, each end of the bucky capsule is connected to a (10,10) bucky tube by a disulfide bridge. Thus, sulfur serves as the functionally-specific agent.

8. Probes and Manipulators

The SWNT molecules of the present invention also enable the fabrication of probes and manipulators on a nanoscale. Probe tips for AFM and STM equipment and AFM cantilevers are examples of such devices. Derivatized probes can serve as sensors or sensor arrays that effect selective binding to substrates. Devices such as these can be employed for rapid molecular-level screening assays for pharmaceuticals and other bioactive materials. Further, conducting SWNT molecules of the present invention may also be employed as an electrochemical probe.

Similarity probe-like assemblies of SWNT molecules can be used with or without derivatives as tools to effect material handling and fabrication of nanoscale devices, e.g., nano-forcepts. In addition, these molecular tools can be used to fabricate MEMS (Micro Electro Mechanical Systems) and also can be employed as connecting elements or circuit elements in NANO-MEMS.

9. Composite Materials Containing Carbon Nanotubes

Composite materials, i.e., materials that are composed of two or more discrete constituents, are known. Typically, composites include a matrix, which serves to enclose the composite and give it its bulk form, and a structural constituent, which determines the internal structure of the component. The matrix deforms and distributes an applied stress to the structural constituent.

Although composites are generally extremely strong, their strength is generally anisotropic, being much less in the direction perpendicular to the plane of the composite material than any parallel direction. Because of this characteristic, composites that are formed in layers or in laminate strips are prone to delamination. Delamination may occur when at least one layer of the composite separates from the others, resulting in a void in the bulk of the composite material. This void is exceedingly difficult to detect, and with repeated applications of stress to the composite element, the composite element will fail catastrophically, without warning.

Carbon nanotubes may serve as structural constituents in composite materials. As discussed above, composite materials are generally composed of two or more discrete constituents, usually including a matrix, which gives the composite its bulk form, and at least one structural constituent, which determines the internal structure of the composite. Matrix materials useful in the present invention can include any of the known matrix materials presently employed (see e.g., Mel M. Schwartz, *Composite Materials Handbook* (2d ed. 1992)). Among those known matrix materials are resins (polymers), both thermosetting and thermoplastic, metals, ceramics, and cermets.

Thermosetting resins useful as matrix materials include phthalic/maelic type polyesters, vinyl esters, epoxies, phenolics, cyanates, bismaleimides, and nadic end-capped polyimides (e.g., PMR-15). Thermoplastic resins include polysulfones, polyamides, polycarbonates, polyphenylene oxides, polysulfides, polyether ether ketones, polyether sulfones, polyamide-imides, polyetherimides, polyimides, polyarylates, and liquid crystalline polyester. In a preferred embodiment, epoxies are used as the matrix material.

Metals useful as matrix materials include alloys of aluminum such as aluminum 6061, 2024, and 713 aluminum braze. Ceramics useful as matrix materials include glass ceramics, such as lithium aluminosilicate, oxides such as alumina and mullite, nitrides such as silicon nitride, and carbides such as silicon carbide. Cermets useful as matrix materials include carbide-base cermets (tungsten carbide, chromium carbide, and titanium carbide), refractory cements (tungsten-thoria and barium-carbonate-nickel), chromium-alumina, nickel-magnesia, and iron-zirconium carbide.

The carbon nanotube structural constituent according to the present invention can take any of the forms described herein and known in the art. Preferably, a fullerene nanotube, i.e., a carbon nanotube with molecular perfection, is used. Fullerene nanotubes are made of a single, continuous sheet of hexagonal graphene joined perfectly to form a tube with a hemifullerene cap at either end. It may be either a true single-walled fullerene tube itself with hemispherical caps attached, or it may refer to one derived from such a closed tube by cutting, etching off the ends, etc. Alternatively, it is a multi-walled fullerene nanotube constructed of some number of single-walled fullerene nanotubes arranged one inside another. Arc-grown multi-walled nanotubes (MWNT), though approaching the fullerene ideal, are still not perfect. They have significant structural defects of lesions at least every 100 nm or so or more in their multiple walls. The single-walled carbon nanotubes made by the laser/oven method, however, appear to be molecularly perfect. They are fullerene nanotubes, and fibers made from them are true fullerene fibers.

The single-wall fullerene nanotubes may be metallic (formed in the armchair or (n,n) configuration) or any other helicity configuration. The nanotubes may be used in the form of short individual tubular molecules cut to any appropriate length. Cut nanotubes have the heretofore unachievable advantage of providing strengthening and reinforcement on a molecular scale. As they approach the micron scale in length, however, they become very flexible while still retaining the rigid tubular properties on a molecular scale.

Aggregates of individual tubes referred to herein as ropes having up to about $10^3$ carbon nanotubes may also be employed. Ropes of carbon nanotubes produced as described above have the advantage of an entangled, loopy physical configuration on a micron scale that results in a Velcro-like interaction with each other and matrix material while still retaining the rigid tubular bundle structure on a molecular level.

Macroscopic carbon nanotube fibers (having at least $10^6$ individual tubes), in either the continuous or random fiber forms described above, can also be employed to form the composite of the present invention. Ropes and fibers may be cut into desired lengths as described herein or used as tangled, loopy felts or the like.

The present invention also contemplates composites in which carbon nanotubes are present in two or more of the foregoing forms, e.g., mixed in the same matrix area or having different nanotube forms in different areas of the matrix. Selection of the carbon nanotube form will depend on the nature of the composite and its desired final properties. The carbon nanotubes are preferably cleaned and purified as described herein before use.

The nanotubes, ropes, or fibers used in the composites may also be derivatized as described above. End cap derivatization of carbon nanotubes can facilitate the bonding of the carbon nanotubes to each other or to the matrix material. While pure carbon nanotubes generally contain side walls that are entirely uniform (consisting of an array of the hexagonal carbon lattice similar to that of graphite), it is possible to introduce defects or create bonding sites in the sidewalls to facilitate bonding adhesion to the matrix material. One example would be to incorporate an impurity such as Boron atoms in the side wall. The wall defect or bonding site thus created may facilitate interaction of the nanotube with the matrix material through physical or chemical forces. It is additionally possible that such defect or bonding site may facilitate chemical reactions between the tube itself and the matrix material in a way that affects the properties of the composite material formed. As described above, the carbon nanotube material may also have a part of its lattice replaced with boron nitride.

Other fibrous structural constituents, both organic and inorganic, may also be used in conjunction with the carbon nanotube materials of this invention. Examples of organic constituents that may be used include cellulose. Examples of inorganic constituents include carbon, glass (D, E, and S-type), graphite, silicon oxide, carbon steel, aluminum oxide, beryllium, beryllium oxide, boron, boron carbide, boron nitride, chromium, copper, iron, nickel, silicon carbide, silicon nitride, FP alumina yarn manufactured by DuPont, Nextel alumina-boria-silica and zirconia-silica manufactured by 3M, Saffil HT zircona and alumina manufacture by ICI, quartz, molybdenum, René 41, stainless steel, titanium boride, tungsten, and zirconium oxide.

Fabrication of the composite of the present invention can employ any of the well-known techniques for combining the matrix material with the structural constituent. Carbon nanotubes, as individual tubular molecules or as ropes, can be dispersed in a liquid carrier, e.g., water or organic solvents, to facilitate incorporation into a matrix material. Macroscopic carbon nanotube fibers can be handled in the conventional manner employed in the current processes using carbon or graphite fibers.

The carbon nanotube structural constituent may be uniformly mixed with a matrix material precursor (polymer solution, pre-fired ceramic particles or the like) and then converted to a composite by conventional techniques. Structural layers or components (e.g., felts or bucky paper) can also be preformed from the carbon nanotube materials and impregnated with a prepolymer solution to form the composite.

The carbon nanotube structural constituents may also be used to improve the properties of conventional composite materials. One such example involves composites built-up of fibrous laminates impregnated and bonded with a polymer matrix material. Graphite fiber fabric layers bonded with an epoxy system is a well-known example of such a composite. By using carbon nanotube ropes or fibers that exhibit a 3-D loopy structure added only at the epoxy/graphite interfaces, resistance to delamination of the resulting laminar composite can be substantially increased. The carbon nanotube material can be dispersed in the epoxy system before impregnation (or premixed into one of the reactive components thereof). The carbon nanotube material can also be dispersed in a liquid carrier and sprayed or otherwise applied to the laminate as each graphite fabric layer is added.

A single-walled fullerene nanotube such as the (10,10) tube is unique as a component in a composite. From one perspective, it is simply a new molecular polymer, like polypropylene, Nylon, Kevlar, or DNA. It is about the diameter of the DNA double-helix, but vastly stiffer in bending and stronger in tension. Long chain polymers are characterized by their persistence length (the distance one has to travel along the length before there is a substantial change in the chain direction under conditions of normal Brownian motion). For polypropylene, this distance is only about 1 nm, and for the DNA double-helix it is about 50 nm. But for a single (10,10) fullerene nanotube, it is greater than 1000 nm. So on the persistence length scale of normal polymer molecules such as those that would constitute the continuous phase of a composite material, fullerene nanotubes are effectively rigid pipes.

Yet on the length scale of a micron or so, a single (10,10) fullerene nanotube is a highly flexible tube, easily becoming involved with other nanotubes in tangles with many loops. These tangles and loops provide two new opportunities in the internal mechanics of composites: (1) the continuous phase can interpenetrate through these loops, resulting in the nanotubes being intimately "tied" to this phase on a sub-micron length scale, and (2) with processing by flow and shear of the composite mixture before it sets up, the loops can become entangled in one another and pulled taught. As a result, composites made of fullerene tangles have extra toughness, strength, and resistance to delamination failure.

Fullerenes like $C_{60}$ or $C_{70}$ are known to be effectively sponges for free radicals. Similarly, fullerene nanotubes such as the (10,10) tube will chemisorb free radicals like methyl, phenyl, methoxy, phenoxy, hydroxy, etc., to their sides. As with the smaller fullerenes, these chemisorbed species do not substantially weaken the cage network (dissociation at high temperatures simply desorbes the surface species, maintaining the fullerene structure intact). Accordingly, in a composite containing fullerene nanotubes, one can achieve a covalent coupling to the continuous polymer phase simply by attaching pendant groups on the polymer which produces a free radical upon heating or photolysis with ultraviolet light. The azo-linkage, as found in azo-bis-isobutylnitrile, for example, is quite effective as a photo-activated free radical source.

The unique properties of the carbon fiber produced by the present invention also permit new types of composite reinforcement. It is possible, for example, to produce a composite fiber/polymer with anisotropic properties. This can, for example, be accomplished by dispersing a number of metallic carbon nanotube fibers (e.g., from (n,n) SWNTs) in a prepolymer solution (e.g., a poly methymethacrylate) and using an external electric field to align the fibers, followed by polymerization. Electrically conductive components can also be formed using the metallic forms of carbon nanotubes.

Applications of these carbon nanotubes containing composites include, but are not limited to, all those currently available for graphite fibers and high strength fibers such as Kevlar, including: structural support and body panels and for vehicles, including automobiles, trucks, and trains; tires; aircraft components, including airframes, stabilizers, wing skins, rudders, flaps, helicopter rotor blades, rudders, elevators, ailerons, spoilers, access doors, engine pods, and fuselage sections; spacecraft, including rockets, space ships, and satellites; rocket nozzles; marine applications, including hull structures for boats, hovercrafts, hydrofoils, sonar domes, antennas, floats, buoys, masts, spars, deckhouses, fairings, and tanks; sporting goods, including golf carts, golf club shafts, surf boards, hang-glider frames, javelins, hockey sticks, sailplanes, sailboards, ski poles, playground equipment, fishing rods, snow and water skis, bows, arrows, racquets, pole-vaulting poles, skateboards, bats, helmets, bicycle frames, canoes, catamarans, oars, paddles, and other items; mass-produced modular homes; mobile homes; windmills; audio speakers; furniture, including chairs, lamps, tables, and other modern furniture designs; soundboards for string instruments; lightweight armored products for personnel, vehicle, and equipment protection; appliances, including refrigerators, vacuum cleaners, and air conditioners; tools, including hammer handles, ladders, and the like; biocompatible implants; artificial bones; prostheses; electrical circuit boards; and pipes of all kinds.

EXAMPLES

In order to facilitate a more complete understanding of the invention, a number of Examples are provided below. However, the scope of the invention is not limited to specific embodiments disclosed in these Examples, which are for purposes of illustration only.

Example 1

Oven Laser-vaporization

The oven laser-vaporization apparatus described in FIG. 1 and also described by Haufler et al., "Carbon Arc Generation of $C_{60}$," *Mat. Res. Soc. Symp. Proc.*, Vol. 206, p. 627 (1991) and by U.S. Pat. No. 5,300,203 was utilized. An Nd:YAG laser was used to produce a scanning laser beam controlled by a motor-driven total reflector that was focused to a 6 to 7 mm diameter spot onto a metal-graphite composite target mounted in a quartz tube. The laser beam scans across the target's surface under computer control to maintain a smooth, uniform face on the target. The laser was set to deliver a 0.532 micron wavelength pulsed beam at 300 milliJoules per pulse. The pulse rate was 10 hertz and the pulse duration was 10 nanoseconds (ns).

The target was supported by graphite poles in a 1-inch quartz tube initially evacuated to 10 m Torr. and then filled with 500 Torr. argon flowing at 50 standard cubic centimeters per second (sccm). Given the diameter of the quartz tube, this volumetric flow results in a linear flow velocity through the quartz tube in the range of 0.5 to 10 cm/sec. The quartz tube was mounted in a high-temperature furnace with a maximum temperature setting of 1200° C. The high-temperature furnace used was a Lindberg furnace 12 inches long and was maintained at approximately 1000° to 1200° C. for the several experiments in Example 1. The laser vaporized material from the target and that vaporized material was swept by the flowing argon gas from the area of the target where it was vaporized and subsequently deposited onto a water-cooled collector, made from copper, that was positioned downstream just outside the furnace.

Targets were uniformly mixed composite rods made by the following three-step procedure: (i) the paste produced from mixing high-purity metals or metal oxides at the ratios given below with graphite powder supplied by Carbone of America and carbon cement supplied by Dylon at room temperature was placed in a 0.5 inch diameter cylindrical mold, (ii) the mold containing the paste was placed in a hydraulic press equipped with heating plates, supplied by Carvey, and baked at 130° C. for 4 to 5 hours under constant pressure, and (iii) the baked rod (formed from the cylindrical mold) was then cured at 810° C. for 8 hours under an atmosphere of flowing argon. For each test, fresh targets were heated at 1200° C. under flowing argon for varying lengths of time, typically 12 hours, and subsequent runs with the same targets proceeded after 2 additional hours heating at 1200° C.

The following metal concentrations were used in this example: cobalt (1.0 atom per cent), copper (0.6 atom per cent), niobium (0.6 atom per cent), nickel (0.6 atom per cent), platinum (0.2 atom per cent), a mixture of cobalt and nickel (0.6 atom per cent/0.6 atom per cent respectively), a mixture of cobalt and platinum (0.6 atom per cent/0.2 atom per cent respectively), a mixture of cobalt and copper (0.6 atom per cent/0.5 atom per cent respectively), and a mixture of nickel and platinum (0.6 atom per cent/0.2 atom per cent respectively). The remainder of the mixture was primarily graphite along with small amounts of carbon cement. Each target was vaporized with a laser beam and the soots collected from the water cooled collector were then collected separately and processed by sonicating the soot for 1 hour in a solution of methanol at room temperature and pressure (other useful solvents include acetone, 1,2-dicholoroethane, 1-bromo, 1,2-dichloroethane, and N,N-dimethylformamide). With one exception, the products collected produced a homogeneous suspension after 30 to 60 minutes of sonication in methanol. One sample vaporized from a mixture of cobalt, nickel and graphite was a rubbery deposit having a small portion that did not fully disperse even after 2 hours of sonication in methanol. The soots were then examined using a transmission electron microscope with a beam energy of 100 keV (Model JEOL 2010).

Rods (0.5 inch diameter) having the Group VIII transition metal or mixture of two VIII transition metals described above were evaluated in the experimental apparatus to determine the yield and quality of single-wall carbon nanotubes produced. No multi-wall carbon nanotubes were observed in the reaction products. Yields always increased with increasing oven temperature up to the limit of the oven used (1200° C.). At 1200° C. oven temperature, of the single metals utilized in the example, nickel produced the greatest yield of single-wall carbon nanotubes followed by cobalt. Platinum yielded a small number of single-wall carbon nanotubes and no single-wall carbon nanotubes were observed when carbon was combined only with copper or only with niobium. With respect to the mixtures of two Group VIII transition metal catalysts with graphite, the cobalt/nickel mixture and the cobalt/platinum mixtures were both approximately equivalent and both were the best overall catalysts in terms of producing yields of single-wall carbon nanotubes. The yield of single-wall carbon nanotubes for both of these two metal mixtures were 10 to 100 times the yield observed when only one Group VIII transition metal was used. The mixture of nickel and platinum with graphite also had a higher yield of single-wall carbon nanotubes than a single metal alone. The cobalt/copper mixture with graphite produced a small quantity of single-wall carbon nanotubes.

The cobalt/nickel mixture with graphite and the cobalt/platinum mixture with graphite both produced deposits on the water cooled collector that resembled a sheet of rubbery material. The deposits were removed intact. The cobalt/platinum mixture produced single-wall carbon nanotubes in a yield estimated at 15 weight per cent of all of the carbon vaporized from the target. The cobalt/nickel mixture produced single-wall carbon nanotubes at yields of over 50 wt % of the amount of carbon vaporized.

Figure 15A:
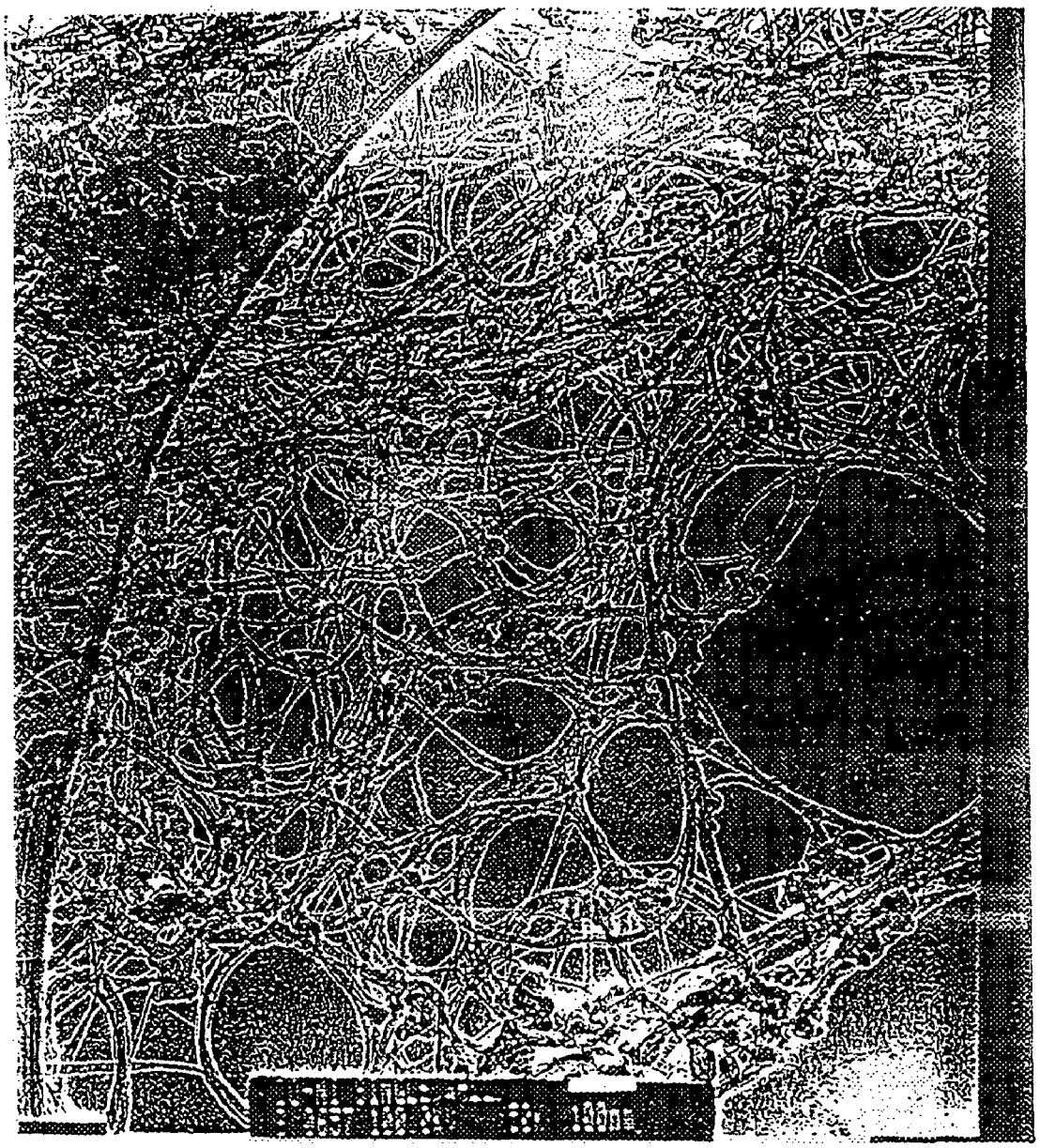
FIG. 15A is a medium-magnification transmission electron microscope image of single-wall nanotubes.
Figure 15B:
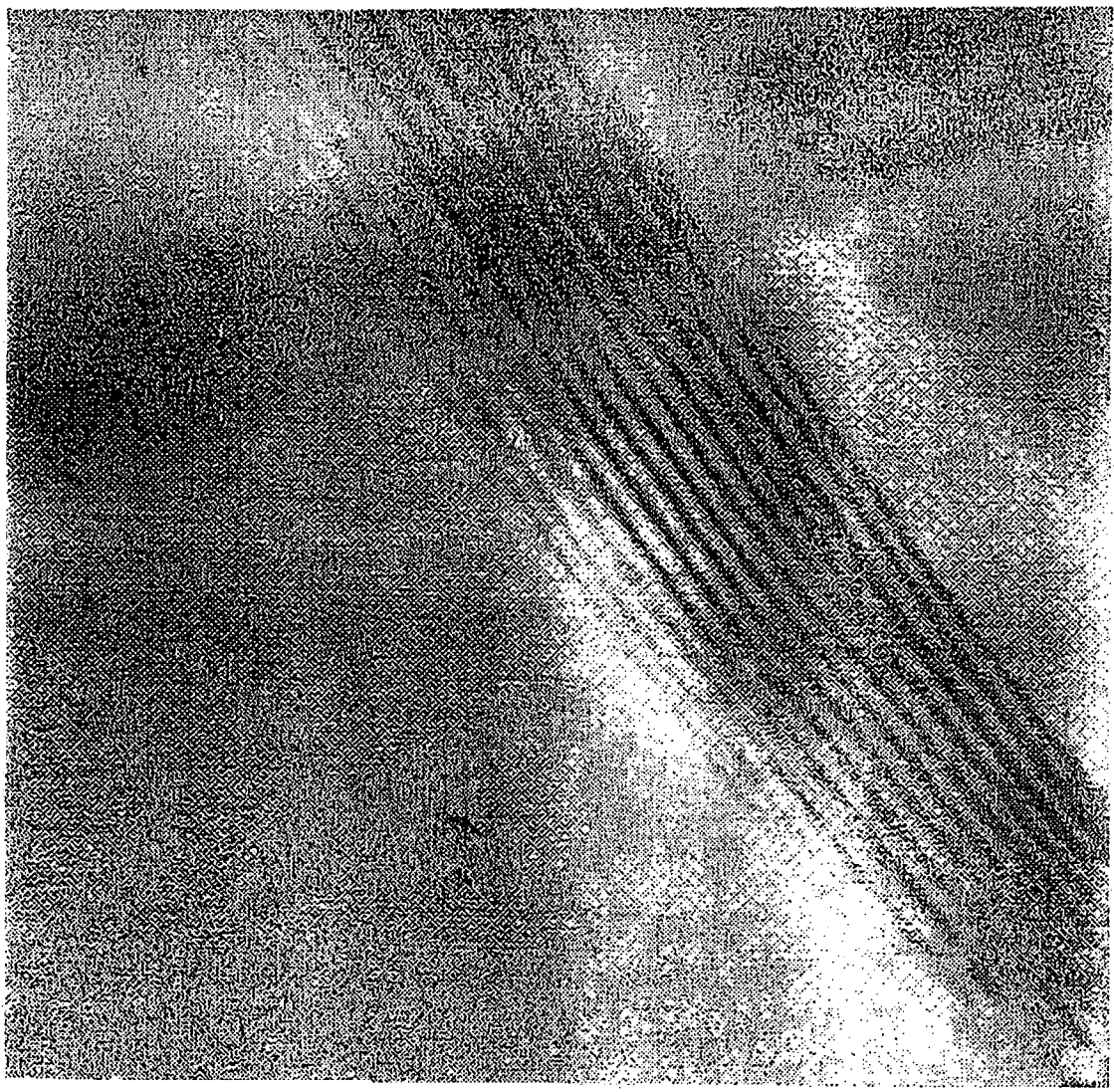
FIG. 15B is a high-magnification image of adjacent single-wall carbon nanotubes.

The images shown in FIGS. 15A through 15E are transmission electron micrographs of single-wall carbon nanotubes produced by vaporizing a target comprising graphite and a mixture of cobalt and nickel (0.6 atom per cent/0.6 atom per cent respectively) at an oven temperature of 1200° C. FIG. 15A shows a medium-magnification view (where the scale bar represents 100 mm) showing that almost everywhere, bundles of single-wall carbon nanotubes are tangled together with other single-wall carbon nanotubes. FIG. 15B is a high-magnification image of one bundle of multiple single-wall carbon nanotubes that are all roughly parallel to each other. The single-wall carbon nanotubes all have a diameter of about 1 nm, with similar spacing between adjacent single-wall carbon nanotubes. The single-wall carbon nanotubes adhere to one another by van der Waals forces.

Figure 15C:
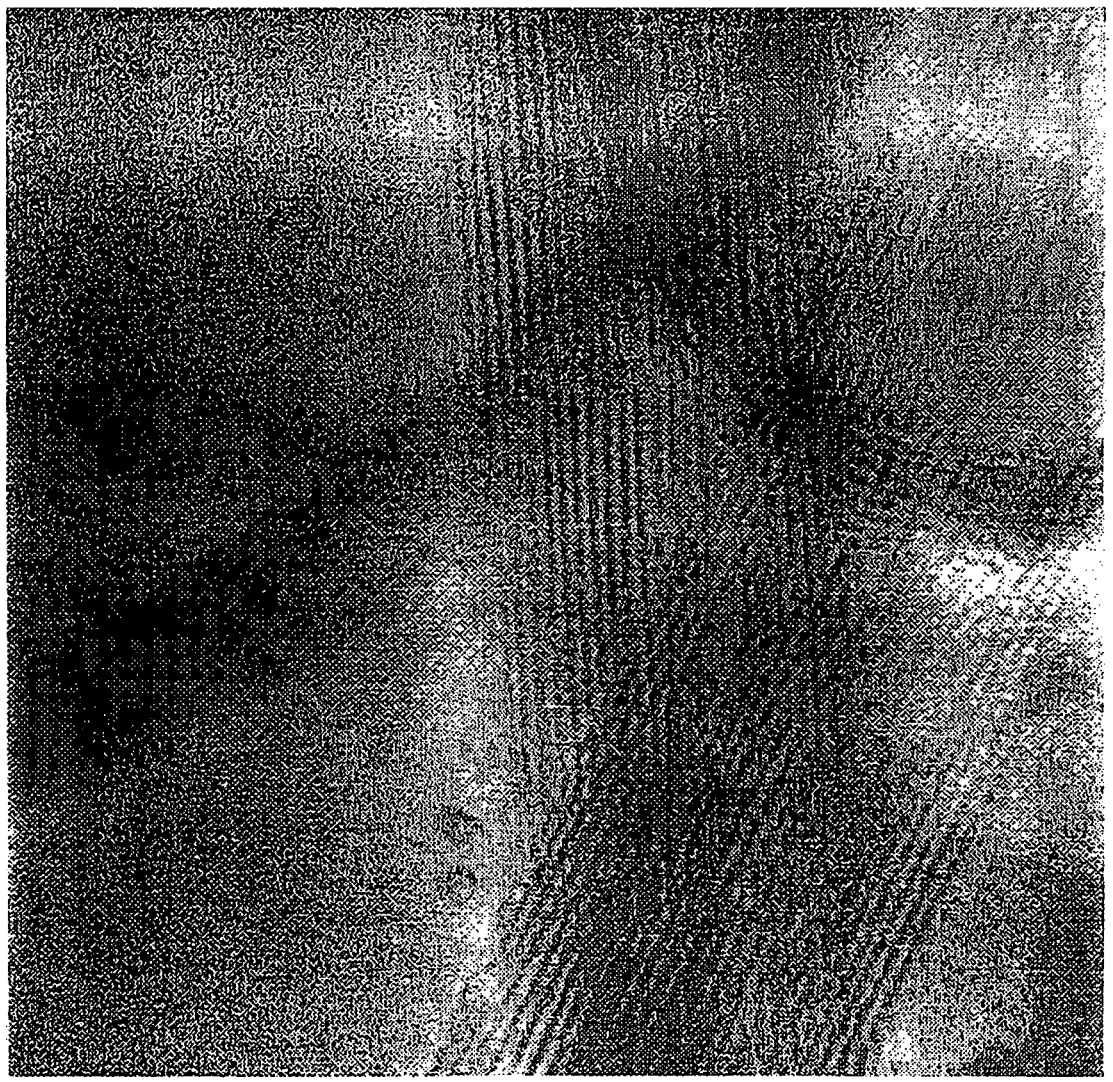
FIG. 15C is a high-magnification image of adjacent single-wall carbon nanotubes.
Figure 15D:
FIG. 15D is a high-magnification image of adjacent single-wall carbon nanotubes.
Figure 15E:
FIG. 15E is a high-magnification image of the cross-section of seven adjacent single-wall carbon nanotubes.

FIG. 15C shows several overlapping bundles of single-wall carbon nanotubes, again showing the generally parallel nature of each single-wall nanotube with other single-wall carbon nanotubes in the same bundle, and showing the overlapping and bending nature of the various bundles of single-wall carbon nanotubes. FIG. 15D shows several different bundles of single-wall carbon nanotubes, all of which are bent at various angles or arcs. One of the bends in the bundles is relatively sharp, illustrating the strength and flexibility of the bundle of single-wall carbon nanotubes. FIG. 15E shows a cross-sectional view of a bundle of 7 single-wall carbon nanotubes, each running roughly parallel to the others. All of the transmission electron micrographs in FIGS. 15A through 10E clearly illustrate the lack of amorphous carbon overcoating that is typically seen in carbon nanotubes and single-wall carbon nanotubes grown in arc-discharge methods. The images in FIGS. 15A through 15E also reveal that the vast majority of the deposit comprises single-wall carbon nanotubes. The yield of single-wall carbon nanotubes is estimated to be about 50% of the carbon vaporized. The remaining 50% consists primarily of fullerenes, multi-layer fullerenes (fullerene onions) and/or amorphous carbon.

FIGS. 15A through 15E show transmission electron microscope images of the products of the cobalt/nickel catalyzed carbon nanotube material that was deposited on the water cooled collector in the laser vaporization apparatus depicted in FIG. 1. Single-wall carbon nanotubes were typically found grouped in bundles in which many tubes ran together roughly parallel in van der Waals contact over most of their length. The grouping resembled an "highway" structure in which the bundles of single-wall carbon nanotubes randomly criss-crossed each other. The images shown in FIGS. 15A through 15E make it likely that a very high density of single-wall carbon nanotubes existed in the gas phase in order to produce so many tubes aligned as shown when landing on the cold water cooled collector. There also appeared to be very little other carbon available to coat the single-wall carbon nanotubes prior to their landing on the water cooled collector in the alignment shown. Evidence that single-wall carbon nanotubes grow in the gas phase, as opposed to for example on the walls of the quartz tube, was provided in earlier work on multi-walled carbon nanotubes using the same method. See Guo et al., "Self-Assembly of Tubular Fullerenes," *J. Phys. Chem.*, Vol. 99, p. 10694 (1995) and Saito et al., "Extrusion of Single-Wall Carbon Nanotubes via Formation of Small Particles Condensed Near An Evaporation Source," *Chem. Phys. Lett.*, Vol. 236, p. 419 (1995). The high yield of single-wall carbon nanotubes in these experiments is especially remarkable because the soluble fullerene yield was found to be about 10 weight per cent, and much of the remaining carbon in the soot product consisted of giant fullerenes and multi-layer fullerenes.

Example 2

Laser-vaporization to Produce Longer Single-wall Carbon Nanotubes

In this example, a laser vaporization apparatus similar to that described by FIG. 1 was used to produce longer single-wall carbon nanotubes. The laser vaporization apparatus was modified to include a tungsten wire strung across the diameter of a quartz tube mounted in an oven. The tungsten wire was placed downstream of the target so that the wire was 1 to 3 cm downstream from the downstream side of the target (13 to 15 cm downstream from the surface of the target being vaporized). Argon at 500 Torr. was passed through the quartz tube at a flow rate equivalent to a linear velocity in the quartz tube of about 1 cm/sec. The oven was maintained at 1200° C. and Group VIII transition metals were combined at 1 to 3 atom % with carbon to make the target.

The pulsed laser was operated as in Example 1 for 10 to 20 minutes. Eventually, a tear drop shaped deposit formed on the tungsten wire, with portions growing to lengths of 3 to 5 mm. The deposit resembled eyelashes growing on the tungsten wire. Examination of the deposit revealed bundles of millions of single-wall carbon nanotubes.

Example 3

Two Laser Vaporization

Graphite rods were prepared as described in Example 1 using graphite, graphite cement and 1.2 atom % of a mixture of 50 atom % cobalt powder and 50 atom % nickel powder. The graphite rods were pressed into shape and then formed into targets as described in Example 1. The graphite rods were then installed as targets in an apparatus as diagramed in FIG. 2, except tungsten wire 32 was not used. A quartz tube holding the graphite rod targets was placed in an oven heated to 1200° C. Argon gas which had been catalytically purified to remove water vapor and oxygen was passed through the quartz tube at a pressure of about 500 Torr and a flow rate of about 50 sccm although flow rates in the range of about 1 to 500 sccm (standard cubic centimeters per minute), preferably 10 to 100 sccm are also usefull for a 1 inch diameter flow tube. The first laser was set to deliver a 0.532 micron wavelength pulsed beam at 250 mJ per pulse. The pulse rate was 10 Hz and the pulse duration was 5 to 10 ns. A second laser pulse struck the target 50 ns after the end of the first pulse. The second laser was set to deliver a 1.064 micron wavelength pulsed beam at 300 mJ per pulse. The pulse rate was 10 Hz and the pulse duration was 5 to 10 ns. The first laser was focused to a 5 mm diameter spot on the target and the second laser was focused to a 7 mm diameter gaussian spot having the same center point on the target as the spot from the first laser. About 1/10th of a second after the second laser hit the target, the first and second lasers fired again and this process was repeated until the vaporization step was stopped.

About 30 mg/hr of the raw product from the laser vaporization of the target surface was collected downstream. The raw product comprised a mat of randomly oriented single-wall carbon nanotubes. The raw product mat is made up almost entirely of carbon fibers 10–20 nm in diameter and 10 to 1000 microns long.

About 2 mg of the raw product mat was sonicated in 5 ml methanol for about 0.5 hour at room temperature. Transmission Electron Microscope (TEM) analysis of the sonicated product proved that the product was comprised mostly of ropes of single-wall carbon nanotubes, i.e., bundles of 10 to 1000 single-wall carbon nanotubes aligned with each other (except for occasional branching) having a reasonably constant rope diameter over the entire length of the rope. The ropes were more than 100 microns long and consisting of uniform diameter single-wall carbon nanotubes. About 70 to 90 wt % of the product is in the form of ropes. The individual single-wall carbon nanotubes in the ropes all terminate within 100 nm of each other at the end of the rope. More than 99% of the single-wall carbon nanotubes appear to be continuous and free from carbon lattice defects over all of the length of each rope.

Example 4

Procedure for Purifying Single-wall Nanotube Material to >99%

Material formed by the laser production method described in U.S. Ser. No. 08/687,665 was purified as follows to obtain a preparation enriched in nanotubes. 200 mg of the raw laser-produced single-wall nanotube material (estimated yield of 70%) was refluxed in 2.6 M aqueous nitric acid solution for 24 hours. At 1 atm pressure the reflux temperature was about 1200° C. The solution was then filtered through a 5 micron pore size TEFLON filter (Millipore Type LS), and the recovered single-wall nanotubes were refluxed for a second 24 hr period in fresh nitric acid solution (2.6 M). The solution was filtered again to recover the single-wall nanotube material, and the material recovered from the filtration step was sonicated in saturated NaOH in ethanol at room temperature for 12 hours. The ethanolic solution was filtered to recover the single-wall nanotube material, and the material recovered was neutralized by refluxing in 6M aqueous HCl for 12 hours. The nanotube material was recovered from the aqueous acid by filtration, and baked at 850° C. in 1 atm $H_2$ gas (flowing at 1–10 sccm through a 1" quartz tube) for 2 hours. The yield was 70 mg of recovered purified material. Detailed TEM, SEM and Raman spectral examination showed it to be >99% pure, with the dominant impurity being a few carbon-encapsulated Ni/Co particles.

Example 5

Procedure for Cutting SWNT into Tubular Carbon Molecules

Bucky paper (~100 microns thick) obtained by the filtration and baking of purified SWNT material as described in Example 1 was exposed to a 2 GEV beam of $Au^{+33}$ ions in the Texas A&M Superconducting Cyclotron Facility for 100 minutes. The irradiated paper had 10–100 nm bullet holes on average every 100 nm along the nanotube lengths. The irradiated paper was refluxed in 2.6 M nitric acid for 24 hours to etch away the amorphous carbon produced by the fast ion irradiation, filtered, sonicated in ethanol/potassium hydroxide for 12 hours, refiltered, and then baked in vacuum at 1100° C. to seal off the ends of the cut nanotubes.

The material was then dispersed in toluene while sonicating. The resulting tubular molecules which averaged about 50–60 nm in length were examined via SEM and TEM.

Example 6

Assembly of a SWNT Array

About $10^6$ (10,10) nanotube molecules with lengths 50–60 nm are prepared as described above, are derivatized to have an —SH group at one end and allowed to form a SAM molecular array of SWNT molecules on a substrate coated with gold in which the tubular molecules are aligned with their long axis parallel and the ends of the tubes forming a plane perpendicular to the aligned axes.

Example 7

Growth of a Continuous Macroscopic Carbon Fiber

Figure 6:
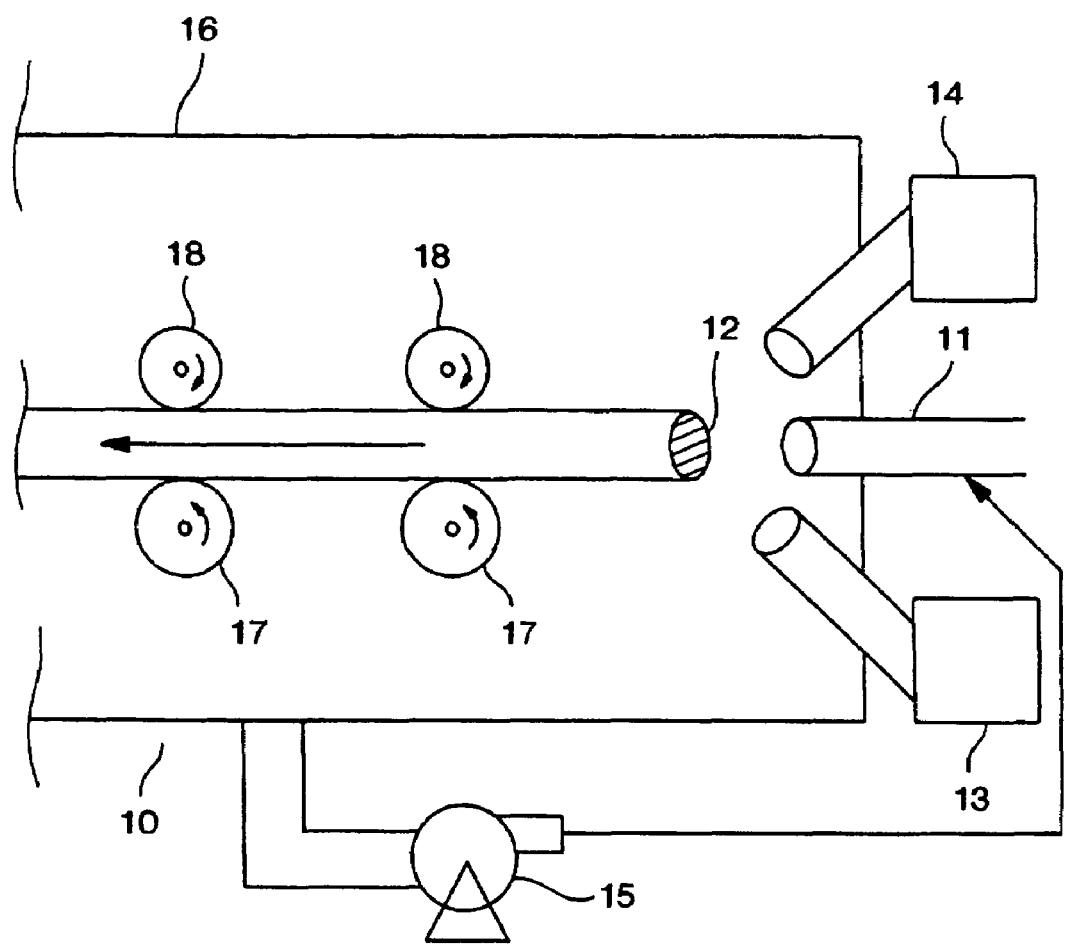
FIG. 6 is a schematic representation of the growth chamber of the fiber apparatus according to the present invention.
Figure 7:
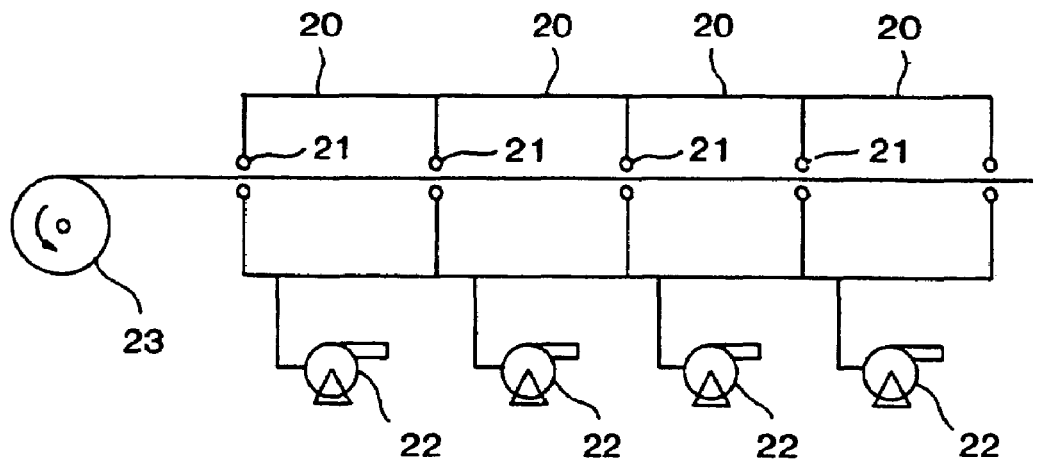
FIG. 7 is a schematic representation of the pressure equalization and collection zone of the fiber apparatus according to the present invention.

The array according to Example 6 can be used to grow a continuous macroscopic carbon fiber in the apparatus shown in FIGS. 6 and 7. The ends of the nanotubes (which form the plane perpendicular to the axes of the tubes) of the array are first opened. For the 2D assembly of nanotubes on the gold covered surface, the assembly can be made to be the positive electrode for electrolytic etching in 0.1 M KOH solution, which will open the tips of the nanotubes.

Ni/Co metal clusters are then vacuum deposited onto the open ends of the assembled nanotubes in the SAM. Preferably, metal clusters 1 nm in diameter are arranged so that one such Ni/Co nanoparticle sits on the top opening of every nanotube in the nanotube array.

The Ni/Co capped nanotubes in the array are heated in a vacuum up to 600° C., pyrolyzing off all but the carbon nanotubes and the Ni/Co particles. Once the pyrolysis is complete, a flow of ethylene gas is started, and the tubes elongate in the direction of the aligned axes to form a carbon fiber of macroscopic diameter. If a significant portion of the Ni/Co catalyst particles deactivate, it may be necessary to electrochemically etch the tips open and clean the assembly again, and repeat steps of applying the Ni/Co catalyst particles and reinitiating growth of the array. A continuous fiber of about 1 micro in diameter is continuously recovered at room temperature on the take-up roll.

Example 8

Production of Fullerene Pipes and Capsules

Single-walled fullerene nanotubes were prepared by an apparatus comprising a 2.5 cm by 5 cm cylindrical carbon target (with a 2 atom % of a 1:1 mixture of cobalt and nickel) that was rotated about its principle axis in flowing argon (500 torr, 2 cm sec$^{-1}$) in a 10 cm diameter fused silica tube heated to 1100° C. Two pulsed laser beams (ND:YAG 1064 nm, 1 J pulse$^{-1}$, 30 pulse s$^{-1}$, 40 ns delay) were focused to a 7 mm diameter spot on the side of the rotating target drum and scanned under computer control along the length of the drum, alternating from the left to the right side of the drum so as to change the angle of incidence on the target surface to avoid deep pitting. This method has the advantage of producing 20 grams of material in two days of continuous operation.

The raw material formed by the apparatus was purified by refluxing in nitric acid followed by filtration and washing in pH=10 water with Triton X-100 surfactant. The net yield of purified fullerene fibers from this method depends on the initial quality of the raw material, which is typically in the range of 10–20% by weight. The molecular perfection of the side walls, a characteristic of fullerene fibers, allows these fibers to survive the refluxing.

The fullerene ropes were highly tangled with one other. The fullerene ropes frequently occurred in fullerene toroids ("crop circles"), which suggests that the ropes are endless. This is due to van der Walls adherence between the "live" ends of the ropes and the sides of other ropes during the high-yield growth process in the argon atmosphere of the laser/oven method. The growing rope ends were eliminated in collisions with another live rope end that was growing along the same guiding rope from the opposite direction. In one dimension, collisions are unavoidable.

Ends were created from the tangled, nearly endless ropes by many techniques, ranging from cutting the ropes with a pair of scissors to bombarding the ropes with relativistic gold ions. Here, the ropes were cut by sonicating them in the presence of an oxidizing acid, such as $H_2SO_4/HNO_3$. The cavitation produced local damage to the tubes on the surface of the ropes, which activated them for chemical attack by the oxidizing acid. As the acid attacked the tube, the tube was completely cut open and the tube slowly etched back, with its open end unable to re-close at the moderate temperature. Nanotubes underlying the now-cut surface tube on the rope were exposed, and subsequent cavitation-induced damage resulted in the cutting of the entire rope. The cut nanotubes were subjected to further oxidizing acid treatment in order to ensure that they are molecularly perfect and chemically clean.

The length distribution of the open-ended tubes is shortened systematically with exposure time to the acid. In a 3/1 concentrated sulfuric acid/nitric acid, at 70° C., the average cut nanotube was shortened at a rate of 130 nm hr$^{-1}$. In a 4/1 sulfuric acid/30% aqueous hydrogen peroxide ("piranha") mixture at 70° C. the shortening rate was approximately 200 nm hr$^{-1}$. This etching rate is sensitive to the chiral index of the nanotubes (n,m), with all "arm chair" tubes (n=m) having a distinct chemistry from the "zig-zag" tubes (m=0), and to a lesser extent with tubes of intermediate helical angle (n≠m).

The cut fullerene tubes material formed stable colloidal suspensions in water with the assistance of surfactants such as sodium dodecyl sulfate or a non-ionic surfactant such as Triton X-100. The suspensions were separated as a function of nanotube length.

AFM imaging of the cut nanotube pieces on graphite revealed that many nanotubes are individuals, but that a majority of the nanotubes were in van der Walls contact with each other. The nanotubes with lengths of greater than 100 nm may be closed by true hemifullerene end caps, which form sealed fullerene capsules when annealed in a vacuum at 1000–1200° C.

Example 9

Production and Purification of Fullerene Pipes and Capsules

Figure 16A:
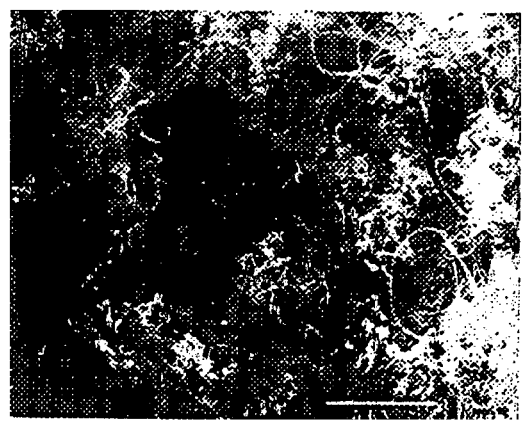
FIG. 16A is a scanning electron microscope (SEM) image of raw single-walled fullerene nanotube felt.
Figure 16B:
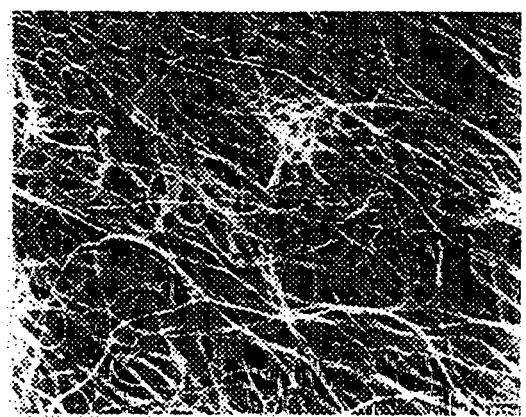
FIG. 16B is a SEM image of the single-walled fullerene nanotube felt material of FIG. 16A after purification.
Figure 16C:
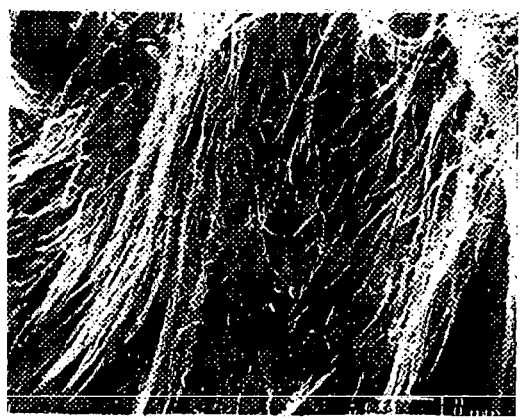
FIG. 16C is a SEM image of the single-walled fullerene nanotube felt after tearing, resulting in substantial alignment of the single-walled nanotube rope fibers.

Referring to FIGS. 16A–C, a SEM image of raw SWNT felt material is shown in FIG. 16A, while the same material after purification is shown in FIGS. 16B–C. The abnormally low quality initial starting material emphasizes the effectiveness of the following purification process. The raw sample (8.5 gm) was refluxed in 1.2 l of 2.6 M nitric acid for 45 hours. Upon cooling, the solution was transferred to PTFE centrifuge tubes and spun at 2400 g for 2 hours. The supernatant acid was decanted off, replaced by de-ionized water, vigorously shaken to re-suspend the solids, followed by a second centrifuge/decant cycle. The solids were resuspended in 1.8 l water with 20 ml Triton X-100 surfactant and adjusted to a pH of 10 with sodium hydroxide. The suspension was then transferred to the reservoir of a tangential flow filtration system (MiniKros Lab System, Spectrum, Laguna Hills, Calif.). The filter cartridge used (M22M 600 0.1N, Spectrum) had mixed cellulose ester hollow fibers of 0.6 mm diameter, 200 nm pores and a total surface area of 5600 cm$^2$. The buffer solution consisted of 44 l of 0.2 vol % Triton X-100 in water of which the first 34 l were made basic (pH 10) with sodium hydroxide, and the final 10 l at pH 7. The cartridge inlet pressure was maintained at 6 psi. A control valve was added to the exit so that the outflow rate was restricted to 70 ml min$^{-1}$. The result was a stable suspension of purified SWNT for which the SEM image in FIG. 16B is typical. Filtration of this suspension produces a paper of tangled SWNT which resembles carbon paper in appearance and feel. As is evident in the SEM image of FIG. 16C, the torn edge of this "bucky paper" shows that the tearing process produces a substantial alignment of SWNT rope fibers. The overall yield of purified SWNT from this abnormally poor starting material was 9% by weight.

Figure 17B:
FIG. 17 is an atomic force microscopy image of cut fullerene nanotubes deposited on highly oriented pyrolytic graphite.
Figure 17A:
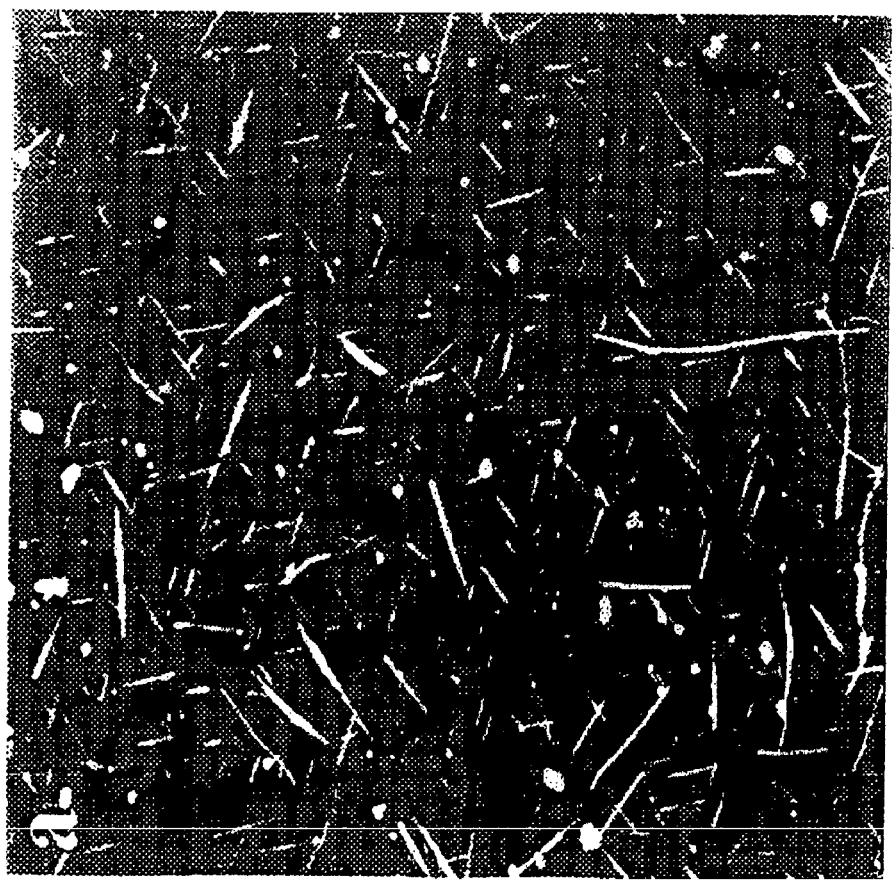
Figure 18A:
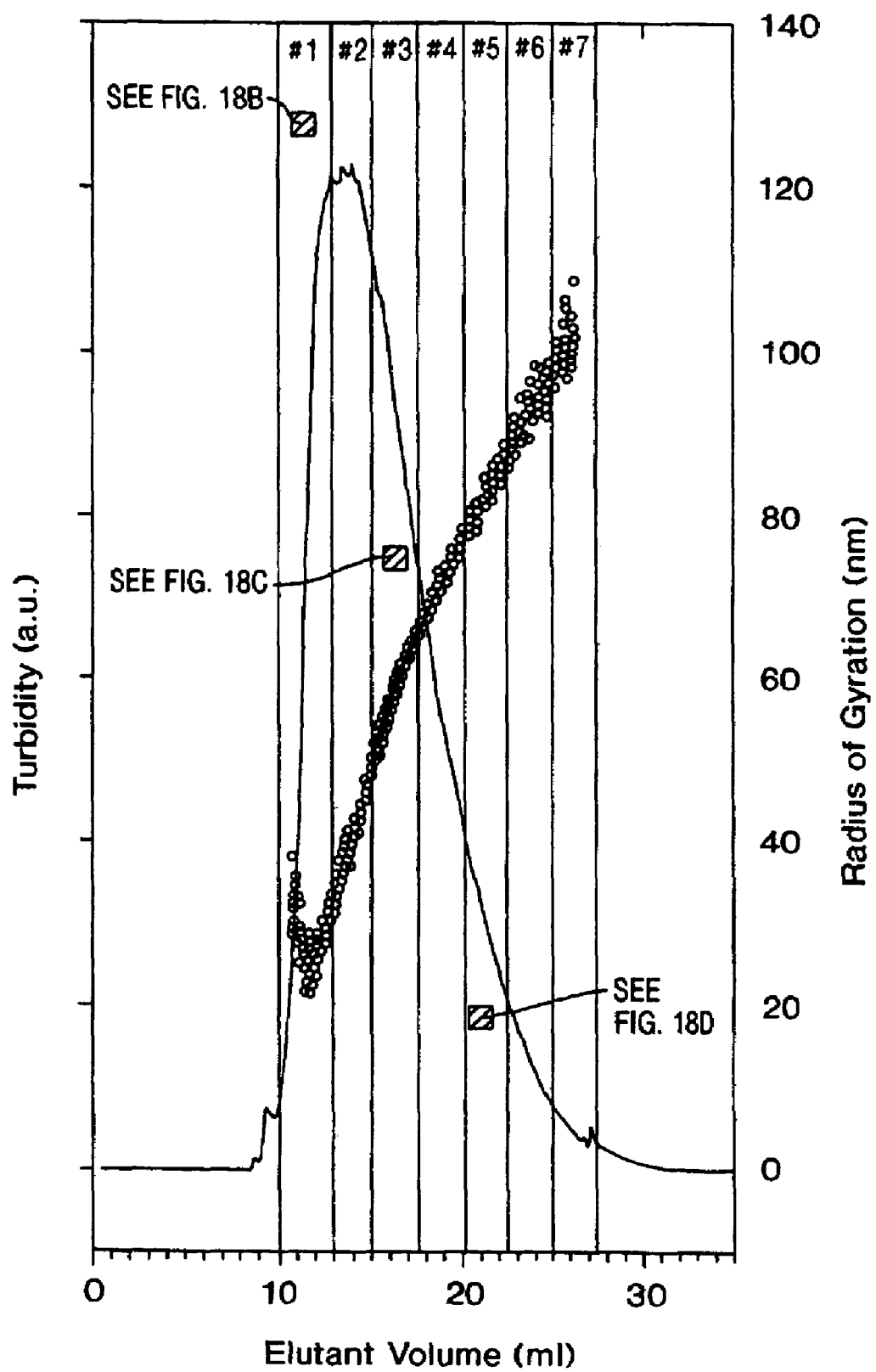
FIG. 18A is a graph of field flow fractionation (FFF) of a cut nanotubes suspension.
Figure 18B:
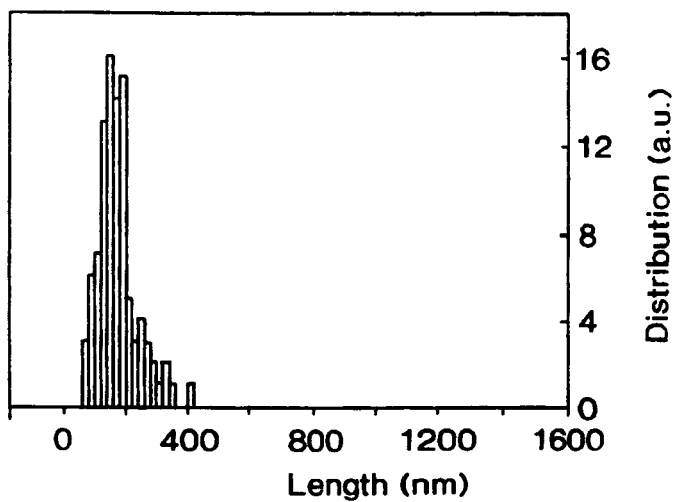
FIGS. 18B, 18C, and 18D represent the distribution of fullerene nanotube lengths measured by AFM on three collections.
Figure 18C:
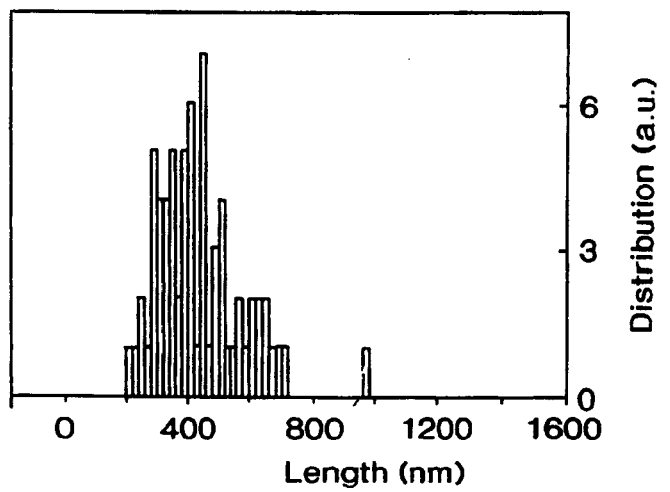
Figure 18D:
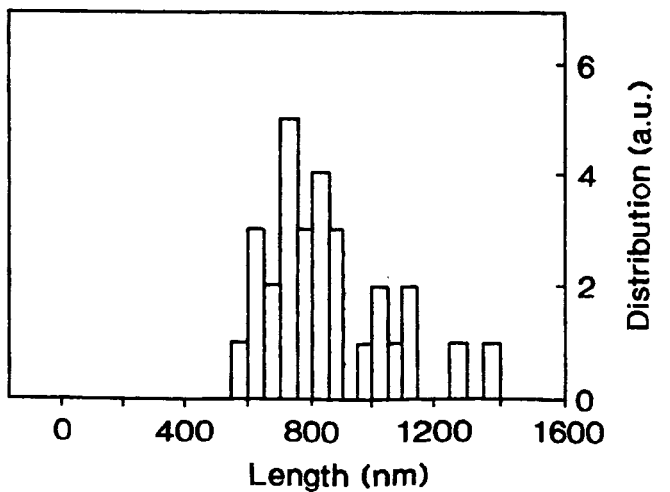

FIG. 17 shows a taping mode AFM image of cut fullerene nanotubes (pipes) electrodeposited from a stable colloidal suspension onto highly oriented pyrolytic graphite (HOPG). The tubes had a tendency to align 120° to one another. They are in registry with the underlying graphite lattice. AFM measurements of the heights of these cut tubes revealed that roughly half were single tubes 1–2 nm in diameter, whereas the rest are aggregates of several tubes in van der Waals contact. These cut tubes were prepared in a two step process: cutting and polishing. In a typical example, 10 mg of the purified SWNT "bucky paper" (shown in FIG. 16B) was suspended in 40 ml of a 3:1 mixture of concentrated H$_2$SO$_4$/HNO$_3$ in a 100 ml test tube and sonicated in a water bath (Cole Palmer model B3-R, 55 kHz) for 24 hours at 35–40° C. The resultant suspension was then diluted with 200 ml water and the larger cut SWNT tubes were caught on a 100 nm pore size filter membrane (type VCTP, Millipore Corp., Bedford, Mass.), and washed with 10 mM NaOH solution. These cut tubes were then further polished (chemically cleaned) by suspension in a 4:1 mixture of concentrated H$_2$SO$_4$:30% aqueous H$_2$O$_2$ and stirring at 70° C. for 30 minutes. After filtering and washing again on a 100 nm filter, the cut nanotubes were suspended at a density of 0.1 mg/ml in water with the aid of 0.5 wt % Triton X-100 surfactant. The electrodeposition was performed by placing 20 µl of the nanotube suspension on the surface of a freshly cleaved HOPG substrate (Advanced Ceramics, Cleveland, Ohio), confining the droplet within a Vitron O-ring (4 mm o.d., 1.7 mm thick), capping the trapped suspension with a stainless steel electrode on top of the O-ring, and applying a steady voltage of 1.1V for 6 minutes. When suspended in water, the nanotubes are negatively charged and are therefore driven by the electric field onto the HOPG surface. After deposition the HOPG/nanotube surface was washed with methanol on a spin-coater in order to remove the water and the Triton X-100 surfactant.

FIG. 18 shows the Field Flow Fractionation (FFF) of cut fullerene nanotube "pipes" in aqueous suspension. A 20 µl sample of 0.07 mg/mg cut nanotube suspension in 0.5% aqueous Triton X-100 was injected into a cross-flow FFF instrument (Model F-1000-FO, FFFractionation, LLC, Salt Lake City, Utah) operating with 0.007% Triton X-100 in water mobile phase at 2 ml min$^{-1}$, and a cross-flow rat of 0.5 ml min$^{-1}$. The solid curve (left vertical axis) of FIG. 18A shows the light scattering turbidity (at 632.8 nm wavelength) of the eluting nanotubes as a function of total eluent volume since ejection. The open circles (right axis) plot the estimate radius of gyration of the nanotubes as measured by a 16 angle light scattering instrument (DAWN DSP, Wyatt Technology, Santa Barbara, Calif.). FIGS. 18B, 18C, and 18D show nanotube length distributions from FFF eluent fractions 1, 3, and 5, respectively, as measured from AFM images of the suspended fullerene nanotubes electrodeposited on HOPG as in FIG. 17.

Figure 19:
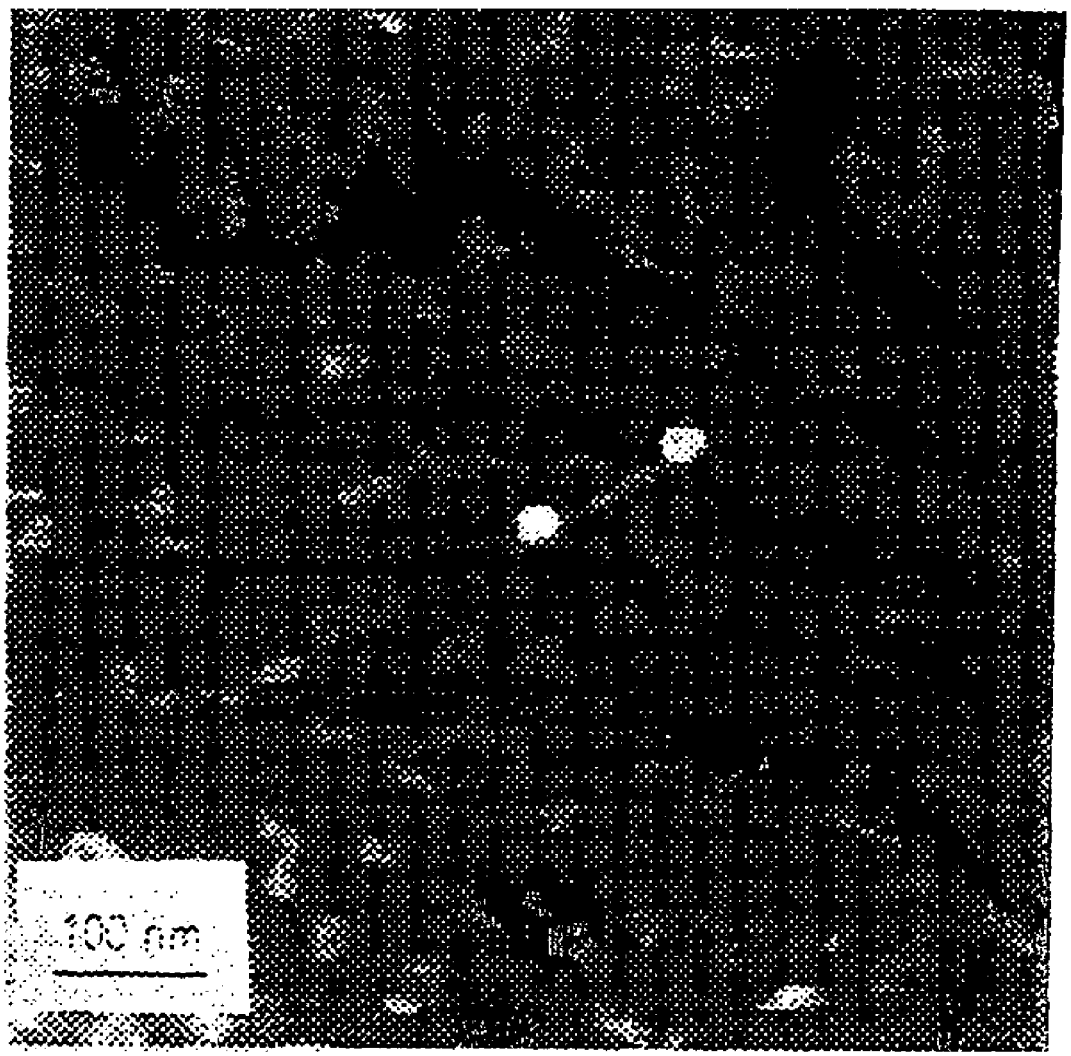
FIG. 19 shows an AFM image of a fullerene nanotube "pipe" tethered to two 10 nm gold spheres.

FIG. 19 shows an AFM image of a fullerene nanotube "pipe" tethered to two 10 nm gold spheres, one at either end. The tube was electrodeposited onto HOPG graphite from a suspension of a mixture of such tubes with colloidal gold particles (Sigma Chemical Co.) in water. The irregularly shaped features in the image are due to residual deposits of the Triton X-100 surfactant used to stabilize the suspension. The nanotube-to-gold tethers were constructed of alkyl thiol chains covalently attached to the open ends of the tubes. Presuming these open ends were terminated with many carboxylic acid groups as a result of the acid etching in previous processing, they were converted to the corresponding acid chloride by reacting them with SOCl$_2$. These derivitized tubes were then exposed to NH$_2$—(CH$_2$)$_{16}$—SH in toluene to form the desired tethers, with the thiol group providing a strong covalent bonding site for a gold particle. Most tubes derivitized this way have a single gold particle bound to at least one of their ends, as revealed by extensive AFM imaging.

Example 10

Composite Material Containing Carbon Nanotubes

One gram of purified single walled fullerene nanotubes is dispersed in 1 liter of dichloro-ethane, together with 10 grams of Epon epoxy. The hardener is added to the solvent removed by vacuum rotary evaporation. The resultant fullerene nanotube-epoxy composite is then cured at 100° C. for 24 hours.

Alternatively, a carbon fiber, fullerene nanotube composite can be prepared by drawing one or more continuous carbon fibers or woven carbon fiber tapes through a vat containing the above dichloroethane epoxy nanotube suspension, and then winding this impregnated tape around a desired form. After curing in an autoclave in a fashion known in the carbon fiber-epoxy composite industry (see, e.g., D. L. Chung, *Carbon Fiber Composites* (1994)), a composite of superior delamination resistance is produced. The fullerene nanotubes within the composite strengthen the epoxy between the carbon fiber layers. A superior composite is produced if one uses fullerene fibers for both the woven tape layers and the tangled nanotube strengtheners within the epoxy phase.

Modification and variations of the methods, apparatus, compositions and articles of manufacture described herein will be obvious to those skilled in the art from the foregoing detailed description. Such modifications and variations are intended to come with the scope of the appended claims.

We claim:

1. A method for forming an array of single-wall carbon nanotubes comprising:
   (a) providing a material comprising single-wall carbon nanotubes, wherein the material has a surface;
   (b) subjecting the surface to oxidizing conditions sufficient to cause the single-wall carbon nanotubes to break and protrude from the surface; and (c) applying an electric field to the surface to form an array comprising the single-wall carbon nanotubes on the surface.

2. The method of claim 1 wherein the electric field aligns the single-wall carbon nanotubes in an orientation generally perpendicular to the surface.

3. The method of claim 2 further comprising coalescing the single-wall carbon nanotubes.

4. The method of claim 2 wherein the oxidizing conditions comprise a chemical oxidation.

5. The method of claim 2 comprising heating the surface to a temperature up to about 500° C. in an atmosphere comprising a gas selected from the group consisting of oxygen, $CO_2$ and combinations thereof.

6. A method for forming a macroscopic molecular array of tubular carbon molecules comprising:

(a) providing a surface comprising purified single-wall carbon nanotube material;

(b) subjecting the surface to oxidizing conditions sufficient to cause short lengths of broken single-wall carbon nanotubes to protrude from the surface; and (c) applying an electric field to the surface to cause the single-wall carbon nanotubes to align in an orientation generally perpendicular to the surface and coalesce into an array.

7. The method of claim 6 wherein the oxidizing conditions comprise heating the surface up to about 500° C. in an atmosphere of oxygen and $CO_2$.

* * * * *